United States Patent
Yanagida et al.

(10) Patent No.: US 9,478,293 B2
(45) Date of Patent: Oct. 25, 2016

(54) MEMORY SYSTEM AND CONTROLLER

(71) Applicant: KABUSHIKI KAISHA TOSHIBA, Tokyo (JP)

(72) Inventors: Tetsufumi Yanagida, Yokohama Kanagawa (JP); Masanobu Shirakawa, Chigasaki Kanagawa (JP); Toshihiro Suzuki, Ota Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 14/631,771

(22) Filed: Feb. 25, 2015

(65) Prior Publication Data
US 2016/0078947 A1 Mar. 17, 2016

(30) Foreign Application Priority Data

Sep. 12, 2014 (JP) .................... 2014-186194

(51) Int. Cl.
*G11C 16/10* (2006.01)
*G11C 16/26* (2006.01)
*G06F 11/10* (2006.01)
*G11C 11/56* (2006.01)
(Continued)

(52) U.S. Cl.
CPC ........... *G11C 16/10* (2013.01); *G06F 11/1068* (2013.01); *G11C 11/5628* (2013.01); *G11C 11/5642* (2013.01); *G11C 16/0483* (2013.01); *G11C 16/08* (2013.01)

(58) Field of Classification Search
CPC .......... G11C 16/0483; G11C 2213/71; G11C 16/0466; G11C 16/10; G11C 16/26; G11C 2213/75; G11C 5/06; G11C 16/06; G11C 16/24; G11C 11/4097; G11C 11/56
See application file for complete search history.

(56) References Cited

U.S. PATENT DOCUMENTS

| 5,923,588 | A | 7/1999 | Iwahashi |
| 2010/0226195 | A1 | 9/2010 | Lue |
| 2010/0254193 | A1 | 10/2010 | Park et al. |

(Continued)

FOREIGN PATENT DOCUMENTS

| CN | 1190785A A | 8/1998 |
| JP | H11-3594 A | 1/1999 |

(Continued)

OTHER PUBLICATIONS

Lue et al., "A Novel Dual-Channel 3D Nand flash featuring both N-Channel and P-Channel NAND Characteristics for Bit-alterable Flash Memory and a New Opportunity in Sensing the Strored Charge in the WL Space," Miconix International Co., Ltd., Electron Devices Meeting (IEDM), 2013 IEEE International, Dec. 2013, pp. 3.7.1-3.7.4.

(Continued)

*Primary Examiner* — Hien Nguyen
(74) *Attorney, Agent, or Firm* — Patterson & Sheridan, LLP

(57) ABSTRACT

A memory system includes a semiconductor memory device and a controller. The semiconductor memory device performs a writing operation with either a first writing method or a second writing method. The controller selects one of the first writing method and the second writing method upon receipt of a write instruction and output a write command indicating the selected writing method to the semiconductor memory device. The controller selects the writing method in accordance with a storage location in the semiconductor memory device targeted by the write instruction.

19 Claims, 73 Drawing Sheets

(51) Int. Cl.
*G11C 16/04* (2006.01)
*G11C 16/08* (2006.01)

(56) References Cited

U.S. PATENT DOCUMENTS

| | | |
|---|---|---|
| 2010/0265773 A1 | 10/2010 | Lung et al. |
| 2010/0270529 A1 | 10/2010 | Lung |
| 2011/0084397 A1 | 4/2011 | Lung |
| 2011/0239096 A1 | 9/2011 | Nawata |
| 2011/0286283 A1 | 11/2011 | Lung et al. |
| 2012/0007167 A1 | 1/2012 | Hung et al. |
| 2012/0147675 A1 | 6/2012 | Lue et al. |
| 2012/0181599 A1 | 7/2012 | Lung |
| 2012/0181654 A1 | 7/2012 | Lue |
| 2012/0181684 A1 | 7/2012 | Lue et al. |
| 2012/0181699 A1 | 7/2012 | Chen et al. |
| 2012/0181701 A1 | 7/2012 | Chen et al. |
| 2012/0182801 A1 | 7/2012 | Lue |
| 2012/0182802 A1 | 7/2012 | Hung et al. |
| 2012/0182804 A1 | 7/2012 | Hung et al. |
| 2012/0182806 A1 | 7/2012 | Chen et al. |
| 2012/0182807 A1 | 7/2012 | Lue |
| 2012/0182808 A1 | 7/2012 | Lue et al. |
| 2012/0185753 A1 | 7/2012 | Chen et al. |
| 2012/0281471 A1 | 11/2012 | Hung et al. |
| 2012/0281478 A1* | 11/2012 | Lue .................. H01L 21/28273 365/185.18 |
| 2014/0021628 A1 | 1/2014 | Shih et al. |
| 2014/0035140 A1 | 2/2014 | Lue et al. |
| 2014/0042629 A1 | 2/2014 | Lai et al. |
| 2014/0054535 A1 | 2/2014 | Chen et al. |
| 2014/0054789 A1 | 2/2014 | Chiu et al. |
| 2014/0056072 A1 | 2/2014 | Hung |
| 2014/0347912 A1* | 11/2014 | Siau ...................... G11C 7/062 365/148 |

FOREIGN PATENT DOCUMENTS

| | | |
|---|---|---|
| JP | 2005-216455 A | 8/2005 |
| TW | 201123208 A | 7/2011 |
| WO | 2009089411 A1 | 7/2009 |

OTHER PUBLICATIONS

TW Office Action dated May 24, 2016 for Application No. 104106913.

English Translation of TW Office Action dated May 24, 2016 for Application No. 104106913.

* cited by examiner

FIG. 9

| BLK address | SU address | WL address | BLe or BLo | Type | Valid or Invalid | Cumulative number of data writing |
|---|---|---|---|---|---|---|
| 0 | 0 | 0 | BLe | Negative | Valid | 7 |
| | | | BLo | Positive | Invalid | 16 |
| | | 1 | BLe | Negative | Invalid | 27 |
| | | | BLo | Negative | Valid | 32 |
| | | 2 | BLe | Positive | Invalid | 3 |
| | | | BLo | Negative | Valid | 24 |
| | | 3 | BLe | Positive | Invalid | 19 |
| | | | BLo | Positive | Valid | 1 |
| | | 4 | BLe | ⋮ | ⋮ | ⋮ |
| | | | BLo | ⋮ | ⋮ | ⋮ |
| | | 5 | BLe | ⋮ | ⋮ | ⋮ |
| | | | BLo | ⋮ | ⋮ | ⋮ |
| | | 6 | BLe | ⋮ | ⋮ | ⋮ |
| | | | BLo | ⋮ | ⋮ | ⋮ |
| | | 7 | BLe | ⋮ | ⋮ | ⋮ |
| | | | BLo | ⋮ | ⋮ | ⋮ |
| | 1 | ⋮ | ⋮ | ⋮ | ⋮ | ⋮ |
| | ⋮ | ⋮ | ⋮ | ⋮ | ⋮ | ⋮ |
| 1 | ⋮ | ⋮ | ⋮ | ⋮ | ⋮ | ⋮ |
| ⋮ | ⋮ | ⋮ | ⋮ | ⋮ | ⋮ | ⋮ |

FIG. 32
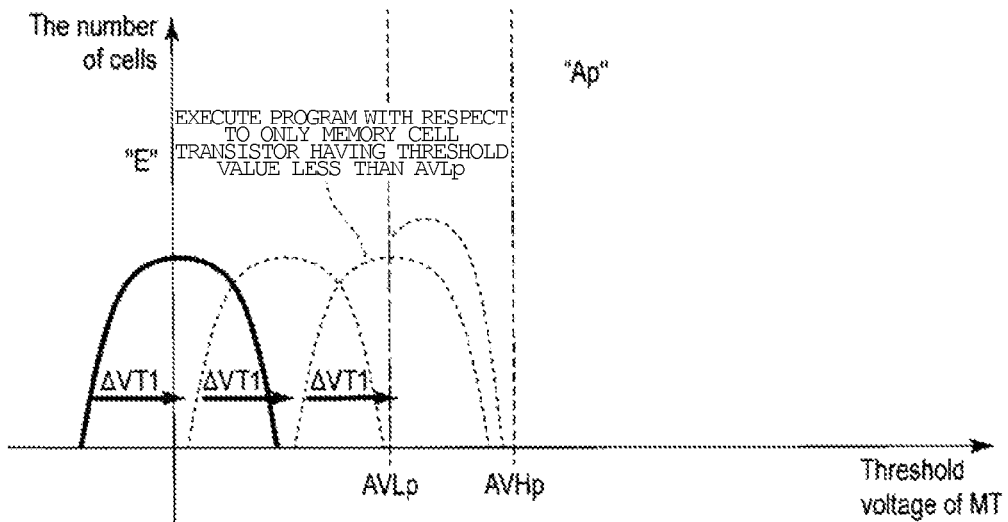
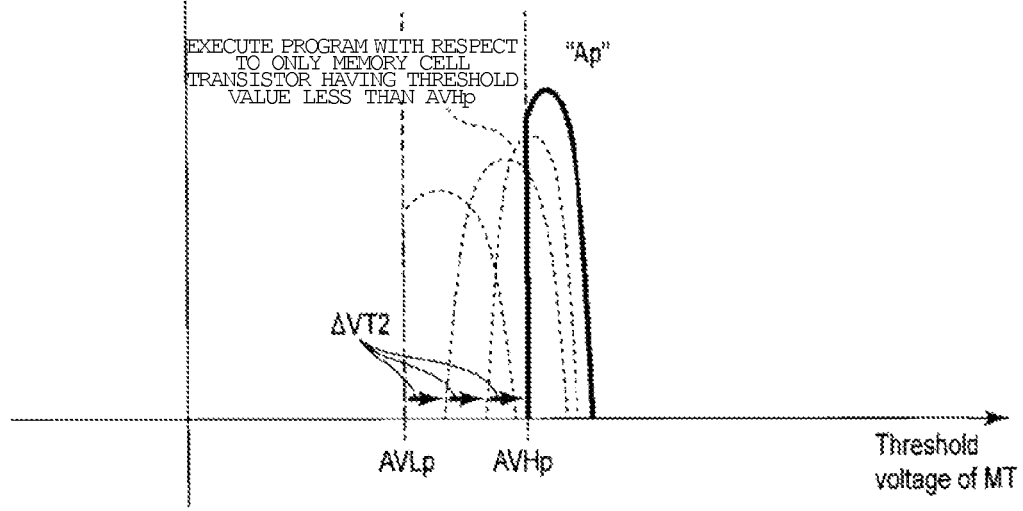

FIG. 50

| NUMBER OF TIMES OF RETRY | Negative type | | | Positive type | | |
|---|---|---|---|---|---|---|
| | An | Bn | Cn | Ap | Bp | Cp |
| 1 | Vs_An_1 | Vs_Bn_1 | Vs_Cn_1 | Vs_Ap_1 | Vs_Bp_1 | Vs_Cp_1 |
| 2 | Vs_An_2 | Vs_Bn_2 | Vs_Cn_2 | Vs_Ap_2 | Vs_Bp_2 | Vs_Cp_2 |
| 3 | Vs_An_3 | Vs_Bn_3 | Vs_Cn_3 | Vs_Ap_3 | Vs_Bp_3 | Vs_Cp_3 |
| 4 | Vs_An_4 | Vs_Bn_4 | Vs_Cn_4 | Vs_Ap_4 | Vs_Bp_4 | Vs_Cp_4 |
| ⋮ | ⋮ | ⋮ | ⋮ | ⋮ | ⋮ | ⋮ |
| L | Vs_An_L | Vs_Bn_L | Vs_Cn_L | Vs_Ap_L | Vs_Bp_L | Vs_Cp_L |

MEMORY SYSTEM AND CONTROLLER

CROSS-REFERENCE TO RELATED APPLICATION

This application is based upon and claims the benefit of priority from Japanese Patent Application No. 2014-186194, filed Sep. 12, 2014, the entire contents of which are incorporated herein by reference.

FIELD

Embodiments described herein relate generally to a memory system and a controller.

BACKGROUND

A NAND type flash memory in which memory cell transistors are three-dimensionally arranged is known.

DESCRIPTION OF THE DRAWINGS

FIG. 9 is a write situation table according to the first embodiment.

FIG. 32 is a graph illustrating a variation in a threshold value in a case where a programming operation using a first condition and a programming operation using a second condition are applied according to a third embodiment.

FIG. 50 is a conceptual diagram of a shift table according to a sixth embodiment.

DETAILED DESCRIPTION

Figure 1:
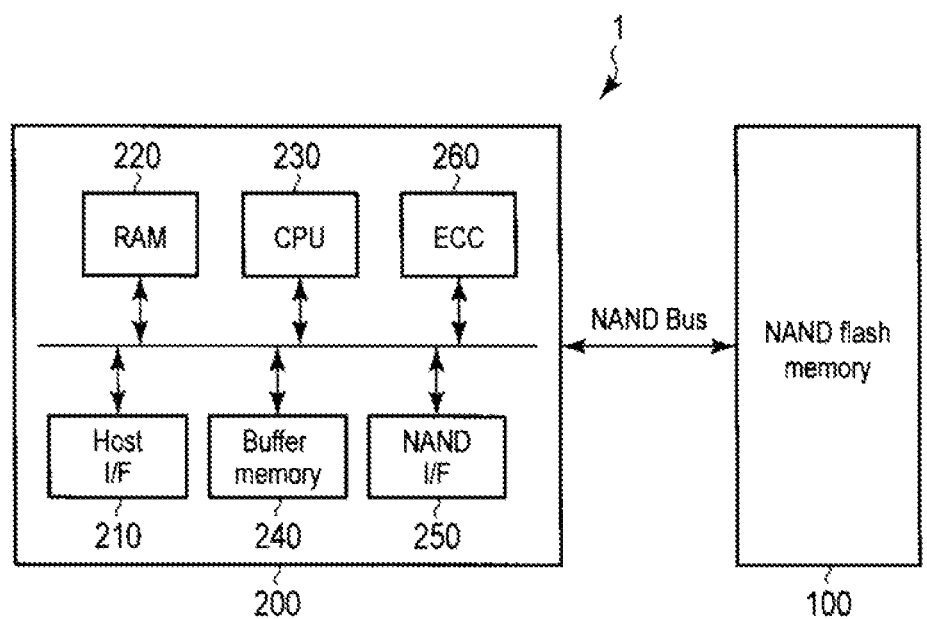
FIG. 1 is a block diagram of a memory system according to a first embodiment.

The present embodiment now will be described more fully hereinafter with reference to the accompanying drawings, in which various embodiments are shown. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to limit the scope of the invention. As used herein, the singular forms "a," "an" and "the" are intended to include the plurality of forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

The embodiments provide a memory system and a controller which are capable of improving a processing speed.

In general, according to one embodiment, a memory system includes: a semiconductor memory device, and a controller. The semiconductor memory device performs a writing operation with either a first writing method or a second writing method. The controller selects one of the first writing method and the second writing method upon receipt of a write instruction and output a write command indicating the selected writing method to the semiconductor memory device. The controller selects the writing method in accordance with a storage location in the semiconductor memory device targeted by the write instruction.

Hereinafter, the embodiments will be described with reference to the attached drawings. In the following description, a common reference numeral is given to common portions in the drawings.

1. First Embodiment

A memory system according a first embodiment will be described. Hereinafter, as a semiconductor memory device, a three-dimensional stacked type NAND type flash memory, in which memory cell transistor are stacked on a semiconductor substrate, will be described as an example.

1.1 With Respect to Configuration 1.1.1 With Respect to Configuration of Memory System First, a configuration of a memory system including a semiconductor memory device according to this embodiment will be described with reference to FIG. 1. FIG. 1 is a block diagram illustrating a memory system according to this embodiment.

As illustrated, the memory system 1 includes a NAND type flash memory 100 and a controller 200. The controller 200 and the NAND type flash memory 100 may form one semiconductor device, for example, by a combination thereof, and examples thereof include a memory card such as an SD™ card, a solid state drive (SSD), and the like.

The NAND type flash memory 100 includes a plurality of memory cell transistors, and stores data in a nonvolatile manner. Details of a configuration of the NAND type flash memory 100 will be described later.

In response to a command (an access) from an external host apparatus, the controller 200 issues a command for the NAND type flash memory 100 to perform reading, writing, erasing, and the like. In addition, the controller 200 manages a memory space of the NAND type flash memory 100.

The controller 200 includes a host interface circuit 210, a built-in memory (RAM) 220, a processor (CPU) 230, a buffer memory 240, a NAND interface circuit 250, and an ECC circuit 260.

The host interface circuit 210 is connected to a host apparatus through a controller bus, and takes charge of communication with the host apparatus. In addition, the host interface circuit 210 transmits a command and data which are received from the host apparatus to the CPU 230 and the buffer memory 240. In addition, the host interface circuit 210 transmits data in the buffer memory 240 to the host apparatus in response to a command of the CPU 230.

The NAND interface circuit 250 is connected to the NAND type flash memory 100 through a NAND bus, and takes charge of communication with the NAND type flash memory 100. In addition, the NAND interface circuit 250 transmits a command that is received from the CPU 230 to the NAND type flash memory 100, and transmits write data in the buffer memory 240 to the NAND type flash memory 100 during writing. In addition, during reading, the NAND interface circuit 250 transmits data, which is read out from the NAND type flash memory 100, to the buffer memory 240.

The CPU 230 controls an overall operation of the controller 200. For example, when receiving a write command from the host apparatus, the CPU 230 issues a write command based on the NAND interface in response to reception of the write command. This is also true of writing and erasing. In addition, the CPU 230 executes various processes such as wear leveling performed to manage the NAND type flash memory 100. In addition, the CPU 230 executes various arithmetic operations. For example, the CPU 230 executes a data encoding process, a randomization process, and the like.

The ECC circuit 260 executes an error checking and correcting (ECC) process with respect to data. That is, the ECC circuit 260 generates parity based on write data during writing of data, generates syndrome from the parity during reading to detect an error, and corrects the error. Alternatively, the CPU 230 may perform the function of the ECC circuit 260.

The built-in memory 220 is, for example, a semiconductor memory such as DRAM, and is used as a work region of the CPU 230. In addition, the built-in memory 220 retains firmware configured to manage the NAND type flash memory 100, and various management table, and the like. In addition, for example, the built-in memory 220 retains a table (write situation table) that stores a write situation of the NAND type flash memory 100. Details of the write situation table will be described in the following 1.1.4 section.

1.1.2 With Respect to Configuration of Semiconductor Memory Device

Next, a configuration of the NAND type flash memory 100 will be described.

1.1.2.1 With Respect to Overall Configuration of Semiconductor Memory Device

Figure 2:
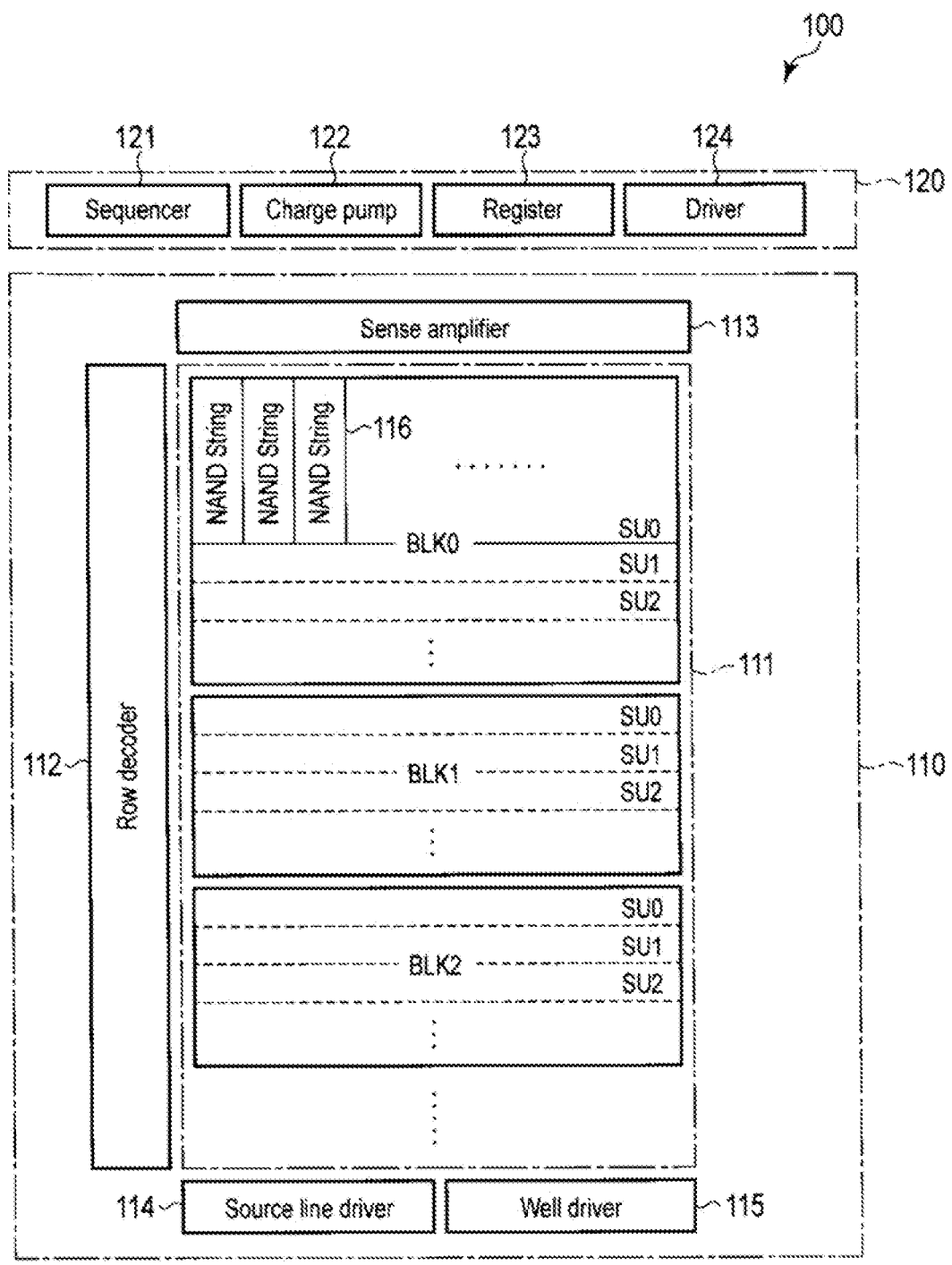
FIG. 2 is a block diagram of a semiconductor memory device according to the first embodiment.

FIG. 2 is a block diagram of the NAND type flash memory 100 according to this embodiment. As illustrated, the NAND type flash memory 100 includes a core section 110 and a peripheral circuit 120.

The core section 110 includes a memory cell array 111, a row decoder 112, a sense amplifier 113, a source line driver 114, and a well driver 115.

The memory cell array 111 includes a plurality of blocks BLK (BLK0, BLK1, BLK2, . . . ) as an assembly of a plurality of nonvolatile memory cell transistors MT which are correlated to a word line and a bit line. Each of the blocks BLK forms a data erase unit, and a plurality of pieces of data in the same block BLK are collectively erased. Each of the blocks BLK includes a plurality of string units SU (SU0, SU1, SU2, . . . ), each including an assembly of NAND strings 116 in which memory cells are connected in series. In addition, the number of blocks in the memory cell array 111 or the number of the string units SU in one block BLK is arbitrary. Details of the memory cell array 111 will be described later.

The row decoder 112 decodes a block address or a page address, and selects one word line of a corresponding block BLK. In addition, the row decoder 112 applies an appropriate voltage to a selected word line and a non-selected word line.

The sense amplifier 113 senses and amplifies data, which is read out from the memory cell transistors MT to a bit line BL, during reading data. In addition, the sense amplifier 113 transmits write data to the memory cell transistors MT during writing of data. Reading and writing of data from and in the memory cell array 111 is performed in unit of a plurality of memory cell transistors MT, and this unit is referred to as a page.

The source line driver 114 applies a voltage to a source line.

The well driver 115 applies a voltage to a well region in which the NAND strings 116 are formed.

The peripheral circuit 120 includes a sequencer 121, a charge pump 122, a register 123, and a driver 124.

The sequencer 121 controls an overall operation of the NAND type flash memory 100.

The charge pump 122 raises a power supply voltage that is supplied from the outside, and supplies a necessary voltage to the driver 124.

The driver 124 supplies a voltage, which is necessary for writing, reading, and erasing of data, to the row decoder 112, the sense amplifier 113, the source line driver 114, and the well driver 115.

The register 123 retains various signals. For example, the register 123 retains a status of a data writing operation or a data erasing operation, and notifies the controller of whether or not an operation is normally completed according to the status. In addition, the register 123 may also retain various tables.

1.1.2.2 With Respect to Configuration of Memory Cell Array

Figure 3:
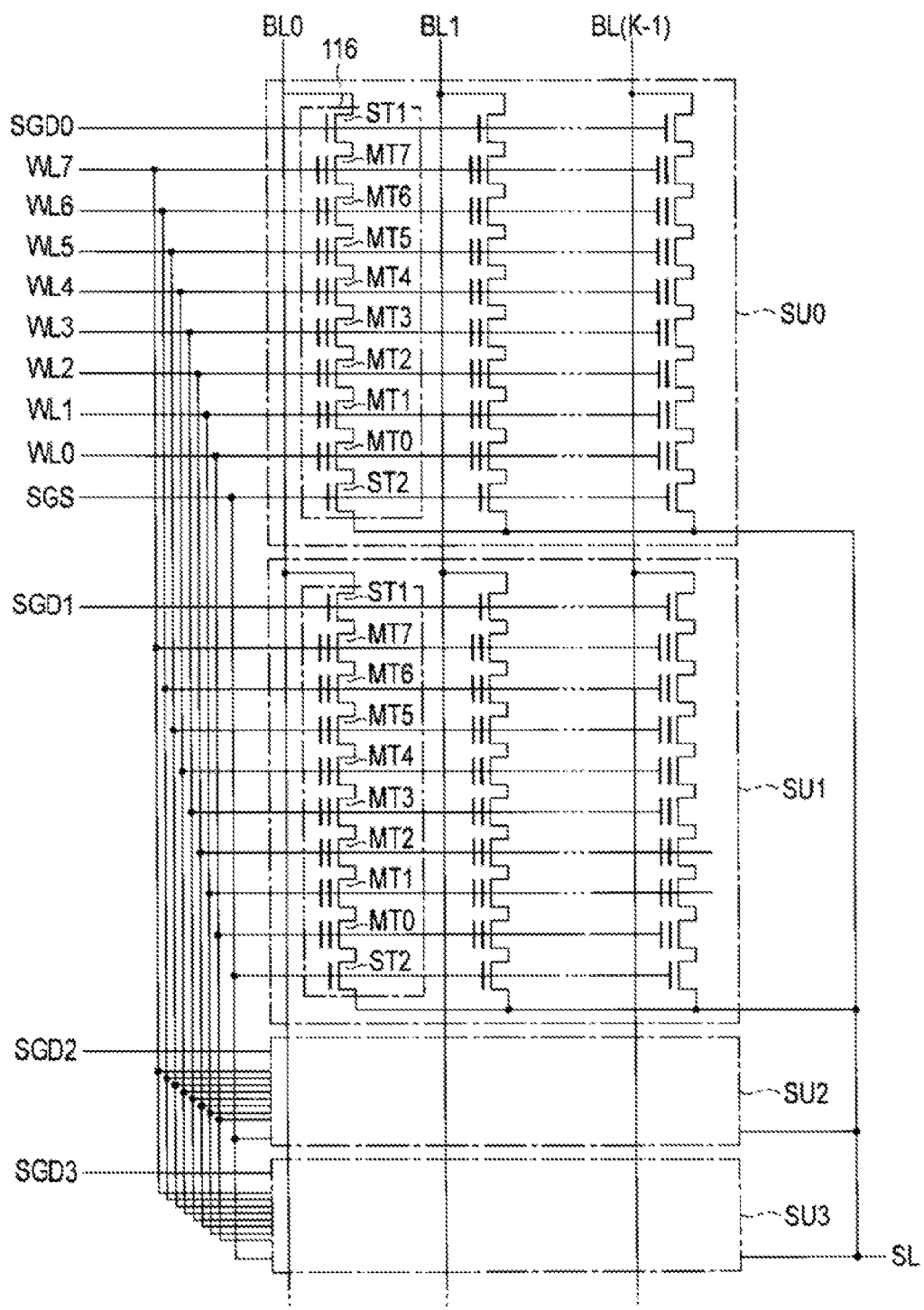
FIG. 3 is a circuit diagram of a memory cell array according to the first embodiment.

Next, details of the configuration of the memory cell array 111 will be described. FIG. 3 is a circuit diagram of the block BLK0. The other blocks BLK also have the same configuration.

As illustrated in the drawing, for example, the block BLK0 includes four string units SU (SU0 to SU3). In addition, each of the string units SU includes a plurality of NAND strings 116.

For example, each of the NAND strings 116 includes eight memory cell transistors MT (MT0 to MT7), and selection transistors ST1 and ST2. Each of the memory cell transistors MT includes a stacked gate including a control gate and a charge storage layer, and retains data in a nonvolatile state. In addition, the number of the memory cell transistors MT is not limited to eight, and may be 16, 32, 64, 128, and the like without limitation. Current paths of the memory cell transistors MT0 to MT7 are connected in series. The current path of the memory cell transistor MT7 on one end side of the serial connection is connected on end of the current path of the selection transistor ST1, and the current path of the memory cell transistor MT0 on the other end side of the serial connection is connected to one end of the current path of the selection transistor ST2.

The gate of the selection transistor ST1 of each of the string units SU0 to SU3 is commonly connected to each of selection gate lines SGD0 to SGD3. On the other hand, the gate of the selection transistor ST2 is commonly connected to the same selection gate line SGS between a plurality of string units. In addition, each of the control gates of the memory cell transistors MT0 to MT7 in the same block BLK0 is commonly connected to each of word lines WL0 to WL7.

That is, common connection of each of the word lines WL0 to WL7 and the selection gate line SGS is established between the plurality of string units SU0 to SU3 in the same block BLK. In contrast, the selection gate line SGD is configured to be independent for each of the string units SU0 to SU3 even in the same block BLK.

In addition, the other end of the current path of the selection transistor ST1 of each of NAND strings 116, which pertain to the same column among the NAND strings 116 that are disposed in a matrix shape in the memory cell array 111, is commonly connected to each of several bit lines BL (BL0 to BL (K−1), (K−1) represents a natural number of 1 or greater). That is, the bit line BL commonly connects the NAND strings 116 between a plurality of blocks BLK. In addition, the other end of the current path of the selection transistor ST2 is commonly connected to a source line SL. For example, the source line SL commonly connects the NAND strings 116 between a plurality of blocks.

Figure 4:
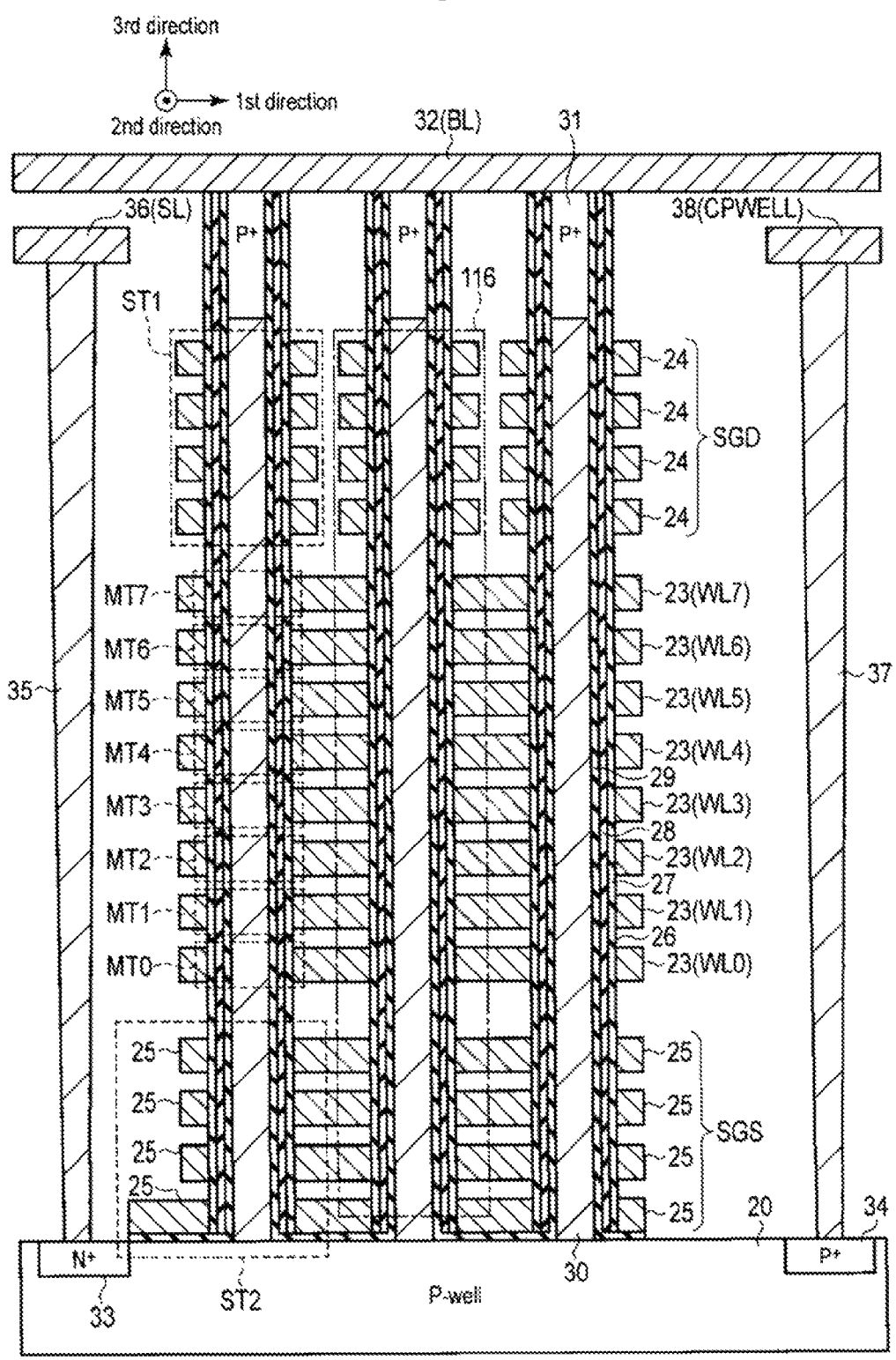
FIG. 4 is a cross-sectional view of the memory cell array according to the first embodiment.

FIG. 4 is a cross-sectional view of a partial region of the memory cell array 111 according to this embodiment. As illustrated in the drawing, a plurality of the NAND strings 116 are formed on a P-type well region 20. That is, a plurality of wiring layers 25 which function as a selection gate line SGS, a plurality of wiring layers 23 which function as a word line WL, and a plurality of wiring layers 24 which function as a selection gate line SGD are formed on the well region 20.

In addition, a memory hole 26, which penetrates through the wiring layers 23 to 25 and reaches the P-type well region 20, is formed. A block insulating film 27, a charge storage layer 28 (insulating film), and a tunnel insulating film 29 are sequentially formed on a side surface of the memory hole 26, and the inside of the memory hole 26 is filled with a conductive film 30. The conductive film 30 is a region which functions as the current path of each of the NAND strings 116, and in which a channel is formed during operation of the memory cell transistors MT and the selection transistors ST1 and ST2.

In each of the NAND strings 116, the plurality of the wiring layers 25 (in this example, four layers) are electrically connected in common, and are connected to the same selection gate lines SGS. That is, the four-layer wiring layers 25 substantially function as a gate electrode of one selection transistor ST2. This is also true of the wiring layer 24, and the four-layer wiring layers 24 are connected to the same selection gate line SGD and substantially function as a gate electrode of one selection transistor ST1. In addition, the number of layers of the wiring layers 24 and the wiring layers 25 is not limited and may be provided in one or more layers.

According to the above-described configuration, in each of the NAND strings 116, the selection transistor ST2, a plurality of the memory cell transistors MT, and the selection transistor ST1 are sequentially stacked on the P-type well region 20.

In addition, in the example of FIG. 4, the selection transistors ST1 and ST2 are provided with the charge storage layer 28 similar to the memory cell transistors MT. However, the selection transistors ST1 and ST2 substantially function as a switch instead of functioning as a memory cell that retains data. At this time, a threshold value at which the selection transistors ST1 and ST2 are turned on and off may be controlled by injecting a charge into the charge storage layer 28.

A P$^+$-type impurity diffusion layer 31 is formed in a region of the conductive film 30 on an upper side of the wiring layer 24. Accordingly, the diffusion layer 31 is connected to a wiring layer 32 that functions as the bit line BL.

The bit line BL is connected to the sense amplifier 113.

In addition, an N$^+$-type impurity diffusion layer 33 and a P$^+$-type impurity diffusion layer 34 are formed inside a surface of the P-type well region 20. A contact plug 35 is formed on the diffusion layer 33, and a wiring layer 36 that functions as the source line SL is formed on the contact plug 35. The source line SL is connected to the source line driver 114. In addition, a contact plug 37 formed on the diffusion layer 34, and a wiring layer 38 that functions as a well wiring CPWELL is formed on the contact plug 37. The well wiring CPWELL is connected to the well driver 115. The wiring layers 36 and 38 formed in a layer which is located on an upper side in comparison to the selection gate line SGD, and is located on a lower side in comparison to the wiring layer 32.

A plurality of the above-described configurations are disposed in a depth direction of a paper surface on which FIG. 4 is drawn, and the string unit SU is formed by an assembly of the plurality of NAND strings 116 which extend in the depth direction. In addition, the wiring layers 25, which function as a plurality of the selection gate lines SGS included in the same string unit SU, are commonly connected to each other. That is, the tunnel insulating film 29 is also formed on the P-type well region 20 between the NAND strings 116 which are adjacent to each other, and the wiring layer 25 that is adjacent to the diffusion layer 33, and the tunnel insulating film 29 are formed to the vicinity of the diffusion layer 33.

Accordingly, when a charge is supplied from the diffusion layer 33 to the conductive film 30, an N-channel is formed in the memory cell transistors MT, and the selection transistors ST1 and ST2, and thus these components operate as an N-channel transistor. In addition, when a hole is supplied from the diffusion layer 31 to the conductive film 30, a P-channel is formed in the memory cell transistors MT, and the selection transistors ST1 and ST2, and these components operate as a P-channel transistor. As described above, the structure according to this embodiment has a structure in which the memory cell transistors MT, and the selection transistors ST1 and ST2 are capable of forming two channels (hereinafter, this structure is referred to as a dual-channel structure).

However, for example, a configuration of the memory cell array 111 may be as described in U.S. patent application Ser. No. 12/407,403, filed Mar. 19, 2009, titled "three dimensional stacked nonvolatile semiconductor memory". In addition, the configuration may be as disclosed in U.S. patent application Ser. No. 12/406,524, filed Mar. 18, 2009, titled "three dimensional stacked nonvolatile semiconductor memory", U.S. patent application Ser. No. 12/679,991, filed Mar. 25, 2010, titled "non-volatile semiconductor storage device and method of manufacturing the same", and U.S. patent application Ser. No. 12/532,030, filed Mar. 23, 2009, titled "semiconductor memory and method for manufacturing same". The contents of all of these patent applications are incorporated herein by reference in their entireties.

1.1.2.3 With Respect to Sense Amplifier

Next, a configuration of the sense amplifier 113 will be described. In this embodiment, the voltage sensing type sense amplifier 113 that senses a voltage variation of the bit line BL will be described as an example. In the voltage sensing type, a voltage sensing operation is performed by shielding bit lines adjacent to each other. That is, in the voltage sensing type, data is read out for each even bit line BLe, and for each odd bit line BLo. Accordingly, in several string units SU of several blocks BLK, among the plurality of memory cell transistors MT which are commonly connected to any one word line WL, an assembly of memory cell transistors MT, which are connected to either the even bit line BLe or the odd bit line BLo, becomes a unit called "page". Accordingly, when reading data from the even bit line BLe, the odd bit line BLo is fixed (shielded) to a constant potential, and when reading data from the odd bit line BLo, the even bit line BLe is fixed to a constant potential.

Figure 5:
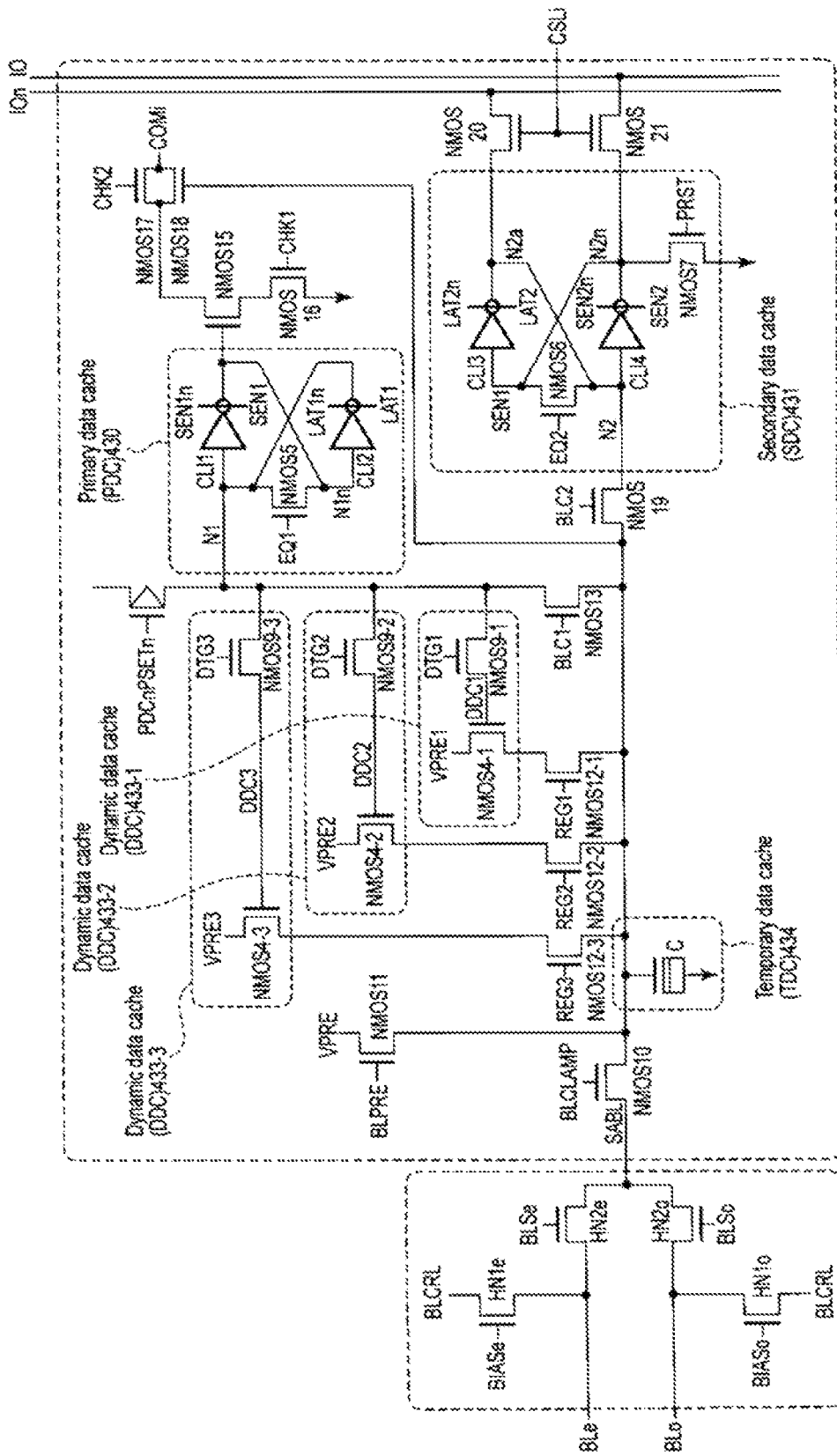
FIG. 5 is a circuit diagram of a sense amplifier according to the first embodiment.

FIG. 5 is a circuit diagram of a sense amplifier unit corresponding to two bit lines. The sense amplifier 113 is an assembly of the sense amplifier unit which is provided for every two bit lines BL and is illustrated in FIG. 5. As illustrated in the drawing, one sense amplifier unit is shared by the even bit line BLe and the odd bit line BLo.

Each sense amplifier unit includes a primary data cache (PDC) 430, a secondary data cache (SDC) 431, three dynamic data caches (DDC) 433 (433-1 to 433-3), and a temporary data cache (TDC) 434. In addition, the dynamic data caches 433 and the temporary data cache 434 may be provided as necessary. In addition, the dynamic data caches 433 may be used as a cache that retains data to be written to the bit line BL during writing.

The primary data cache 430 includes clocked inverters CLI1 and CLI2, and an N-channel MOS transistor NMOS5. The secondary data cache 431 includes clocked inverters CLI3 and CLI4, and N-channel MOS transistors NMOS6 and NMOS7. Each of the dynamic data caches 433 includes N-channel MOS transistors NMOS4 and NMOS9. In addition, the temporary data cache 434 includes a capacitor C.

Ends of current paths on one side of N-channel MOS transistors HN2e and HN2o are connected to corresponding even bit line BLe and odd bit line BLo, respectively. Signal lines BLSe and BLSo are connected to gates of the transistors HN2e and HN2o, respectively, and ends of the current paths on the other side are commonly connected to an N-channel MOS transistor NMOS10 through a wiring SABL.

In addition, sources of N-channel MOS transistors HN1e and HN1o are connected to the even bit line BLe and the odd bit line BLo, respectively. In transistors HN1e and HN1o, signal lines BIASe and BIASo are connected to gates thereof, respectively, and a signal line BLCRL is connected to drains thereof.

In the transistor NMOS10, a signal line BLCLAMP is connected to a gate thereof, and one end of a current path is connected to ends on one side of current paths of transistors NMOS11 to NMOS13, and NMOS19, a gate of a transistor NMOS18, and the temporary data cache 434.

In the transistor NMOS11, a signal line BLPRE is connected to a gate thereof, and the other end of a current path is connected to a power supply, and thus a voltage VPRE is supplied to the transistor NMOS11. For example, the VPRE is a voltage that is supplied to the sense amplifier 113 to pre-charge the bit line BL during reading data.

In transistors NMOS12, signal lines REG are connected to gates thereof, respectively, and ends on the other end side of current paths are connected to the dynamic data caches 433, respectively.

In the transistor NMOS13, a signal line BLC1 is connected to a gate thereof, and the other end of a current path is connected ends on one side of current paths of the primary data cache 430, the dynamic data caches 433, and the P-channel MOS transistor.

In the transistor NMOS19, a signal line BLC2 is connected to a gate thereof, and the other end of a current path is connected to the secondary data cache 431.

In addition, in the example of FIG. 5, as a transistor that control input and output of data in data cache, the N-channel MOS transistor is used, but a P-channel MOS transistor may be used.

In addition, the circuit configuration of the primary data cache 430, the secondary data cache 431, the dynamic data caches 433, and the temporary data cache 434 is not limited to the configuration illustrated in FIG. 5, and other circuit configurations may be employed.

1.1.3 With Respect to Threshold Value Distribution of Memory Cell Transistor

Figure 6:
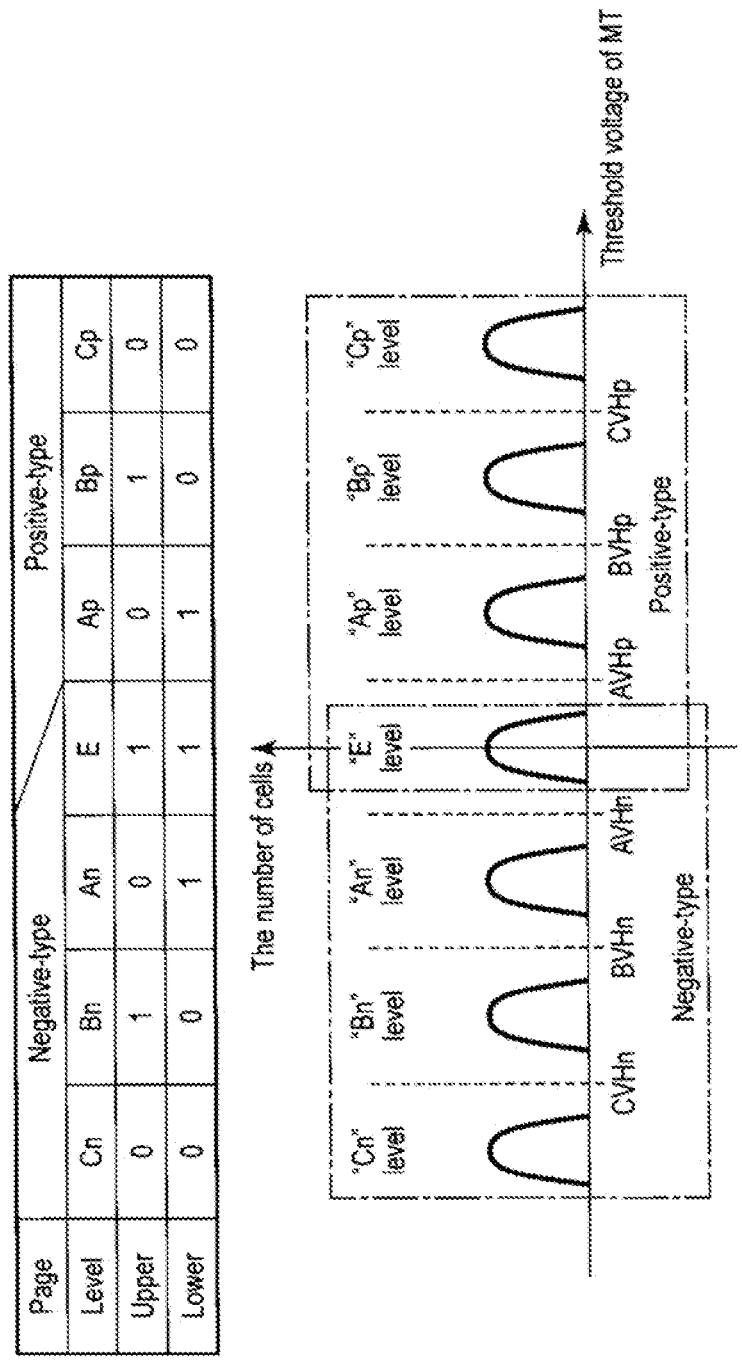
FIG. 6 is a threshold value distribution diagram of a memory cell transistor according to the first embodiment.

Next, a threshold value distribution each of the memory cell transistors MT will be described with reference to a case capable of retaining two-bit data as an example. FIG. 6 illustrates the threshold value distribution of the memory cell transistor MT according to this embodiment.

The threshold voltage of the memory cell transistor MT according to this embodiment includes a positive type which takes on a positive value during writing of data, and a negative type which takes on a negative value during writing of data. In addition, in each of the types, two-bit data, that is, a plurality of pieces of data such as "11", "01", "10", and "00" may be retained.

As illustrated in the drawing, "11" data corresponds to an erase state, and a threshold value thereof is in an "E" level commonly in the positive type and the negative type. The "E" level has a positive value or a negative value, and this level is a value that is higher than a negative voltage AVHn and is lower than a positive voltage AVHp.

In the positive type, "01" data, "10" data, and "00" data correspond to a state in which a charge is injected into the charge storage layer 28 and data is written. In addition, threshold voltages of the memory cell transistor MT during retention of respective pieces of data are in an "Ap" level, a "Bp" level, and a "Cp" level. In addition, the threshold voltages satisfy a relationship of "E" level<"Ap level"<"Bp level"<"Cp" level, and the "Ap" level, the "Bp" level, and the "Cp" level have a positive value. For example, the "Ap" level is a voltage that is higher than the positive voltage AVHp and is lower than a positive voltage BVHp, and the "Bp" level is a voltage that is higher than the positive voltage BVHp and is lower than a positive voltage CVHp. The "Cp" level is a voltage that is higher than the positive voltage CVHp.

The negative type has a voltage relationship that is opposite to that of the positive type. That is, "01" data, "10" data, and "00" data in the negative type correspond to a state in which a hole is injected into the charge storage layer 28 and data is written. In addition, threshold voltages of the memory cell transistor MT during retention of respective pieces of data are in an "An" level, a "Bn" level, and a "Cn" level. In addition, the threshold voltages satisfy a relationship of "E" level>"An level">"Bn level">"Cn" level, and the "An" level, the "Bn" level, and the "Cn" level have a negative value. For example, the "An" level is a voltage that is lower than the negative voltage AVHn and is higher than a negative voltage BVHn. The "Bn" level is a voltage that is a voltage that is lower than the negative voltage BVHn and is higher than a negative voltage CVHn. The "Cn" level is a voltage that is lower than the negative voltage CVHn.

In addition, a relationship between the respective pieces of data and the threshold levels is not limited to the above-described relationship, and may be appropriately changed.

Figure 7:
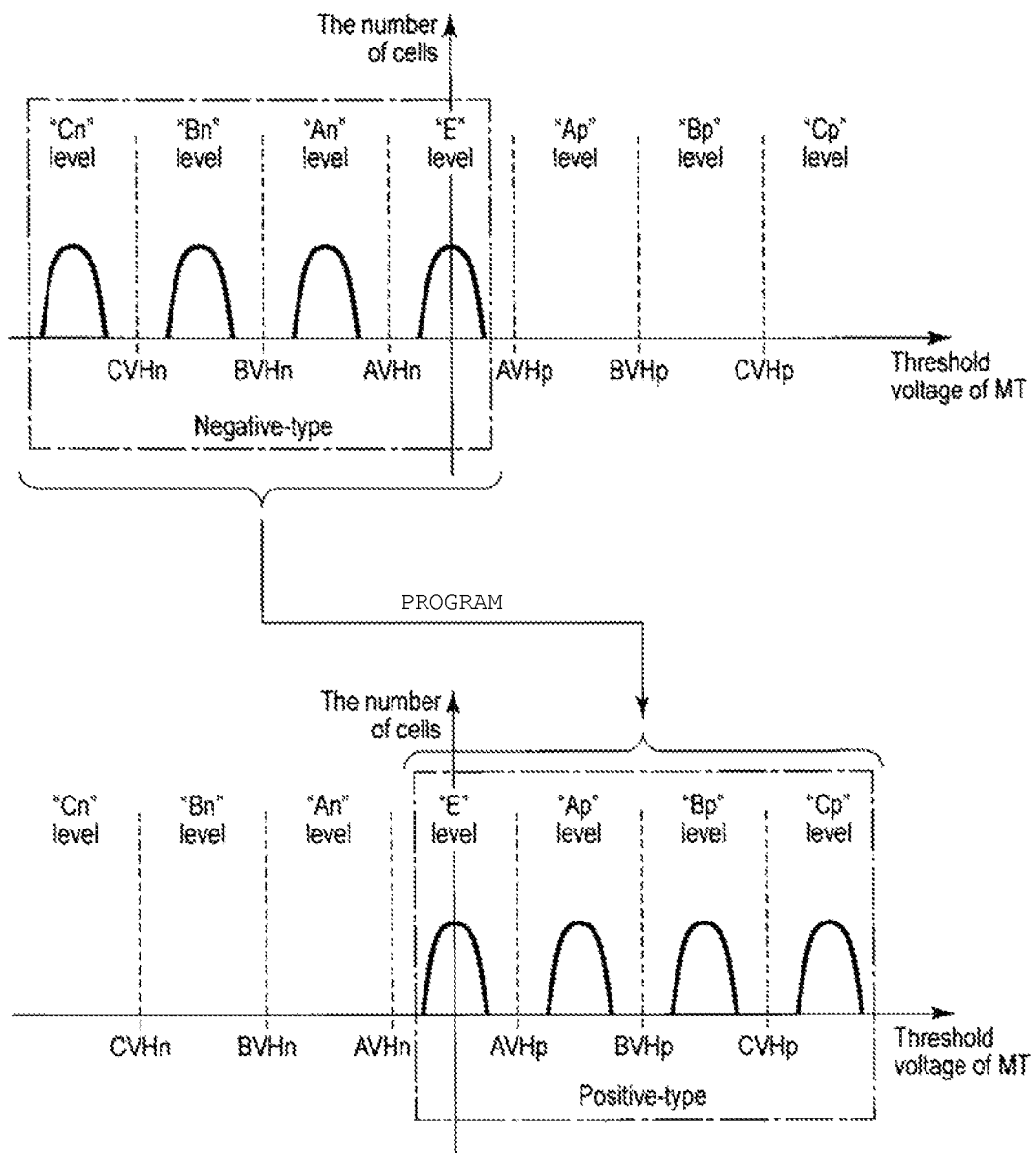
FIG. 7 is a threshold value distribution diagram illustrating a positive-mode programming according to the first embodiment.
Figure 8:
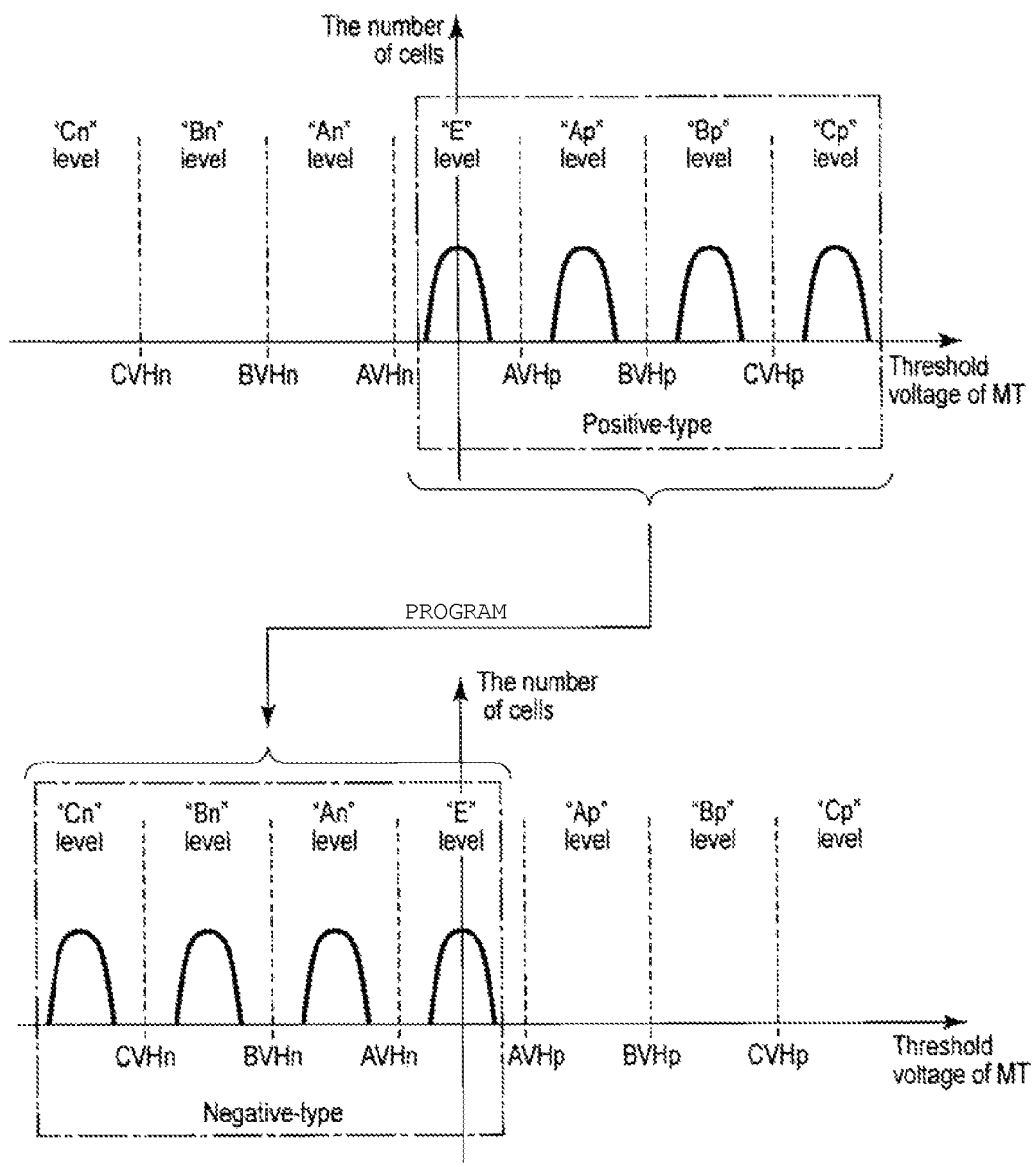
FIG. 8 is a threshold value distribution diagram illustrating a negative-mode programming according to the first embodiment.

Next, a variation in the threshold value due to a writing operation will be described. In the NAND type flash memory 100 according to this embodiment, a writing method is different depending on whether a threshold value of a page that becomes a data write target is a positive type or a negative type. The difference will be described with reference to FIGS. 7 and 8. FIGS. 7 and 8 are graphs illustrating a variation in the threshold voltage of the memory cell transistor MT along with writing of data in a case where the write target page has threshold values of the negative type and the positive type, respectively.

In addition, in the following description, an operation, which allows the threshold value of the memory cell transistor MT to vary by injecting a charge or a hole into the charge storage layer 28 during a writing operation, is referred to as "programming", and an operation of determining whether or not the threshold value of the memory cell transistor MT reaches a target threshold value as a result of the programming is referred to as verification. In addition, data is written to the memory cell transistor MT by repetition of the programming and the verification.

First, a case where the write target page has a negative-type threshold value will be described with reference to FIG.

7. As illustrated in the drawing, in this case, the programming is performed in such a manner that a threshold value after writing becomes a positive value, that is, a positive type. This programming is referred to as a "positive-mode programming". More specifically, the memory cell transistor MT having threshold values of the "Cn" level, the "Bn" level, the "An" level, and the "E" level is programmed in such a manner that the threshold values have any one of the "E" level, the "Ap" level, the "Bp" level, and the "Cp" level.

Next, a case where the write target page has a positive-type threshold value will be described with reference to FIG. 8. As illustrated in the drawing, in this case, the programming is performed in such a manner that the threshold value after writing becomes a negative value, that is, a negative type. This programming is referred as a "negative-mode programming". More specifically, the memory cell transistor MT having threshold values of the "Cp" level, the "Bp" level, the "Ap" level, and the "E" level is programmed in such a manner that the threshold values have any one of the "E" level, the "An level, the "Bn" level, and the "Cn" level.

As described above, in this embodiment, the positive-mode programming and the negative-mode programming are separately used in accordance with a type of the threshold value of the write target page, and then data is written (this is referred to as a "dual mode programming"). According to this, the memory cell transistor MT may store data in two threshold value types including the positive type and the negative type.

1.1.4 With Respect to Write Situation Table of Memory Cell Transistor

Next, the above-described write situation table will be described. FIG. 9 is a conceptual diagram of the write situation table.

As illustrated in the drawing, the write situation table retains a plurality of pieces of information which indicate a threshold value distribution type (either a positive type or a negative type) of each page, validity of data, and the cumulative number of writing operations of data.

In the example of FIG. 9, for example, in the word line WL0 of the string unit SU0 in the block BLK0, a threshold value of data that is retained by a page corresponding to the even bit line BLe is a negative type, and the data is in a valid state. In addition, the cumulative number of times of the writing operations with respect to the page is 7 times. In addition, for example, in the word line WL0, a threshold value of data that is retained by a page corresponding to the odd bit line BLo is a positive type, and the data is in an invalid state. In addition, the cumulative numbers of times of the writing operation with respect to the corresponding page is 16 times.

The CPU 230 of the controller 200 updates the write situation table whenever writing data to the NAND type flash memory 100 or whenever data copy is performed between blocks. In addition, the CPU 230 of the controller 200 manages a write state of each page by using the write situation table.

1.2 With Respect to Writing Operation of Data

A writing operation of data according to this embodiment will be described.

1.2.1 With Respect to Overall Flow of Writing Operation

Figure 10:
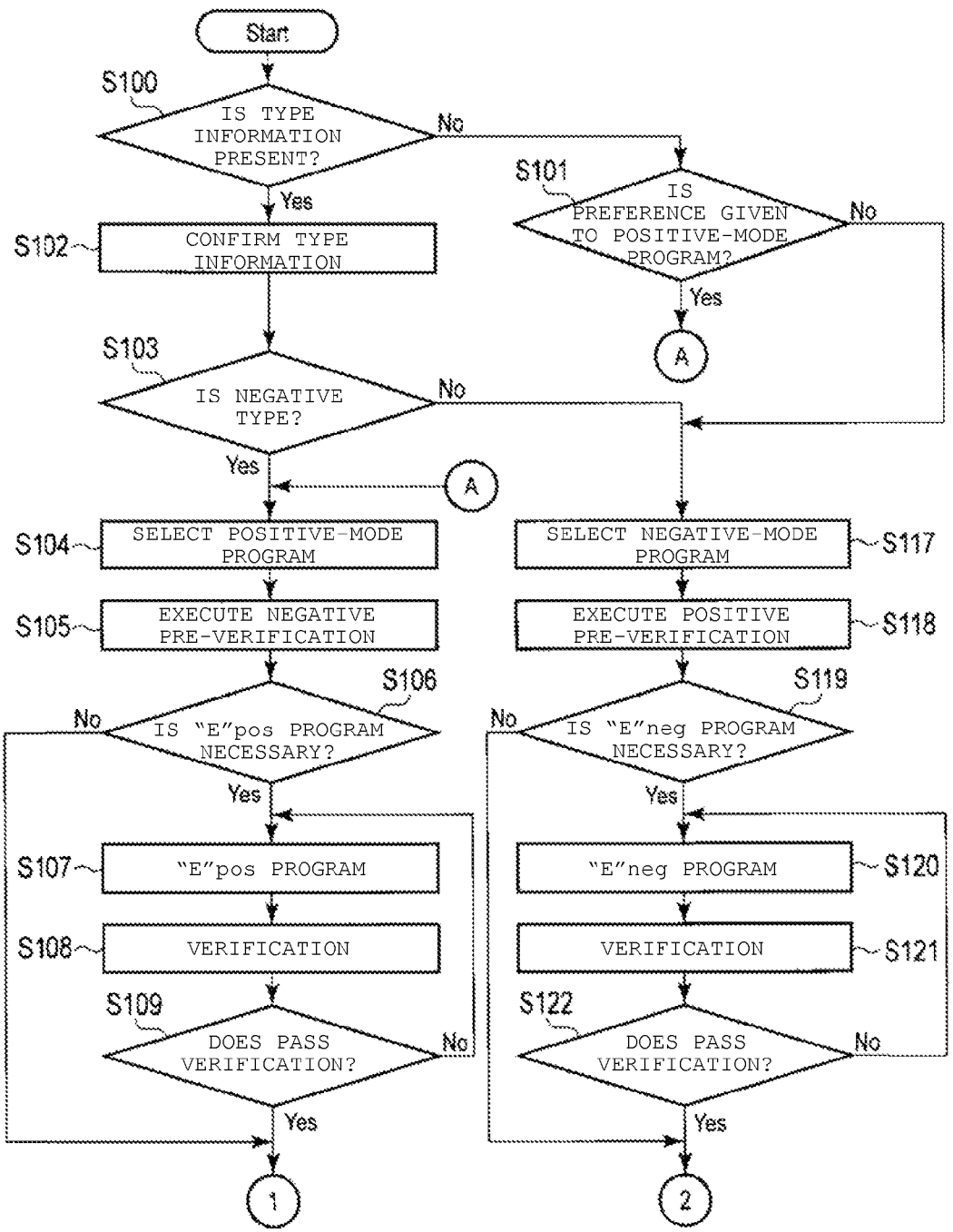
FIG. 10 is a flowchart illustrating an operation flow during a programming operation according to the first embodiment.
Figure 11:
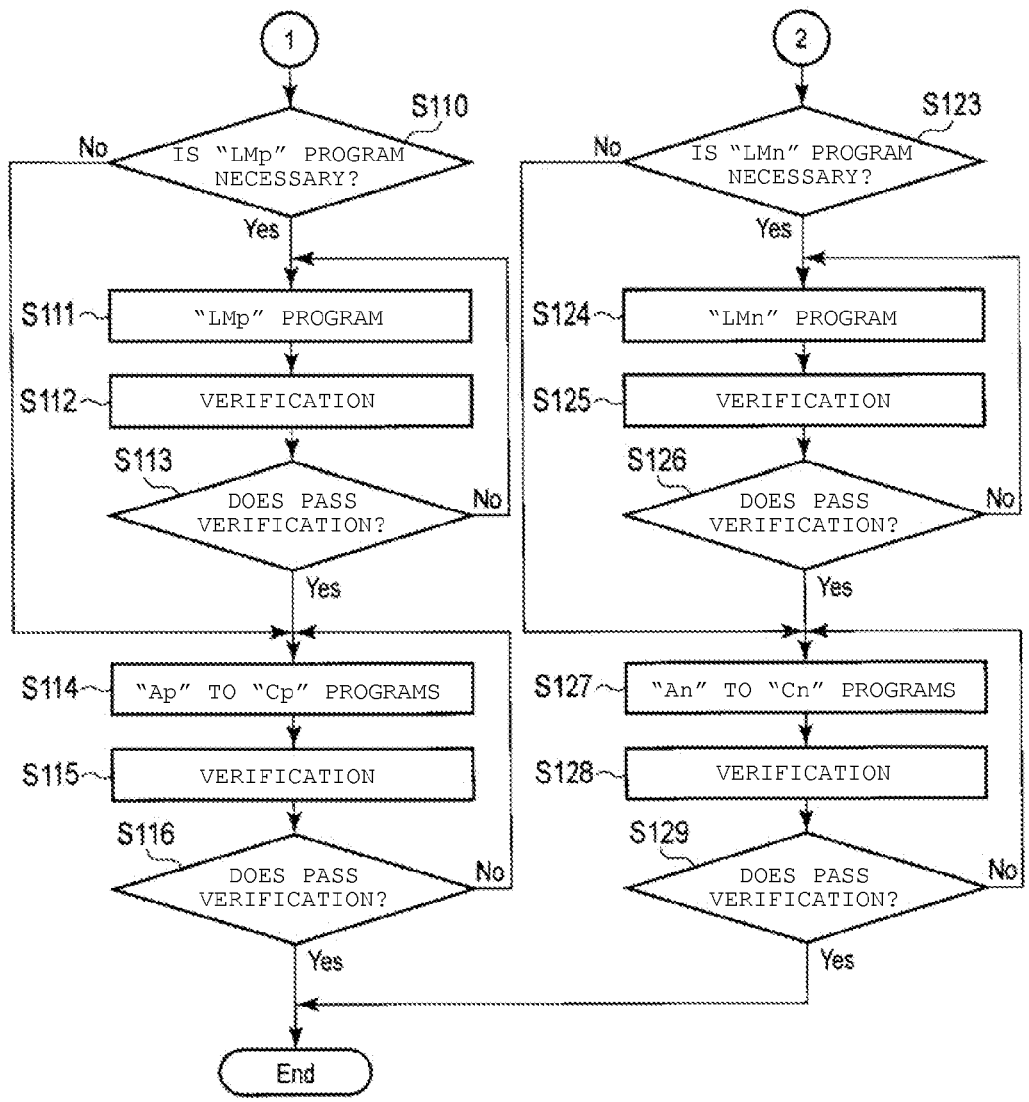
FIG. 11 is a flowchart illustrating an operation flow during a programming operation according to the first embodiment.

First, an overall flow of a writing operation of data in the NAND type flash memory 100 will be described. FIGS. 10 and 11 are flowcharts illustrating an operation flow of the NAND type flash memory 100 during the writing operation.

As illustrated in the drawings, for example, the sequencer 121 receives a write command, a write selection page address, and write data from the controller 200. At this time, in addition to the pieces of information, when information (hereinafter, referred to as "type information") related to a current threshold value distribution type is present in the write selection page, the controller 200 also transmits the information. In addition, examples of a case where the type information is not present in the write selection page include a shipment state, a case after erasing, and the like.

In this state, first, the sequencer 121 confirms whether or not the type information is received (step S100). When the type information is not received (No in step S100), the sequencer 121 selects a programming mode that is set in advance to be preferentially executed (step S101).

When the type information is received (Yes in step S100), the sequencer 121 confirms whether the threshold value of the selection page is the negative type or the positive type based on the information (step S102).

When the selection page is the negative type (Yes in step S103), and when the positive-mode programming is selected in step S101 (Yes in step S101), the sequencer 121 selects the positive-mode programming (step S104). In addition, the sequencer 121 executes negative pre-verification to confirm a threshold value state of the memory cell transistor MT (step S105).

The negative pre-verification is a process of determining whether or not data in a threshold level lower than any negative voltage Vneg corresponding to the "E" level is included in the selection page. In addition, when the data in the threshold level lower than the negative voltage Vneg is not included in the selection page, the selection page passes the negative pre-verification. On the other hand, for example, when a plurality of pieces of data in the "An" level, the "Bn" level, and the "Cn" level, and data in a level which is the "E" level and is lower than the Vneg are included, the selection page fails in the negative pre-verification.

Subsequently, the sequencer 121 determines whether or not a positive-mode programming in the "E" level (hereinafter, referred to as an ""E"pos programming") is necessary based on a result of the negative pre-verification in step S105 (step S106). Specifically, when the selection page passes negative pre-verification is passed, the sequencer 121 determines that the "E"pos programming is not necessary (No in step S106), and skips the "E"pos programming. In contrast, when the selection page fails in the negative pre-verification, the sequencer 121 determines that the "E"pos programming is necessary (Yes in step S106) and executes the "E"pos programming (step S107).

The "E"pos programming is an operation of executing a programming with respect to a memory cell transistor MT in which a threshold voltage is lower than Vneg so as to raise the threshold value to a value that is in the "E" level and is equal to or greater than Vneg. In addition, after step S107, the sequencer 121 executes verification (step S108). The verification is a process of comparing the threshold value of the memory cell transistor MT during a programming or erasing, or immediately after the programming or the erasing and a verification level with each other to determine whether or not a target threshold value is present. The verification level is a voltage corresponding to a threshold level that is a target, and the verification level that is used in the "E"pos programming is Vneg. The sequencer 121 passes the verification in step S108, or repeats the processes of step S107 and S108 until reaching the upper limit number of times which is set in advance (hereinafter, a series of processes including the programming and the verification is referred to as a "programming loop").

Subsequently, the sequencer 121 executes a programming (hereinafter, referred to as an ""LMp" programming") in an "LMp level" based on write data received from the controller 200.

The "LMp" programming is a programming operation of raising the threshold level to an "LMp" level. For example, the "LMp" level is a threshold value in an intermediate level between the "Ap" level and the "Bp" level, and is in a range of the positive voltages VLMp to CVHp. In addition, in the "LMp" programming, a memory cell transistor MT to be programmed to the "Bp" level and the "Cp" level becomes a target. Accordingly, when the memory cell transistor MT that becomes a target is not present, the sequencer 121 determines that the "LMp" programming is not necessary (No in step S110) and skips the "LMp" programming. In contrast, when the memory cell transistor MT that becomes a target is present, the sequencer 121 determines that the "LMp" programming is necessary (Yes in step S110) and executes the "LMp" programming (step S111). However, the "LMp" level is, for example, a threshold value in an intermediate level between the "Ap" level and the "Bp" level. In addition, after step S111, the sequencer 121 executes verification (step S112). A verification level at this time is VLMp. In addition, the sequencer 121 passes the verification in step S112, or repeats the processes of step S111 and S112 before reaching a predetermined number of times.

Next, the sequencer 121 executes programmings (hereinafter, referred to as ""Ap" to "Cp" programmings") in the "Ap" level, the "Bp" level, and the "Cp" level based on write data received from the controller 200 (step S114).

The "Ap" to "Cp" programmings are operations of raising a threshold value of each memory cell transistor MT in the selection page to a predetermined value based on the write data. As a result, the data received from the controller 200 is written to the selection page.

More specifically, a threshold value of a memory cell transistor MT to which "01" data is written is raised from the "E" level to the "Ap" level. A threshold value of a memory cell transistor MT to which "10" data and "00" data are written is raised from the "LMp" level to the "Bp" level and the "Cp" level, respectively.

In step S101, when the negative-mode programming is set to be preferentially executed (No in step S101), or in step S103, when the selection page is the positive type (No in step S103), the sequencer 121 selects the negative-mode programming (step S117). In addition, the sequencer 121 executes positive pre-verification to confirm a threshold value state of the memory cell transistor MT (step S118).

The positive pre-verification is a process of determining whether or not data in a threshold level, which corresponds to the "E" level and is higher than a positive voltage Vpos, is included in the selection page in a manner opposite to the negative pre-verification described in step S105. When the data is not included, the selection page passes the negative pre-verification, and when the data is included, the selection page fails in the negative pre-verification.

Subsequently, the sequencer 121 executes a negative-mode programming (hereinafter, referred to as an ""E"neg programming") in the "E" level based on the result in step S118 (step S120). The "E"neg programming is an operation opposite to the "E"pos programming described in step S105. That is, the "E"neg programming is an operation of executing a programming with respect to a memory cell transistor MT in which a threshold voltage is higher than Vpos so as to lower the threshold value to a value that is in the "E" level and is equal to or less than Vpos.

Subsequently, the sequencer 121 executes a programming (hereinafter, referred to as an ""LMn" programming") in an "LMn" level based on write data received from the controller 200 (step S124).

The "LMn" programming is also true of the "LMp" programming described in step S110. That is, the "LMn" programming is a programming operation of setting a threshold value of a memory cell transistor MT, which is to be programmed to the "Bn" level and the "Cn" level, to the "LMn" level. For example, the "LMn" level is a threshold value in an intermediate level between the "An" level and the "Bn" level, and is in a range of CVHn to the negative voltage VLMn. In addition, a verification level during performing verification is VLMn.

Next, the sequencer 121 executes programmings (hereinafter, referred to as ""An" to "Cn" programmings") in the "An" level, the "Bn" level, and the "Cn" level based on write data received from the controller 200 (step S127).

This step is similar to step S114, and is an operation of raising a threshold value of each memory cell transistor MT on the selection page to a predetermined value based on the write data. As a result, the data received from the controller 200 is written to the selection page.

1.2.2 With Respect to Specific Example of Writing Operation

Next, specific examples of the negative pre-verification, the "E"pos programming, the "LMp" programming, the "Ap" to "Cp" programmings, the positive pre-verification, the "E"neg programming, the "LMn" programming, and the "An" to "Cn" programmings will be described with reference to FIGS. 12 to 17. FIGS. 12 to 17 are graphs illustrating a variation in a threshold value distribution in the selection page during each operation.

Figure 12:
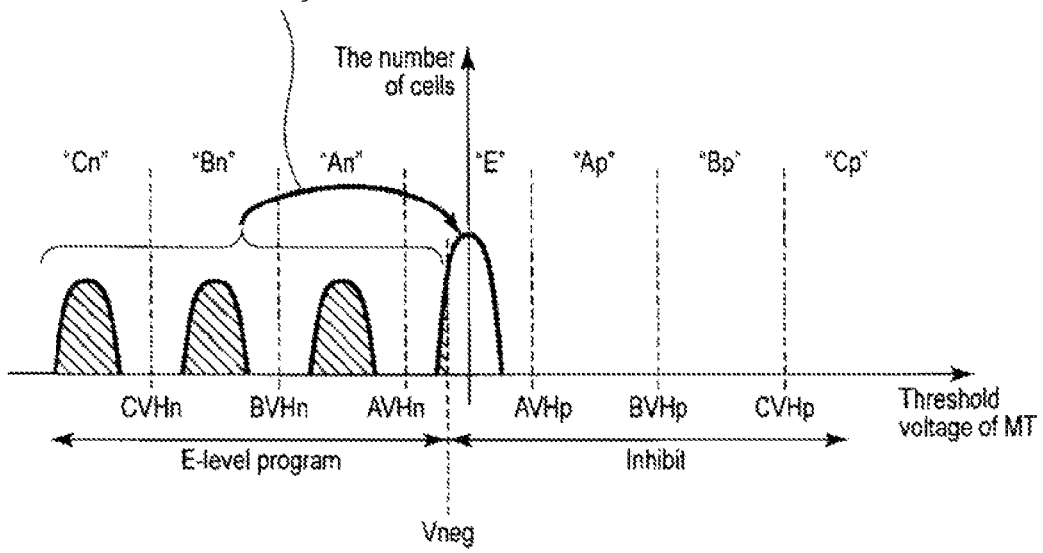
FIG. 12 is a distribution diagram illustrating a negative-type threshold value that becomes an "E" level programming target according to the first embodiment.

First, an example of the negative pre-verification is illustrated in FIG. 12. As illustrated in the drawing, the sequencer 121 reads data from the selection page, and determines whether or not a threshold value is equal to or less than Vneg for each memory cell transistor MT. In FIG. 12, when a memory cell transistor MT having a threshold value in a hatched distribution is included in the selection page, the page fails in the negative pre-verification.

However, in this example, Vneg is set to a voltage higher than AVHn. This setting is performed to suppress enlargement in a distribution width of the "E" level, and for example, Vneg may be the same as AVHn.

Next, the "E"pos programming will be described with reference to FIG. 12. As illustrated in the drawing, the positive-mode programming is executed with respect to a memory cell transistor MT having a threshold value that is less than Vneg. As a result, threshold values of all memory cell transistors MT in the selection page are set to values in a range of Vneg to AVHp.

Figure 13:
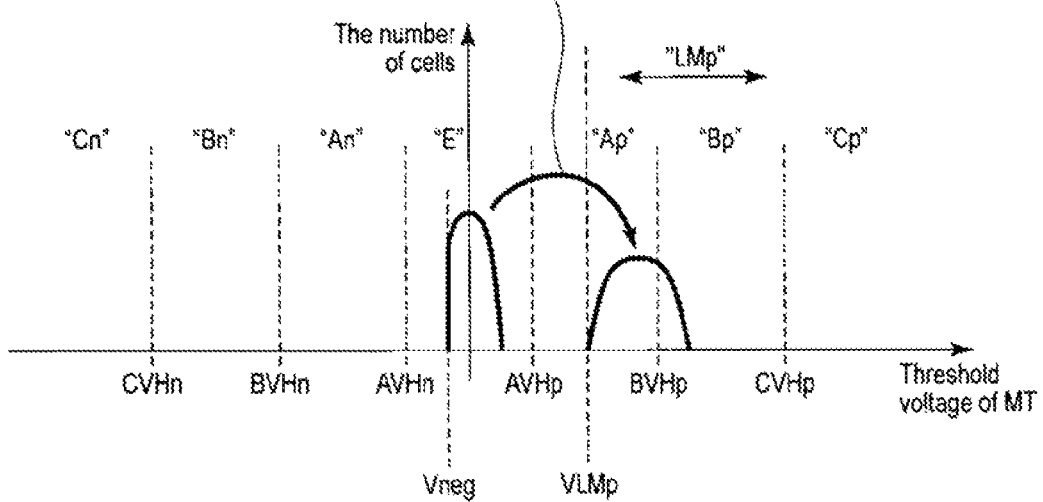
FIG. 13 is a distribution diagram of "E" level and "LMp" level threshold values according to the first embodiment.

Next, the "LMp" programming will be described with reference to FIG. 13. As illustrated in the drawing, the positive-mode programming is executed with respect to a memory cell transistor MT which is to be programmed to the "Bp" level and the "Cp" level. As a result, a threshold value of the memory cell transistor MT that is programmed is set to a value in a range of VLMp to CVHp.

Figure 14:
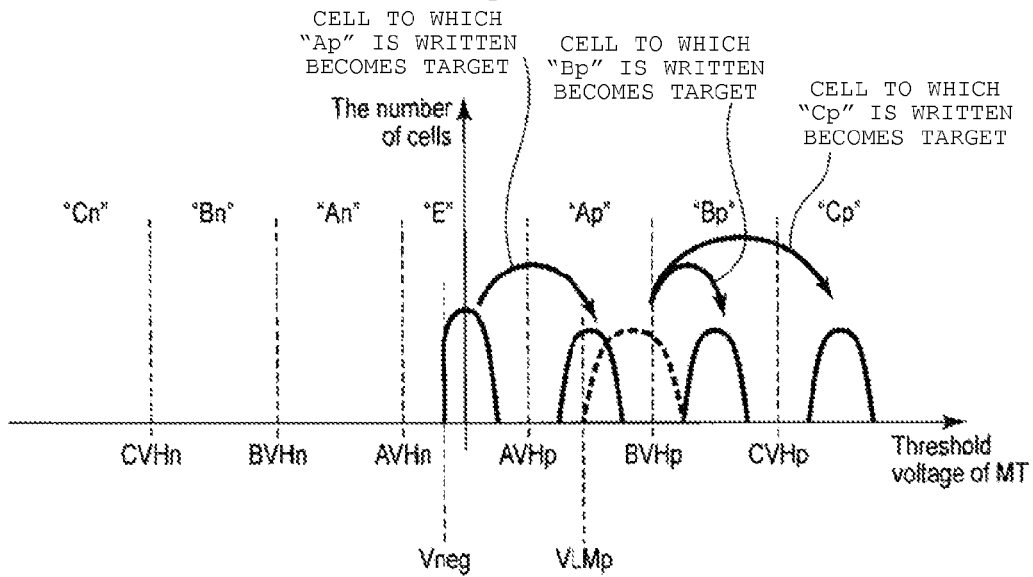
FIG. 14 is a positive-type threshold value distribution diagram illustrating a programming from an "E" level or an "LMp" level according to the first embodiment.

Next, the "Ap" to "Cp" programmings will be described with reference to FIG. 14. As illustrated in the drawing, positive-mode programming into the "Ap" level is executed with respect to a part of memory cell transistors MT in the "E" level. In addition, a positive-mode programming into the "Bp" level or the "Cp" level is executed with respect to a memory cell transistor MT in the "LMp" level.

Figure 15:
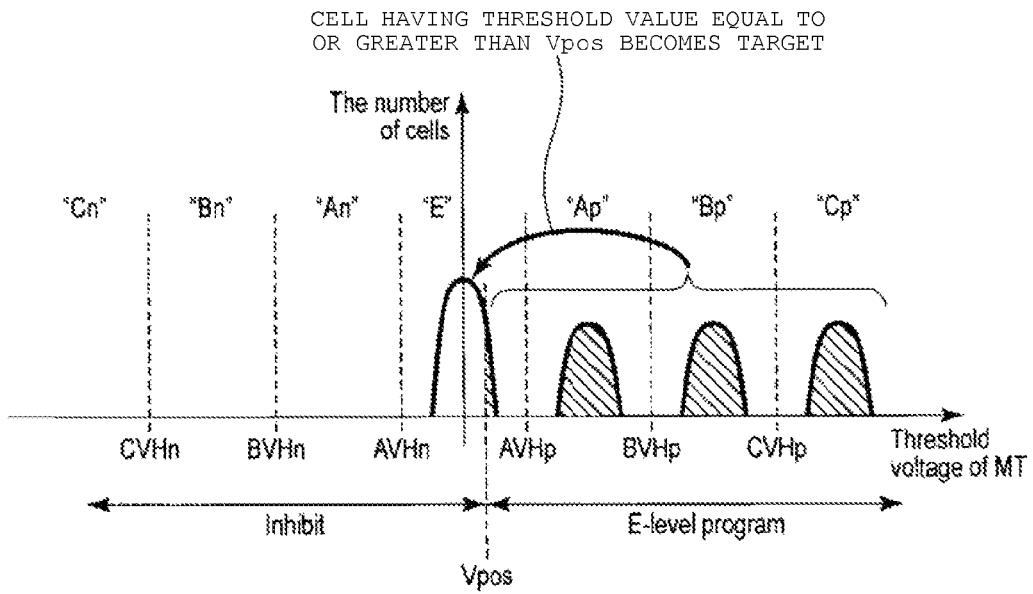
FIG. 15 is a distribution diagram illustrating a positive-type threshold value that becomes an "E" level programming target according to the first embodiment.

Next, the positive pre-verification will be described with reference to FIG. 15. As illustrated in the drawing, when a memory cell transistor MT having a threshold value in a hatched distribution, which is equal to or greater than Vpos, is included in the selection page, the page fails in the positive pre-verification. However, Vpos may be the same as AVHp.

Next, the "E"neg programming will be described with reference to FIG. 15. As illustrated in the drawing, the negative-mode programming is executed with respect to a memory cell transistor MT having a threshold value that is equal to or greater than Vpos. As a result, threshold values of all memory cell transistors MT in the selection page are set to values in a range of AVHn to Vpos.

Figure 16:
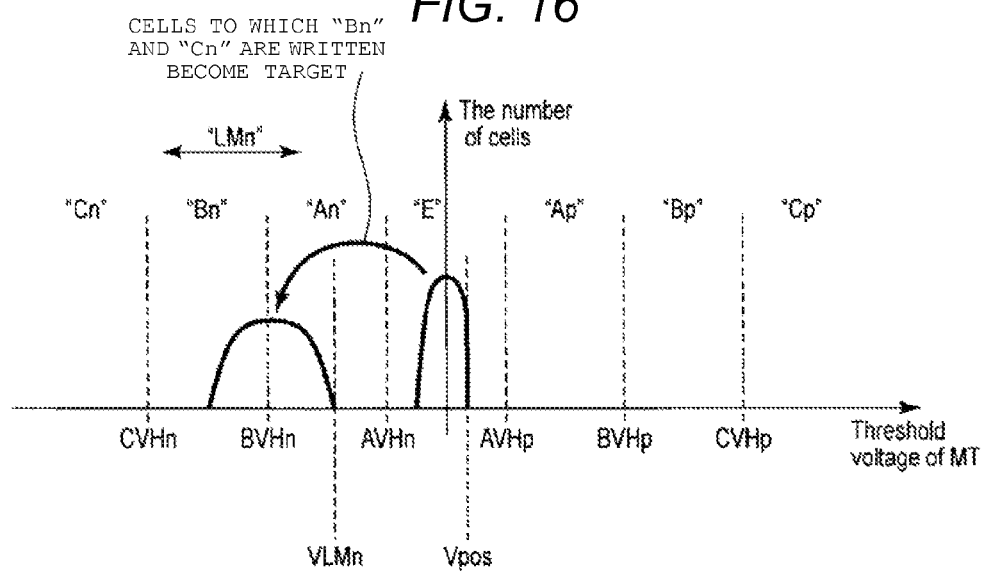
FIG. 16 is a distribution diagram of "E" level and "LMn" level threshold values according to the first embodiment.

Next, the "LMp" programming will be described with reference to FIG. 16. As illustrated in the drawing, the negative-mode programming is executed with respect to a memory cell transistor MT which is to be programmed into the "Bn" level and the "Cn" level. As a result, a threshold value of the memory cell transistor MT that is programmed is set to a value in a range of CVHn to VLMn.

Figure 17:
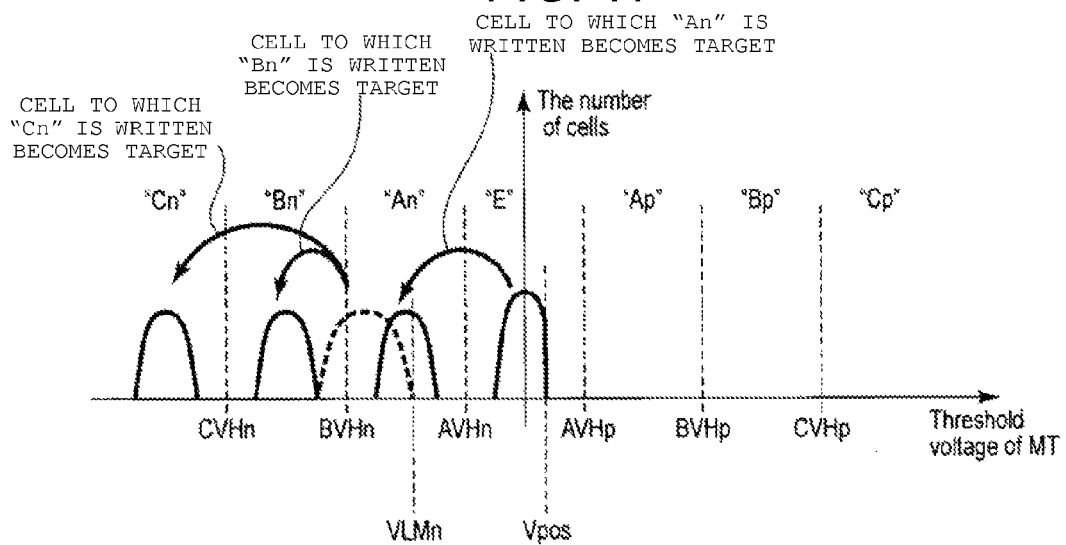
FIG. 17 is a negative-type threshold value distribution diagram illustrating a programming operation from an "E" level or an "LMn" level according to the first embodiment.

Next, the "An" to "Cn" programmings will be described with reference to FIG. 17. As illustrated in the drawing, the negative-mode programming into the "An" level is executed with respect to a part of memory cell transistors MT in the "E" level. In addition, the positive-mode programming into the "Bn" level or the "Cn" level is executed with respect to a memory cell transistor MT in the "LMn" level.

1.2.3 With Respect to Voltage During Writing

Next, a voltage relationship between wirings during writing of the data will be described.

1.2.3.1 With Respect to Voltage of Positive-Mode Programming

Figure 18:
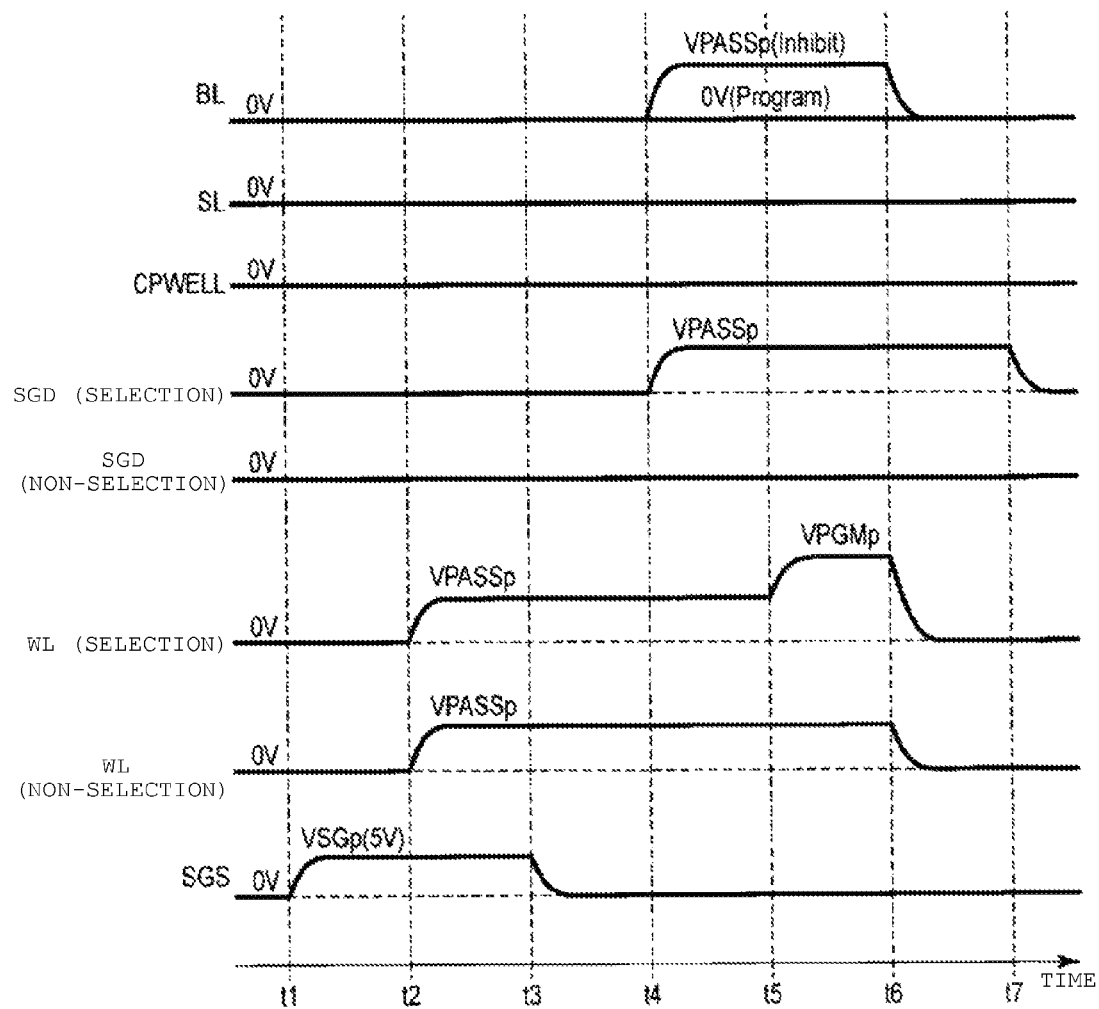
FIG. 18 is a timing chart illustrating a potential of each wiring during a positive-mode programming according to the first embodiment.

First, a voltage relationship between respective wirings during the positive-mode programming will be described. In the positive-mode programming, the selection transistors ST1 and ST2, and the memory cell transistors MT in the NAND string 116 corresponding to a page, which is a write target, operate as an N-channel transistor. FIG. 18 is a timing chart illustrating a potential of each wiring during the positive-mode programming. This chart illustrates a potential of each wiring during the "E"pos programming, the "LMp" programming, or the "Ap" to "Cp" programmings in FIGS. 10 and 11.

As illustrated in the drawing, at time t1, the row decoder 112 applies a voltage VSGp (for example, 5 V) to the selection gate line SGS. VSGp is a voltage that turns on the selection transistor ST2 in the positive-mode programming.

Next, at time t2, the row decoder 112 applies a voltage VPASSp (for example, 7 V) to the selected word line WL and the non-selected word line WL. VPASSp is a voltage that turns on the memory cell transistor MT regardless of a threshold value of the memory cell transistor MT during the positive-mode programming.

Figure 19:
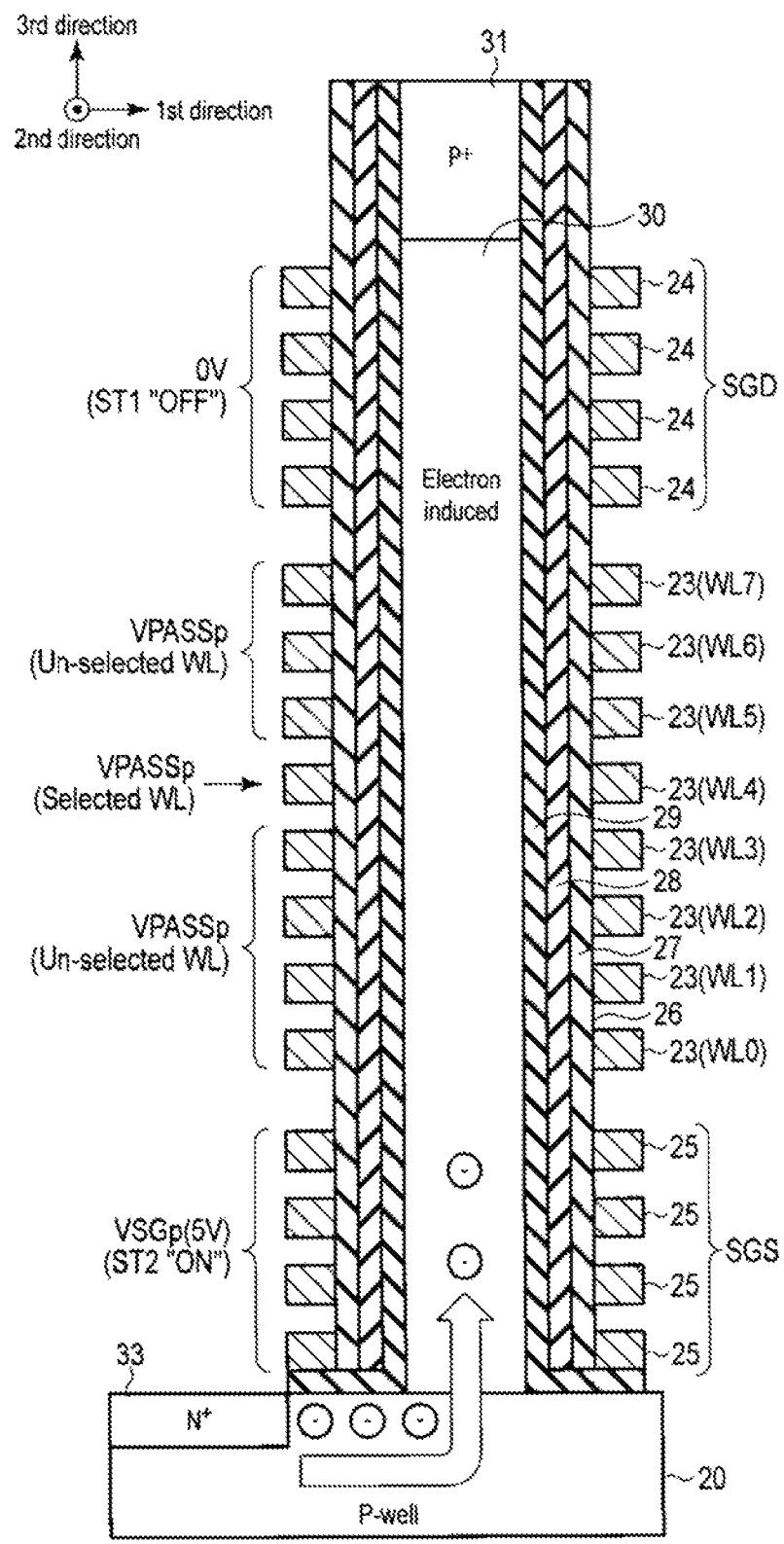
FIG. 19 is a cross-sectional view of a NAND string which illustrates an aspect in which a charge is supplied to a conductive film according to the first embodiment.

An aspect of the NAND string 116 at this time is illustrated in FIG. 19. FIG. 19 is a cross-sectional view illustrating the NAND string 116. As illustrated in the drawing, when VPASSp is applied to the selected word line WL and the non-selected word line WL, a potential of the conductive film 30 is also apt to increase to the same VPASSp due to capacitive coupling. However, since the selection transistor ST2 is in the on-state, a charge is supplied from the source line side (P-type well region 20), and thus the conductive film 30 retains 0 V that is the same voltage as in the source line SL. In addition, since a charge is supplied to the conductive film 30, an N-channel is formed in the memory cell transistors MT0 to MT7 and the selection transistor ST2, and these transistors operate as an N-channel transistor.

Description will continue by returning to FIG. 18. Subsequently, at time t3, the row decoder 112 sets a potential of the selection gate line SGS to 0 V from VSGp. According to this, the selection transistor ST2 is turned off.

Next, at time t4, the row decoder 112 applies a positive voltage, for example, VPASSp to the selection gate line SGD. In addition, the sense amplifier 113 applies, for example, 0 V to the bit line BL to which data is written to turn on the selection transistor ST1. In addition, the sense amplifier 113 applies the same potential that of the selection gate line SGD, for example, VPASSp to a bit line BL that does not perform writing, to turn off the selection transistor ST1.

Next, at time t5, the row decoder 112 applies a voltage VPGMp to the selected word line WL. VPGMp is a positive high voltage (for example 20 V) that is applied to a gate of the selected word line WL during the positive-mode programming, and a relationship of VPGMp>VPASSp is satisfied.

According to this, in the memory cell transistor MT that is a programming target, a potential difference between the selected word line WL and the conductive film 30, that is, a potential difference between a gate and a channel increases. Accordingly, a charge is injected into the charge storage layer 28 due to FN tunneling. As a result, a threshold value of the memory cell transistor MT varies toward a positive side.

Next, at time t6, the sense amplifier 113 applies 0 V to the bit line BL. The row decoder 112 applies 0 V to all word lines WL. According to this, the charge injection due to the FN tunnel current is terminated.

Finally, at time t7, the row decoder 112 applies 0 V to the selection gate line SGD. According to this, the programming is terminated.

In addition, during the time (time t1 to time t7), the source line driver 114 applies 0 V to the source line SL. The well driver 115 applies 0 V to the well wiring CPWELL.

In addition, row decoder 112 applies 0 V to the non-selection selection gate line SGD to turn off the selection transistor ST1. According to this, in the NAND string 116 that is connected to the non-selection selection gate line SGD, when a voltage of the selected word line WL increases, a potential of the conductive film 30 also increases due to capacitive coupling. Accordingly, a potential difference between a gate and a channel does not occur, and thus the FN tunnel current does not flow, and a programming is not executed. That is, a string unit SU, which is not a target, is excluded from a target of a programming.

Figure 20:
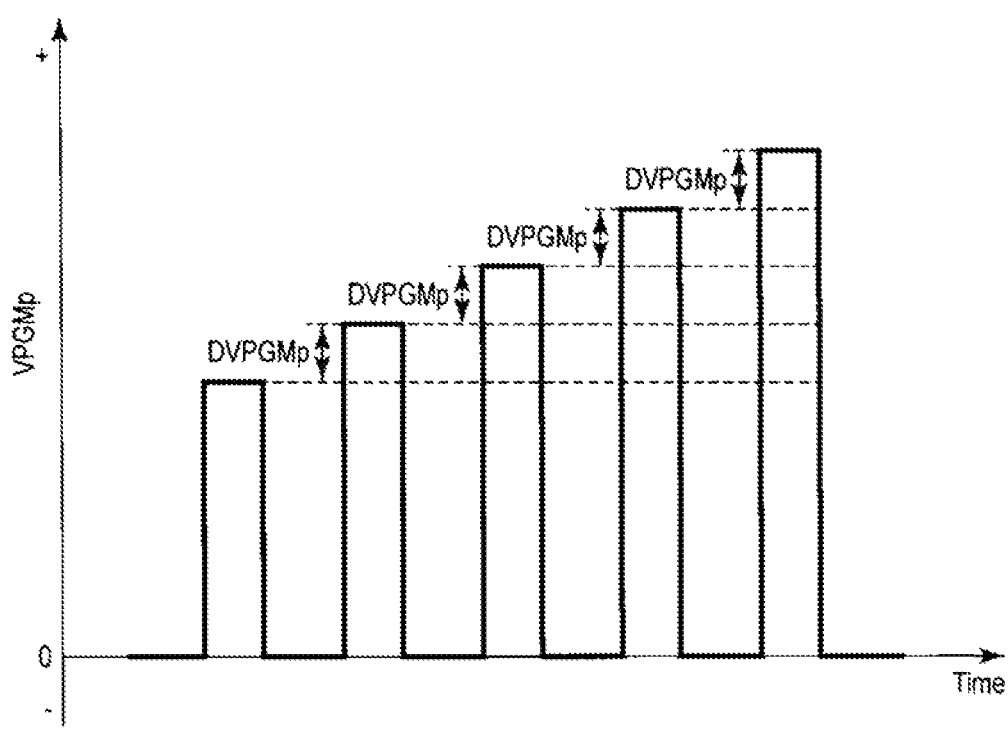
FIG. 20 is a graph illustrating a relationship between the number of times programming loop is executed and VPGMp according to the first embodiment.

FIG. 20 is a graph illustrating a relationship between the number of times the programming loop is executed and VPGMp. As illustrated in the drawing, for example, with regard to VPGMp, a voltage value may be stepped up whenever a programming loop is repeated. A step-up voltage value at this time is DVPGMp (>0 V).

1.2.3.2 With Respect to Voltage of Negative-Mode Programming

Figure 21:
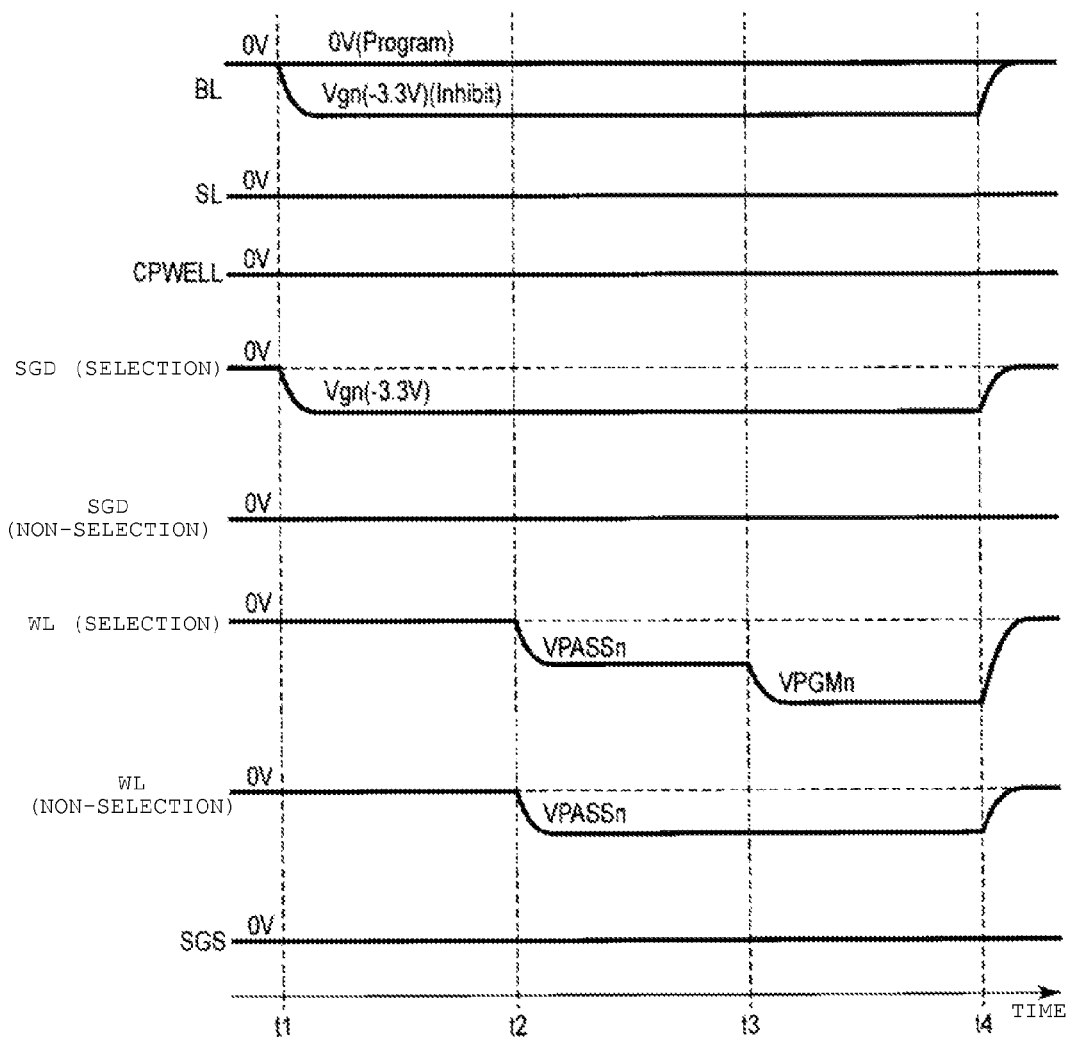
FIG. 21 is a timing chart illustrating a potential of each wiring during a negative-mode programming according to the first embodiment.

Next, a voltage relationship between respective wirings in the negative-mode programming will be described. In the negative-mode programming, the selection transistors ST1 and ST2, and the memory cell transistors MT in the NAND string 116 corresponding to a page, which is a write target, operate as a P-channel transistor. FIG. 21 is a timing chart illustrating a potential of each wiring during the negative-mode programming. This chart illustrates a potential of each wiring during the "E"neg programming, the "LMn" programming, or the "An" to "Cn" programmings in FIGS. 10 and 11.

As illustrated in the drawing, at time t1, the row decoder 112 applies a voltage Vgn (for example −3.3 V) to a selection gate line SGD corresponding to a selected page. Vgn is a voltage that is applied to the selection gate line SGD or SGS to turn on the selection gate line when the selection transistor ST1 or ST2 operates as a P-channel transistor during a programming. A relationship of Vgn<0 V is satisfied. The sense amplifier 113 applies, for example, 0 V to a bit line BL that writes data, and applies Vgn, which is the same potential as that of the selection gate line SGD, to a bit line BL that does not write data. According to this, a selection transistor ST1 corresponding to a memory cell transistor MT to which data is written is turned on, and a selection transistor ST1 corresponding to a memory cell transistor MT to which data is not written is turned off.

Next, at time t2, the row decoder 112 applies a voltage VPASSn (for example, −7 V) to the selected word line WL and the non-selected word line WL. VPASSn is a voltage to turn on the memory cell transistor MT regardless of a threshold value of the memory cell transistor MT during the negative-mode programming.

Figure 22:
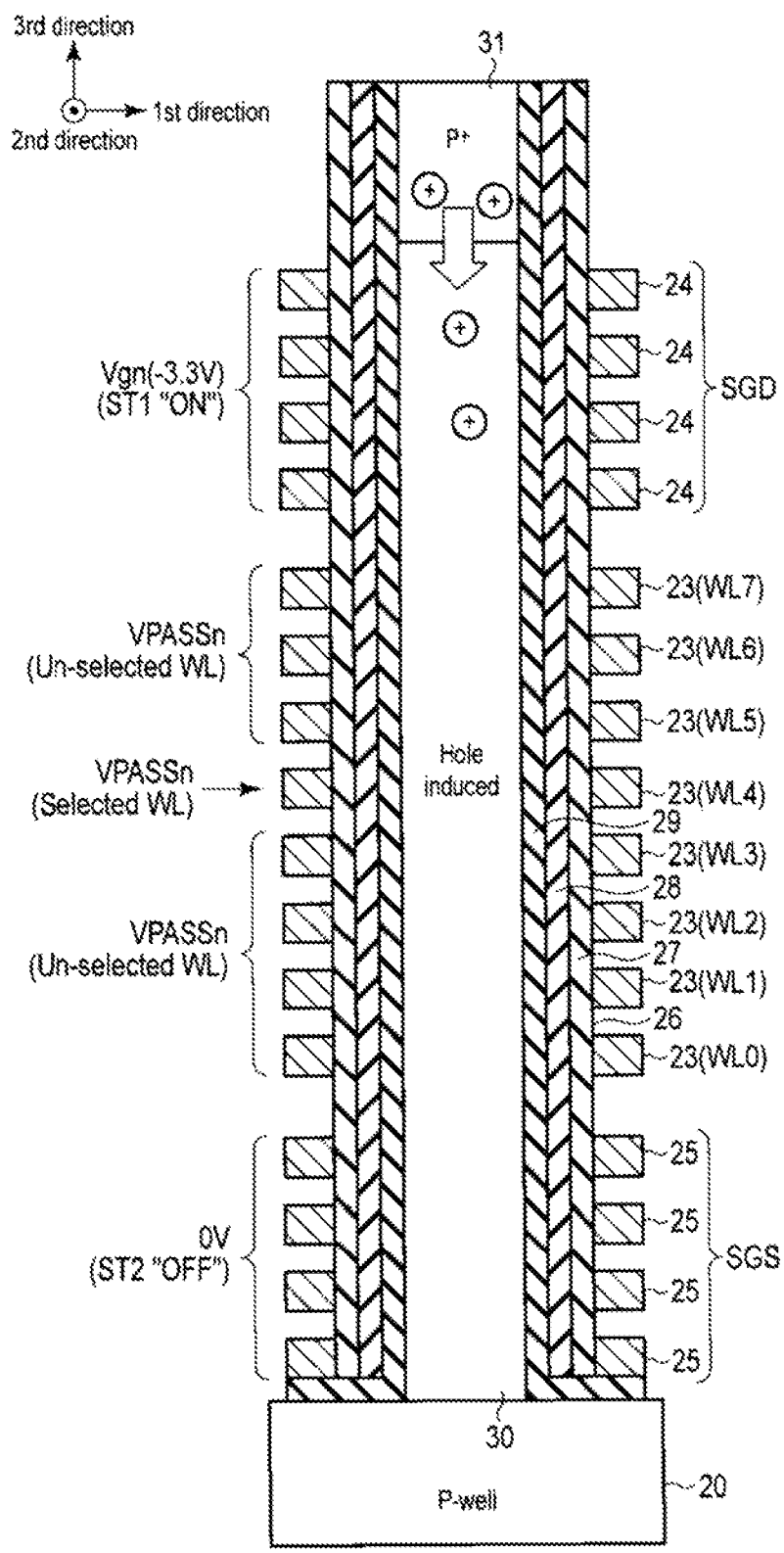
FIG. 22 is a cross-sectional view of a NAND string which illustrates an aspect in which a hole is supplied to a conductive film according to the first embodiment.

An aspect of the NAND string 116 at this time is illustrated in FIG. 22. FIG. 22 is a cross-sectional view of the NAND string 116. As illustrated in the drawing, opposite to the case of the positive-mode programming, when VPASSn is applied to the selected word line WL and the non-selected word line WL, a hole is supplied from a bit line side (P-type diffusion layer 31), and the conductive film 30 retains 0 V that is the same voltage as in the bit line BL. In addition, since a hole is supplied to the conductive film 30, a P-channel is formed in the memory cell transistors MT0 to MT7 and the selection transistor ST1, and these transistors operates a P-channel transistor.

Description will continue by returning to FIG. 21. Next, at time t3, the row decoder 112 applies a voltage VPGMn to the selected word line WL. VPGMn is a negative high voltage (for example, −20 V) that is applied to the gate of the selected word line WL during the negative-mode programming, and a relationship of VPGMn<VPASSn is satisfied.

According to this, a potential difference between the selected word line WL and the bit line BL increases, and thus an FN tunnel current flows to a memory cell transistor MT that is a programming target, and a hole is injected. As a result, a threshold value of the memory cell transistor MT varies toward a negative side.

Next, at time t4, the sense amplifier 113 applies 0 V to the bit line BL. In addition, the row decoder 112 applies 0 V to the selection gate line SGD and all word lines WL. According to this, the hole injection due to the FN tunnel current is terminated, and writing is terminated.

In addition, during the time (time t1 to time t4), the row decoder 112 applies 0 V to the selection gate line SGS. In addition, the source line driver 114 applies 0 V to the source line SL, and the well driver 115 applies 0 V to the well wiring CPWELL. According to this, the selection transistor ST2 is turned off. In addition, the row decoder 112 applies 0 V to the non-selection selection gate line SGD to turn off the selection transistor ST1. According to this, a string unit SU, which is not a target, is excluded from a target of a programming.

Figure 23:
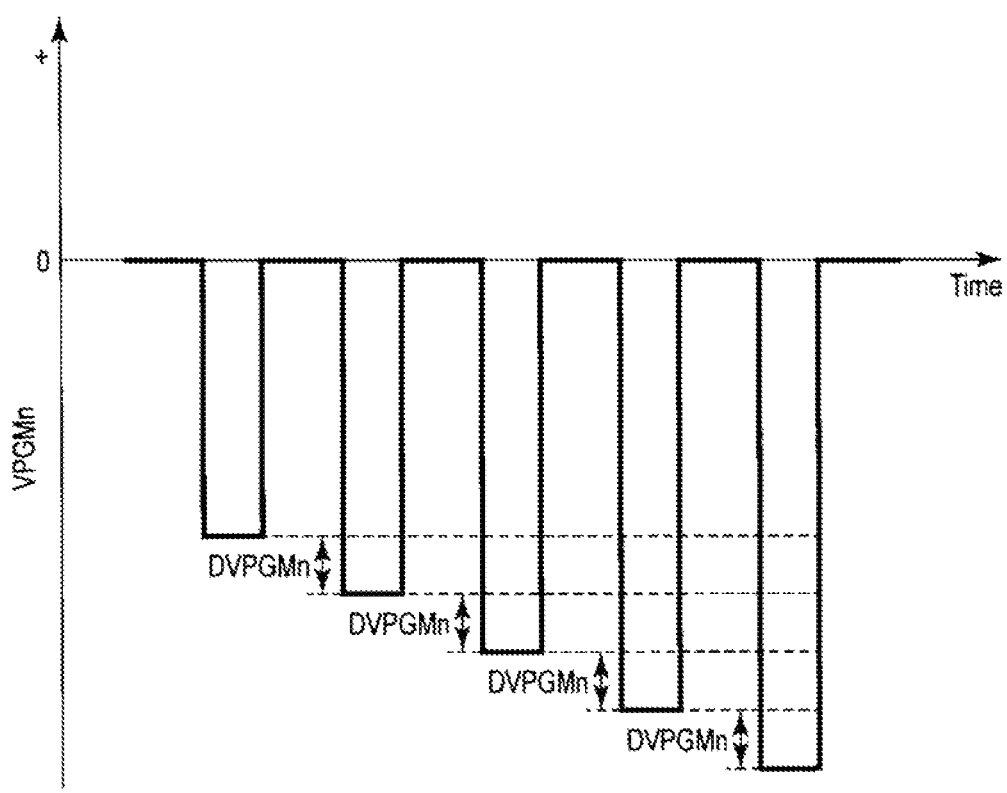
FIG. 23 is a graph illustrating a relationship between the number of times of programming loop is executed and VPGMn according to the first embodiment.

FIG. 23 is a graph illustrating a relationship between the number of times of the programming loop is executed and VPGMn. As illustrated in the drawing, for example, with regard to VPGMn, a voltage value may be stepped down whenever a programming loop is repeated. A step-down voltage value at this time is DVPGMn (<0 V).

1.3 With Respect to Reading Operation of Data

Next, a reading operation of data according to this embodiment will be described. In this embodiment, as a data reading method, two modes are present. One is a mode (hereinafter, referred to as an "N-channel reading") in which data is read out by allowing the selection transistors ST1 and ST2 and the memory cell transistors MT are allowed to operate as an N-channel transistor. The other is a mode (hereinafter, referred to as a "P-channel reading") in which data is read out by allowing the selection transistors ST1 and ST2 and the memory cell transistors MT to operate as a P-channel transistor. The N-channel reading and the P-channel reading are capable of reading out data on both sides of the positive type and the negative type, respectively. However, in the following description, a case in which the positive-type data is read out by the N-channel reading and the negative-type data is read out by the P-channel reading will be described as an example.

In addition, in this example, when type information is not present in the write situation table, that is, when it is difficult to determine whether data is the positive-type data or the negative-type data, the sequencer 121 is set in such a manner that the N-channel reading is preferentially performed, and when an error occurs with the N-channel reading, the P-channel reading is performed.

1.3.1 With Regard to Overall Flow of Reading Operation

Figure 24:
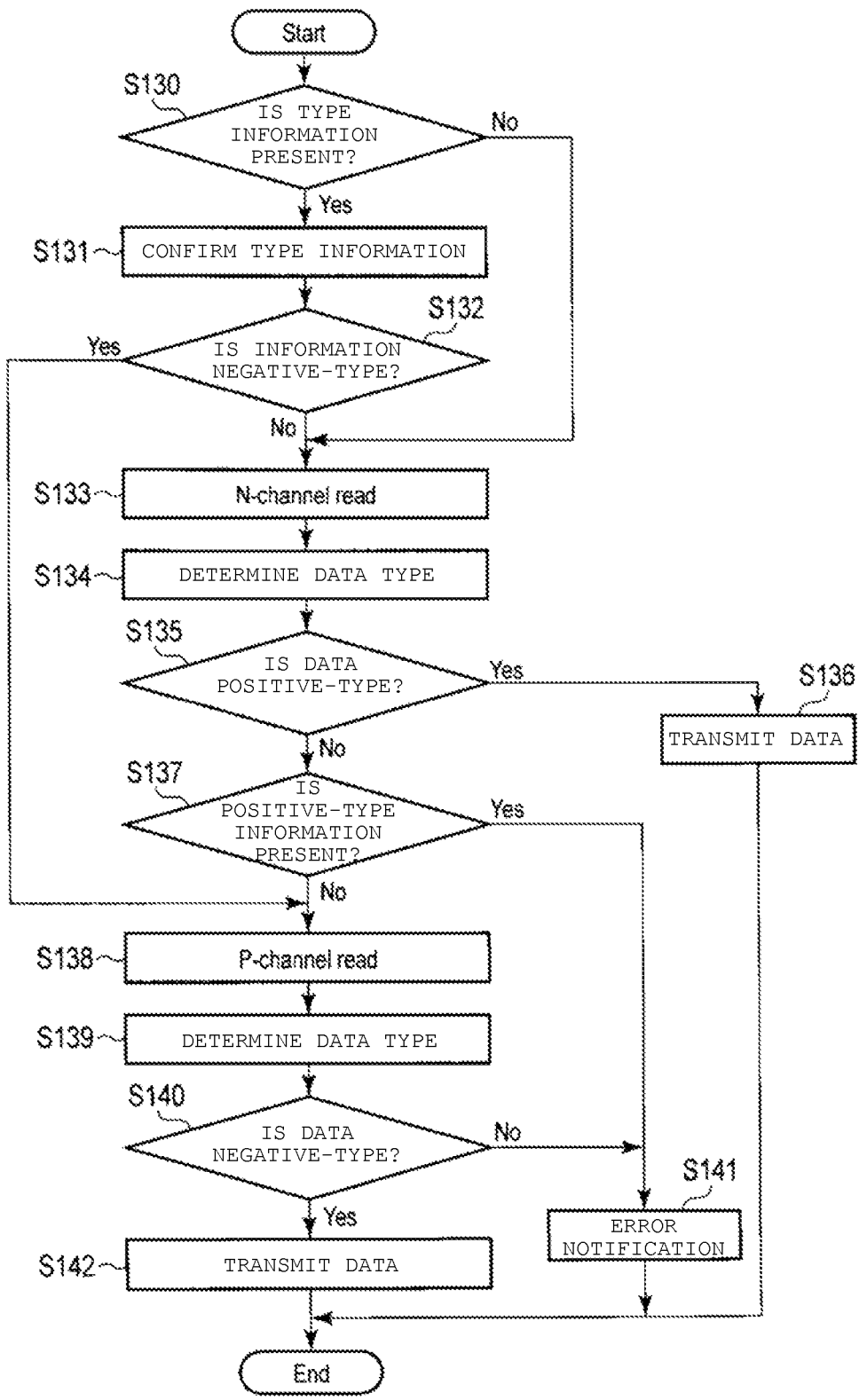
FIG. 24 is a flowchart illustrating an operation flow during reading according to the first embodiment.

A reading operation of data in the NAND type flash memory 100 will be described with reference to FIG. 24. FIG. 24 is a flowchart illustrating an operation flow of the NAND type flash memory 100 during the reading operation.

As illustrated in the drawing, for example, the sequencer 121 receives a read command, and a page address of a read target page from the controller 200. At this time, in addition to the pieces of information, when type information of the read target page is present, the controller 200 also transmits the information.

In this case, the sequencer 121 confirms whether or not preferential type information is received (step S130). When the type information is not present (No in step 130), the sequencer 121 selects a reading method (in this example, the N-channel reading) that is set in advance to be preferentially executed.

When the type information is present (Yes in step S130), the sequencer 121 confirms whether a threshold value of a selected page is the negative type or the positive type (step S131).

When the selected page is the negative type (Yes in step S132), the sequencer 121 performs the P-channel reading (step S138).

When the selected page is not the negative type (No in step S132), that is, when the selected page is the positive type, the sequencer 121 performs the N-channel reading (step S133).

Next, after executing the N-channel reading, the sequencer 121 confirms whether or not the read data is the positive type (step S134). Specifically, for example, the sequencer 121 confirms a threshold value of data indicating type information which is written to a region in which the page is present, or type information of each page which is stored in the register 123 to perform determination of whether or not the type information is the positive type.

Figure 25:
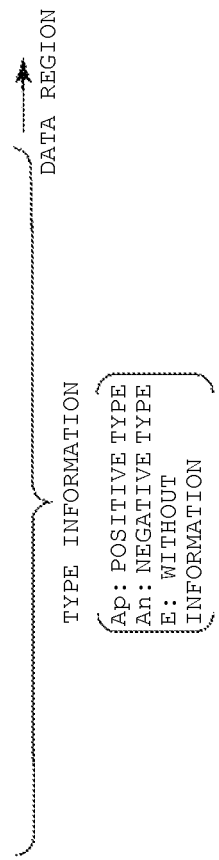
FIG. 25 is a table illustrating data that is stored in a memory cell transistor MT according to the first embodiment.

A specific example of the method of determining whether or not the type is the positive type will be described with reference to FIG. 25. This example represents a case where type information of the threshold value is written to the region in which the page is present. In FIG. 25, retention data of each bit in each word line WL is initiated by a threshold value.

As illustrated in the drawing, for example, 8 bits, which correspond to the bit lines BL0 to BL7 of respective word lines, are used as a region that stores the type information. That is, in a page corresponding to the even bit line BLe, the bit lines BL0, BL2, BL4, and BL6 are used as a region that stores the type information. In addition, in a page corresponding to the odd bit line BLo, the bit lines BL1, BL3, BL5, and BL7 are used as a region that stores the type information. In addition, in a case of indicating the positive type, for example, the "Ap" level is written, and in a case of indicating the negative type, for example, the "An" level is written. In addition, the "E" level is set during shipment, when data is erased, and the like.

Accordingly, in the example of FIG. 25, a page corresponding to the even bit line BLe of the word line WL0 retains positive-type data, and a page corresponding to the odd bit line BLo retains negative-type data. In addition, it may be seen that the pages, which respectively corresponds to the even bit line BLe and the odd bit line BLo of the word line WL7, do not retain data. As described above, when reading out data of a read target page, for example, the type of the page is confirmed by 4-bit data.

In addition, the number of bits for storage of the type information may be arbitrarily set. In addition, here, in a case of indicating the positive type, the "Ap" level is written, but "Bp" level or the "Cp" level may be written as long as the level is a threshold value capable of being distinguished from the "E" level. Similarly, in a case of indicating the negative type, the "An" level is written, but "Bn" level or the "Cn" level may be written. In addition, here, when all of the four bits indicate the "Ap" level, that is, all of the four bits are greater than AVHp, it is determined as the positive type. However, even when at least one of the four bits indicates "Ap", it may be determined as the positive type, and the number of bits necessary for determination as the positive type may be arbitrarily set. In addition, this is also true of a case of determination as the negative type.

Subsequently, description will be made with reference to FIG. 24. When data of a read page is the positive type (Yes in step S135), the sequencer 121 transmits data and type information to the controller 200 (step S136).

When the data of the read page is not the positive type (No in step S135), the sequencer 121 performs processes different from each other between a case of receiving type information of the positive type from the controller 200 and in a case of not receiving the type information.

When the type information received from the controller 200 indicates that the page is the positive type (Yes in step S137), the sequencer 121 notifies the controller 200 of a reading error (step S141). That is, the sequencer 121 determines that normal reading cannot be performed because actual data is not the positive type, and the sequencer 121 notifies the controller 200 of the determination result as the reading error.

When the type information is not received from the controller 200 (Yes in step S137), the sequencer 121 performs the P-channel reading (step S138). That is, the sequencer 121 preferentially performs the N-channel reading. However, since the data is not the positive type, the sequencer 121 regards the data as the negative type and performs the P-channel reading.

After executing P-channel reading, the sequencer 121 confirms whether or not the read data is the negative type (step S139). Specifically, as is the case with the P-channel reading, for example, the sequencer 121 confirms data which is written to an arbitrary region in a page, or the register 123 and which indicates type information to determine whether or not the read data is the negative type.

When data of the read page is the negative type (Yes in step S140), the sequencer 121 transmits the data and type information to the controller 200 (step S142).

When the data of the read page is not the negative type (No in step S140), the sequencer 121 determines that it fails in reading, and notifies the controller 200 the failure (step S141). That is, in a case where information indicating the negative type is received from the controller 200, but actual data is not the negative type, or in a case where type information is not received from the controller 200, and it is determined that actual data is neither the positive type nor the negative type, the sequencer 121 notifies the controller 200 of the situation as a reading error.

1.3.2 With Respect to Voltage During Reading

Next, a voltage relationship between wirings during reading data will be described.

1.3.2.1 With Respect to Voltage of N-Channel Reading

Figure 26:
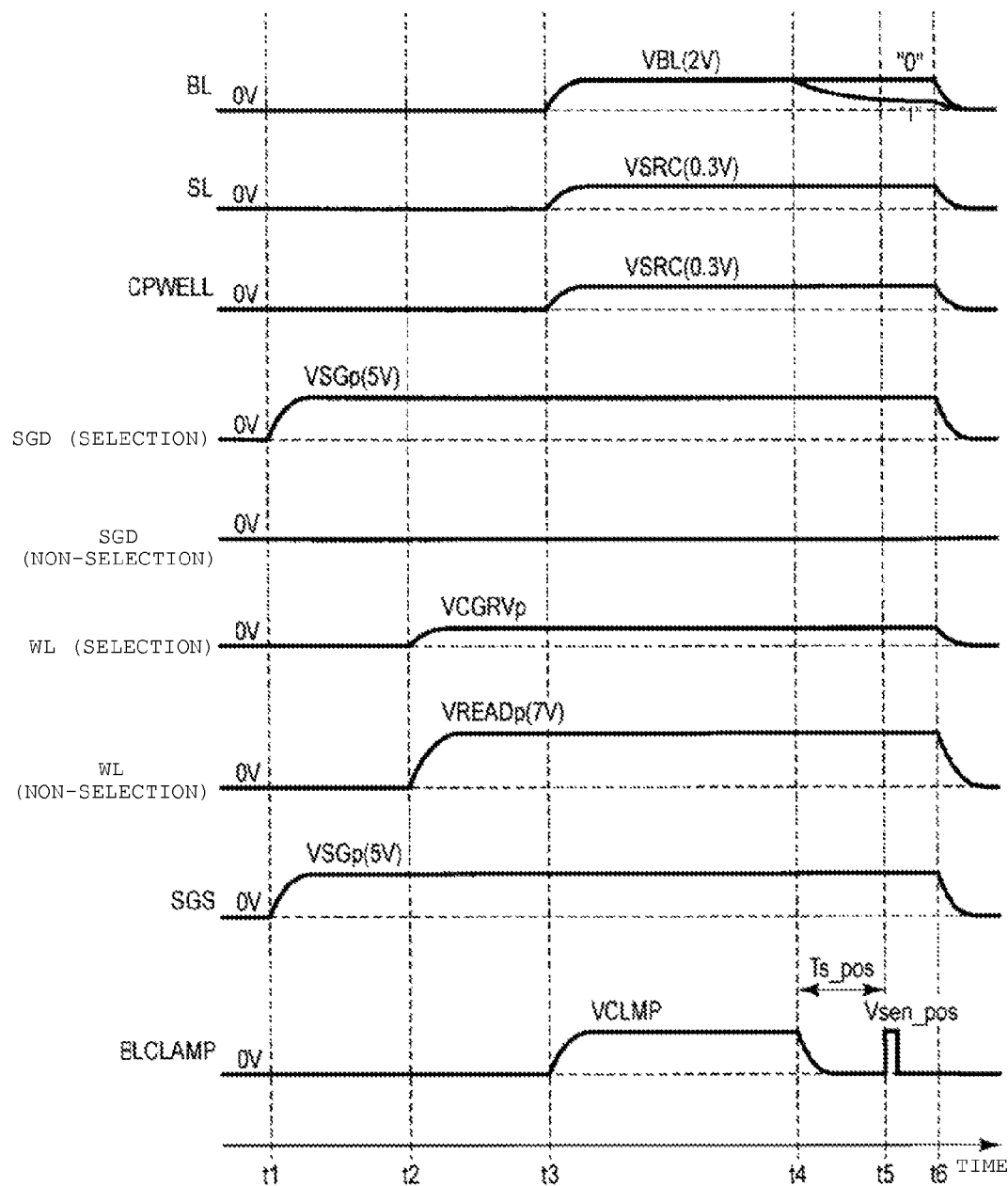
FIG. 26 is a timing chart illustrating a potential of each wiring during N-channel reading according to the first embodiment.

First, a voltage relationship between respective wirings during N-channel reading will be described. FIG. 26 is a timing chart illustrating a potential of each wiring during the N-channel reading. Here, a signal line BLCLAMP is a signal line that applies a signal to the gate of the transistor NMOS10 of the sense amplifier unit illustrated in FIG. 5. During reading, the sequencer 121 performs control of a pre-charge voltage that is applied to the bit line BL, and control of timing of sensing (strobing) a voltage of the bit line BL by the signal line BLCLAMP.

As illustrated in the drawing, at time t1, the row decoder 112 applies a voltage VSGp (for example, 5 V) to the selection gate lines SGD and SGS so as to turn on the selection transistors ST1 and ST2 which correspond to a selected page. VSGp is a voltage that is set to turn on the selection transistors ST1 and ST2 during the N-channel reading.

Next, at time t2, the row decoder 112 applies a voltage VCGRVp to the selected word line WL, and applies a voltage VREADp (for example, 7 V) to the non-selected word line WL. According to this, a charge is supplied to the conductive film 30 from a source line side, and thus the memory cell transistor MT operates as an N-channel transistor. The voltage VCGRVp is a voltage in accordance with read target data in the N-channel reading. The voltage VREADp is a voltage that turns on the memory cell transistor MT regardless of retention data during the N-channel reading, and a relationship of VREADp>VCGRVp is satisfied.

Next, at time t3, the sequencer 121 applies a voltage VCLMP to a signal line BLCLAMP. According to this, the sense amplifier 113 applies a pre-charge voltage VBL (for example, 2 V) to the bit line BL. VCLMP is a positive voltage applied to the transistor NMOS10 of the sense amplifier unit so as to control the pre-charge voltage of the bit line BL, and is set to be lower than VPRE illustrated in FIG. 5. In addition, VBL is a pre-charge voltage that is applied to the bit line BL during the N-channel reading. In VCLMP and VBL, a relationship of VCLMP=VBL+Vt is established. Vt is a threshold value of the transistor NMOS10.

In addition, the source line driver 114 applies a voltage VSRC (for example, 0.3 V) to the source line SL. In addition, the well driver 115 applies a voltage VSRC (for example, 0.3 V) to the well wiring CPWELL. VSRC is a voltage that is applied to the source line SL and the well wiring CPWELL during the N-channel reading. In addition, VSRC is a voltage lower than VBL. That is, the bit line BL has a potential higher than that of the source line SL. According to this, when the memory cell transistor MT that is a read target is turned on, a current flows from the bit line BL to the source line SL.

Next, at time t4, the sequencer 121 applies 0 V to the signal line BLCLAMP to turn off the NMOS10 of the sense amplifier unit. According to this, application of a voltage from the sense amplifier 113 to the bit line BL is stopped. In this case, when a threshold value of the memory cell transistor MT is higher than VCGRVp, a current does not flow from the bit line BL to the source line SL, and a potential of the bit line BL does not decrease. In contrast, when the threshold value of the memory cell transistor MT is lower than VCGRVp, a current flows from the bit line BL to the source line SL, and as a result, the potential of the bit line BL decreases.

Next, at time t5, the sequencer 121 applies a voltage Vsen_pos to the BLCLAMP. Vsen_pos is a sense voltage that is used to determine whether or not the bit line BL is discharged, or whether the memory cell transistor MT is turned on or turned off during the N-channel reading. According to this, the sense amplifier 113 senses (strobes) the voltage of the bit line BL and determines whether read data is "0" or "1". In this embodiment, a case where a memory cell transistor MT that is selected is turned on (that is, a case where the potential of the bit line BL decreases) is defined as read data="1", and a case where the memory cell transistor MT is turned off (that is, a case where the potential of the bit line BL) is retained) is defined as read data="0".

An example of an operation during the above-described determination will be briefly described. When the bit line BL is pre-charged (time t3 to t4), VPRE is charged to the capacitor C of the temporary data cache 434 illustrated in FIG. 5. In this state, the sequencer 121 applies Vsen_pos to the BLCLAMP at time t5. In this case, when a potential of the bit line BL is higher than (Vsen_pos−Vt), that is, when the memory cell transistor is turned off and the potential of the bit line BL does not decrease, the transistor NMOS10 is turned off. In addition, when the potential of the bit line BL is lower than (Vsen_pos−Vt), that is, the memory cell transistor MT is turned on and the potential of the bit line BL decreases, the transistor NMOS10 is turned on, and thus the capacitor C is discharged. The result is taken to the secondary data cache 431.

Next, at time t6, the sense amplifier 113 applies 0 V to the bit line BL, and the row decoder 112 applies 0 V to the selection gate line SGD and SGS, and all word lines WL. The source line driver 114 applies 0 V to the source line SL, and the well driver 115 applies 0 V to the well wiring CPWELL. According to this, the reading operation of data is terminated. In addition, during the time (time t1 to time t6), the row decoder 112 applies 0 V to the non-selection selection gate line SGD to turn off the selection transistor ST1. According to this, a string unit SU, which is not a target, is excluded from a target of a programming.

In addition, in FIG. 26, a voltage waveform when data reading is performed once illustrated, but the data reading is performed plural times, for example, when multi-value data is read. In this case, the processes at time t3 to time t6 are repeated, and VCGRVp is set to a different voltage for each process. According to this, it is possible to read out data having a different threshold value.

In addition, the N-channel reading may be applied to the negative pre-verification, the positive pre-verification, the verification of the positive-mode programming, and the verification of the negative-mode programming which are illustrated in FIGS. 10 and 11.

1.3.2.2 With Respect to Voltage of P-Channel Reading

Figure 27:
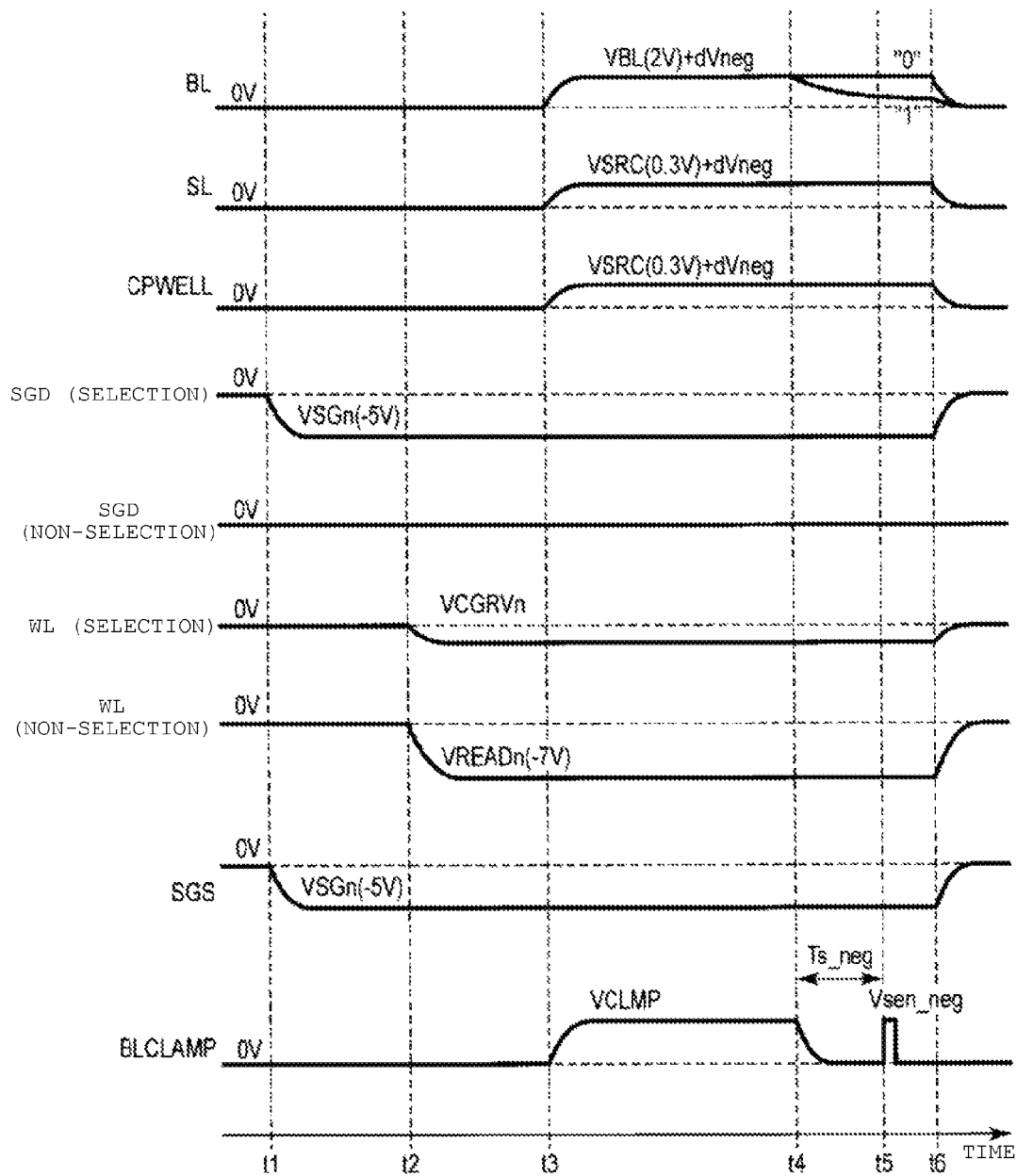
FIG. 27 is a timing chart illustrating a potential of each wiring during P-channel reading according to the first embodiment.

Next, a voltage relationship between respective wirings during the P-channel reading will be described. FIG. 27 is a timing chart illustrating a potential of each wiring during the P-channel reading.

As illustrated in the drawing, at time t1, the row decoder 112 applies a voltage VSGn (for example, −5 V) to the selection gate lines SGD and SGS so as to turn on the selection transistors ST1 and ST2 which correspond to a selected page. VSGn is a voltage that is set to turn on the selection transistors ST1 and ST2 during the P-channel reading.

Next, at time t2, the row decoder 112 applies a voltage VCGRVn to the selected word line WL, and applies a voltage VREADn (for example, −7 V) to the non-selected word line WL. According to this, a hole supplied to the conductive film 30 from a bit line side, and thus the memory cell transistor MT operates as a P-channel transistor. The voltage VCGRVn is a voltage in accordance with read target data during the P-channel reading. The voltage VREADn is a voltage that turns on the memory cell transistor MT regardless of retention data during the P-channel reading, and a relationship of VREADn<VCGRVn is satisfied.

Next, at time t3, the sequencer 121 applies VCLMP to the signal line BLCLAMP of the sense amplifier unit. According to this, the sense amplifier 113 applies VBL (for example, 2 V)+dVneg to the bit line BL. dVneg is a correction value of a voltage during reading data in the P-channel reading, and may be set in accordance with a difference in a magnitude of the threshold voltage between a case where the memory cell transistor MT operates as the N-channel transistor and a case where the memory cell transistor MT operates as the P-channel transistor. For example, a threshold voltage in the case of operating as the N-channel transistor is set to Vtn (>0 V), and a threshold voltage in the case of operating as the P-channel transistor is set to Vtp (<0 V). In this case, a relationship of |Vtn|<|Vtp| is satisfied. Accordingly, a relationship of dVneg=Vtp+Vtn (<0 V) is satisfied.

In addition, the source line driver 114 applies VSRC (for example, 0.3 V)+dVneg to the source line. In addition, the well driver 115 applies VSRC (for example, 0.3 V)+dVneg to the well wiring CPWELL. A value of VSRC+dVneg is a voltage that is applied to the source line SL and the well wiring CPWELL during the N-channel reading. According to this, when the memory cell transistor MT that is a read target is turned on, a current flows from the bit line BL to the source line SL.

Next, at time t4 to time t6, as is the case with time t4 to time t6 which are illustrated in FIG. 26, the sense amplifier 113 senses (strobes) a voltage of the bit line BL to determine whether the voltage is "0" or "1".

Next, at time t6, the sense amplifier 113 applies 0 V to the bit line BL, and the row decoder 112 applies 0 V to the selection gate line SGD and SGS, and all word lines WL. The source line driver 114 applies 0 V to the source line, and the well driver 115 applies 0 V to the well wiring CPWELL. According to this, the reading operation of data is terminated. In addition, during the time (time t1 to time t6), the row decoder 112 applies 0 V to the non-selection selection gate line SGD to turn off the selection transistor ST1. According to this, a string unit SU, which is not a target, is excluded from a target of a programming.

In addition, even in the P-channel reading, when reading data is performed plural times, the processes at time t3 to time t6 are repeated, and VCGRVn is set to a different voltage for each process. According to this, it is possible to read out data having a different threshold value.

In addition, the above-described P-channel reading may be applied to the negative pre-verification, the positive pre-verification, the verification of the positive-mode programming, and the verification of the negative-mode programming which are illustrated in FIGS. 10 and 11.

1.4 With Respect to Effect According to this Embodiment

According to the configuration according to this embodiment, erasing data is not necessary during rewriting data, and thus it is possible to improve a processing speed of a memory system. This effect will be described below.

In the NAND type flash memory, when going to write (rewrite) data with respect to the memory cell transistor MT to which data is written, it is necessary to execute the writing operation after erasing data once. Accordingly, a process becomes complicated, and thus a processing time becomes long. Accordingly, for example, in a planar NAND type flash memory in which memory cell transistors MT are two-dimensionally formed on a semiconductor substrate, typically, rewriting of data is not performed.

In contrast, in the configuration according to this embodiment, the NAND string 116 has a dual-channel structure, and thus two programmings of the positive-mode and the negative-mode may be executed. Accordingly, it is possible to write (rewrite) data to the memory cell transistor MT to which data is written in an opposite threshold value distribution (the negative type in a case of the positive type, or the positive type in a case of the negative type). Accordingly, erasing of data is not necessary, and thus it is possible to improve a processing speed of the memory system.

In addition, in a typical planar NAND type flash memory, since erasing is performed for each block unit, when erasing data, it is necessary to save (move) effective data in an erase target block to a different block. However, in this embodiment, easing is not necessary, and thus saving of data is not necessary. Accordingly, in this embodiment, since it is not necessary for a block to be secured for saving of data, it is possible to increase a memory region that may be used for writing. In addition, garbage collection in the related art is not necessary, and thus it is possible to reduce a load on the controller.

Particularly, this effect is significantly exhibited in a three-dimensional NAND type flash memory having a block size that is significantly larger than that of the planar NAND type flash memory.

2. Second Embodiment

Next, a memory system according to a second embodiment will be described. This embodiment relates an operation of the controller 200 that controls the NAND type flash memory 100 described in the first embodiment. Hereinafter, a difference from the first embodiment will be described.

2.1 With Respect to Programming

2.1.1 With Respect to Operation of Controller 200 During Programming

Figure 28:
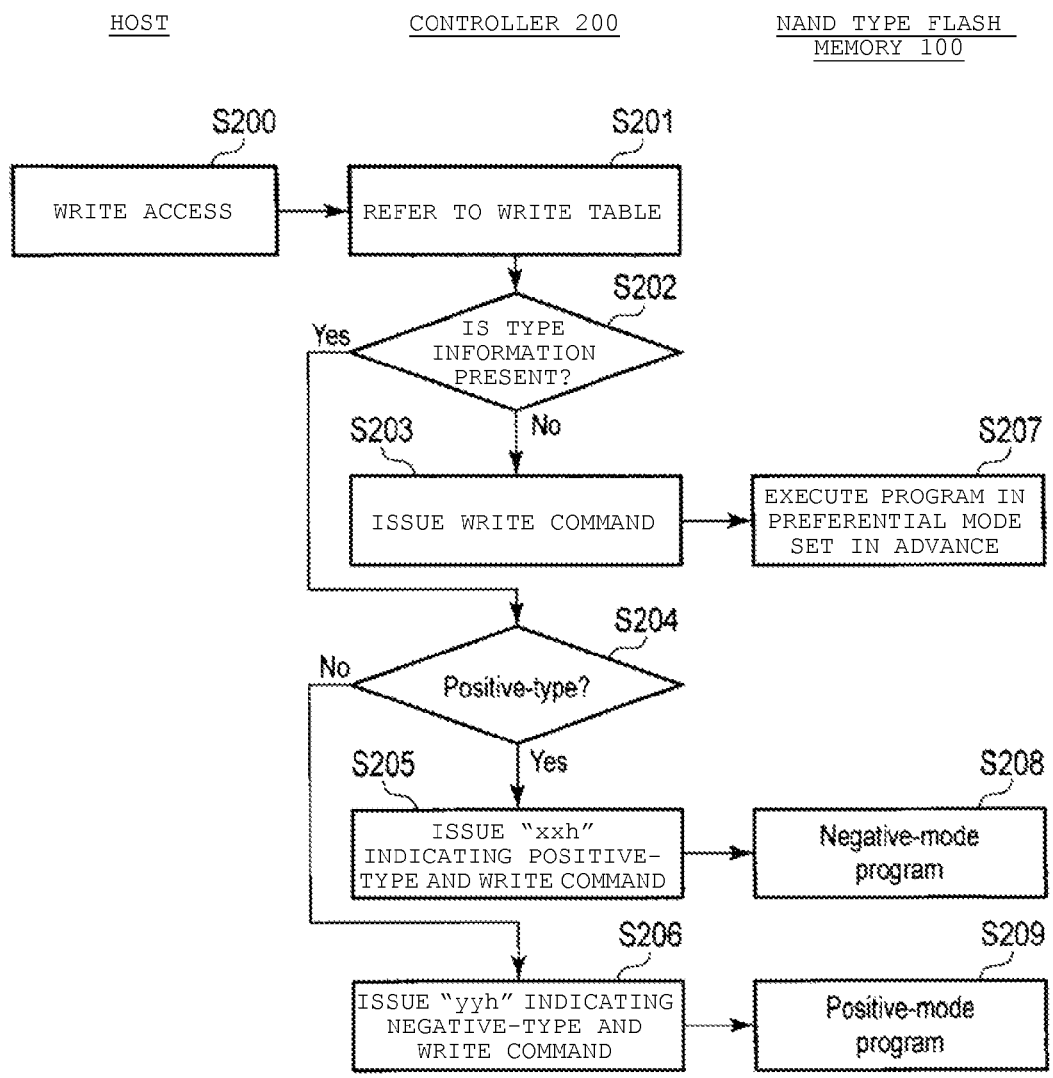
FIG. 28 is a flowchart illustrating an operation of a controller during a programming operation according to a second embodiment.

FIG. 28 is a flowchart illustrating an operation of the controller 200 during programming.

As illustrated in the drawing, first, the host interface circuit 210 of the controller 200 is subjected to data write access from the host apparatus (step S200).

The CPU 230 of the controller 200 refers to the write situation table in response to the write command. For example, when receiving a command corresponding to rewriting of data that has been written already to an address, the CPU 230 selects a page that corresponds to the address. On the other hand, when not receiving the command corresponding to the rewriting, the CPU 230 selects a page, which retains invalid data and in which the number of cumulative times of programmings is small, based on a reference result (step S201). For example, in an example of the write situation table illustrated in FIG. 9, the pages addresses 1, 2, 4, and 6 retain invalid data. In addition, in the page address 4, the number of cumulative times of programmings is the smallest. Therefore, the CPU 230 selects the page address 4 as a programming target.

Next, the CPU 230 of the controller 200 confirms whether or not type information of the selected page is present in the write situation table (step S202). For example, a situation in which the type information is not present corresponds to a stage during shipment, a stage after data is erased, and a case where the type information is not normally written to the write situation table due to a problem.

When the type information is not present (No in step S202), the CPU 230 of the controller 200 issues a write command (step S203). In addition, the NAND interface circuit 250 transmits the write command to the NAND type flash memory 100. In addition, the NAND type flash memory 100 executes a programming mode that is set in advance to be preferentially performed, for example, a positive-mode programming (step S207).

When the type information is present (Yes in step S202), the CPU 230 of the controller 200 confirms whether or not the selected page is the positive type based on the type information (step S204).

When the page type is the positive type (Yes in step S204), the CPU 230 of the controller 200 issues a command, for example, "xxh" indicating the positive type, and a write command (step S205). The NAND interface circuit 250 transmits the command xxh and the write command to the NAND type flash memory 100. In addition, the NAND type flash memory 100 executes a programming of the negative-mode in response to reception of the command "xxh" (step S208).

When the page type is the negative type (No in step S204), the CPU 230 issues a command, for example, "yyh" indicating the negative type, and a write command (step S206). The NAND interface circuit 250 transmits the command "yyh" and the write command to the NAND type flash memory 100. In addition, the NAND type flash memory 100 executes the positive-mode programming in response to reception of the command "yyh" (step S209).

2.1.2 With Respect to Command Sequence of Writing Operation

Figure 29:
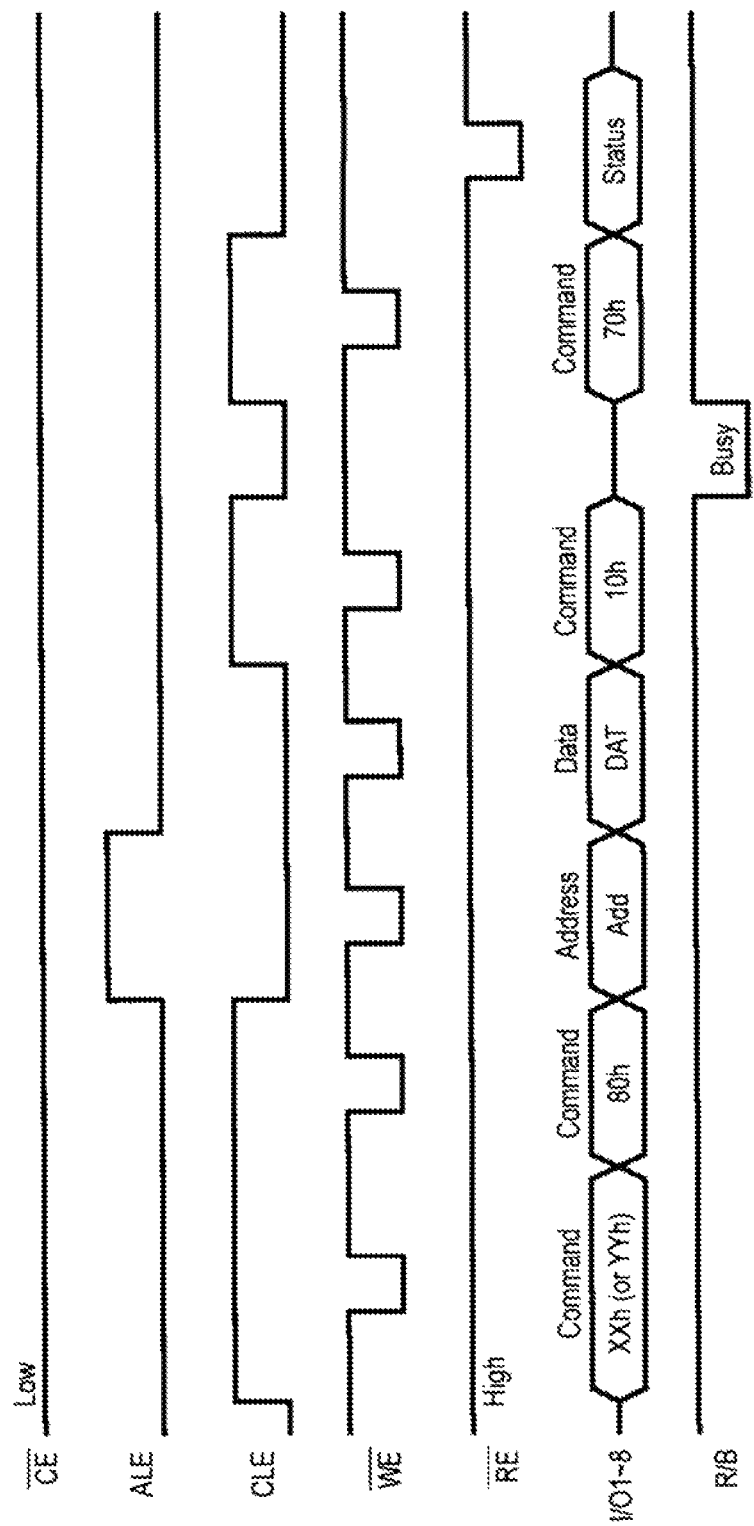
FIG. 29 is a timing chart of various signals during a programming operation according to the second embodiment.

Next, description will be made with respect to a sequence of a signal that is transmitted to and received from between the controller 200 and the NAND type flash memory 100 during a programming. FIG. 29 is a timing chart of various signals during the programming.

The CPU 230 of the controller 200 transmits a chip enable signal /CE, an address latch enable signal ALE, a command latch enable signal CLE, a write enable signal /WE, and a read enable signal /RE from the NAND interface circuit 250 to the NAND type flash memory 100. In addition, the NAND type flash memory 100 transmits a ready/busy signal R/B to the NAND interface circuit 250. Input and output signals I/O1 to I/O8 are pieces of data such as 8-bit data which is transmitted to and received from between the NAND interface circuit 250 of the controller 200 and the NAND type flash memory 100.

The chip enable signal /CE is a signal to make the NAND type flash memory 100 enable, and is asserted in a low level. The address latch enable signal ALE is a signal indicating that the input and output signals I/O1 to I/O8 are addresses, and is asserted in a high level. The command latch enable signal CLE is a signal that the input and output signals I/O1 to I/O8 are commands and is asserted in a high level. The write enable signal /WE is a signal that is necessary to write each piece of data to the NAND type flash memory 100, and /WE is asserted in a low level when the CPU 230 issues a command, an address, data, and the like. Accordingly, when /WE is toggles, a signal is taken to the NAND type flash memory 100. The read enable signal /RE is a signal that is necessary when the CPU 230 reads out each piece of data from the NAND type flash memory 100 and is asserted in a low level. The ready/busy signal R/B is a signal indicating whether or not the NAND type flash memory 100 is in a busy state (whether or not the NAND type flash memory 100 is in a state capable of receiving a command), and becomes a low level in a busy state.

As illustrated in the drawing, first, the CPU 230 issues the command "xxh" or "yyh" which indicates the page type information, and asserts CLE ("H" level). In addition, when the command indicating the page type information is not issued, this step is omitted.

Next, the CPU 230 issues a command "80h" indicating notification of programming execution, and asserts CLE ("H" level).

Next, the CPU 230 issues address data "Add" and asserts ALE ("H" level). However, in the example in FIG. 29, the address data is set to data of one cycle, but the address data may be set to data of a plurality of cycles so as to transmit a column address, a page address, and the like.

Subsequently, the CPU 230 outputs programming data "DAT". During the output, ALE and CLE are negated ("L" level). In addition, here, the write data is set to one cycle, but a plurality of cycles are also possible.

In addition, the CPU 230 issues a programming command "10h", and asserts CLE.

The commands, the address, and the data are stored, for example, in a register 123 of the NAND type flash memory 100.

The NAND type flash memory 100 initiates a programming of the data "DAT" in response to a command "10h", and becomes in a busy state (R/B="L").

When the programming in the NAND type flash memory 100 is completed, R/B returns to the "H" level. Then, the CPU 230 of the controller 200 issues a status read command "70h", and reads the data type information and status information, which indicates whether or not the programming succeeds, form the register 123.

The CPU 230 of the controller 200 updates the write situation table based on the type information read out from the NAND type flash memory 100.

2.2 With Respect to Reading

2.2.1 With Respect to Operation of Controller 200 During Reading

Figure 30:
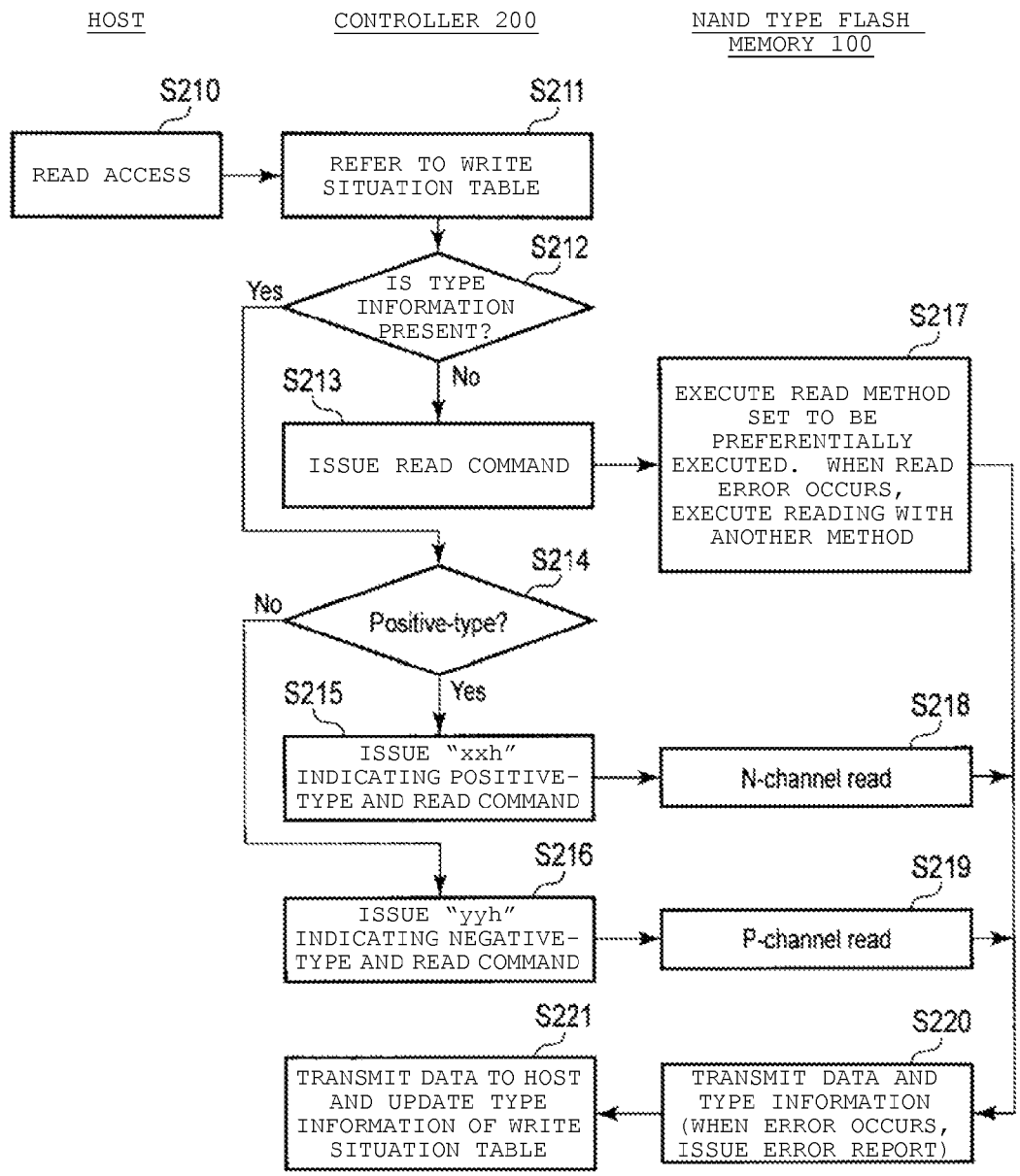
FIG. 30 is a flowchart illustrating an operation of a controller during a reading operation according to the second embodiment.

FIG. 30 is a flowchart illustrating an operation of the controller 200 during reading.

As illustrated in the drawing, first, the host interface circuit 210 of the controller 200 is subjected to read access from the host apparatus (step S210).

The CPU 230 of the controller 200 confirms whether type information of a selected page is present in the write situation table in response to the read command (step S211).

When the type information is not present in the write situation table (No in step S212), the CPU 230 of the controller 200 issues a read command (step S213). The NAND interface circuit 250 transmits the read command to the NAND type flash memory 100. In addition, the NAND type flash memory 100 executes a read mode that is set in advance to be preferentially executed, for example, the N-channel reading that is illustrated in the flow of FIG. 24 (step S217). However, when it is difficult to normally read out data in the read mode that is preferentially executed, the NAND type flash memory 100 executes another read mode, that is, the P-channel reading in the example of FIG. 24.

When the type information is present in the write situation table (Yes in step S212), the CPU 230 confirms whether or not the read target page is the positive type (step S214).

When the page type is the positive type (Yes in step S214), the CPU 230 issues a command "xxh" indicating the positive type, and a read command (step S215). The NAND interface circuit 250 transmits the command "xxh" and the read command to the NAND type flash memory 100. In addition, the NAND type flash memory 100 executes the N-channel reading in response to reception of the command "xxh" (step S218).

When a threshold value type of a page is the negative type (No in step S214), the CPU 230 issues a command "yyh" indicating the negative type, and a read command (step S216). The NAND interface circuit 250 transmits the command "yyh" and the write command to the NAND type flash memory 100. In addition, the NAND type flash memory 100 executes the P-channel reading in response to reception of the command "yyh" (step S219).

Next, when reading of data is terminated, the NAND type flash memory 100 transmits the read data and type information to the NAND interface circuit 250 of the controller 200. At this time, when reading is not normally completed, the NAND type flash memory 100 issues an error report (step S220).

Next, the CPU 230 updates the write situation table based on the type information that is received from the NAND type flash memory 100, and allows the host interface circuit 210 to transmit data to the host apparatus (step S221). According to this, the reading operation is terminated.

2.2.1 With Respect to Command Sequence of Reading Operation

Figure 31:
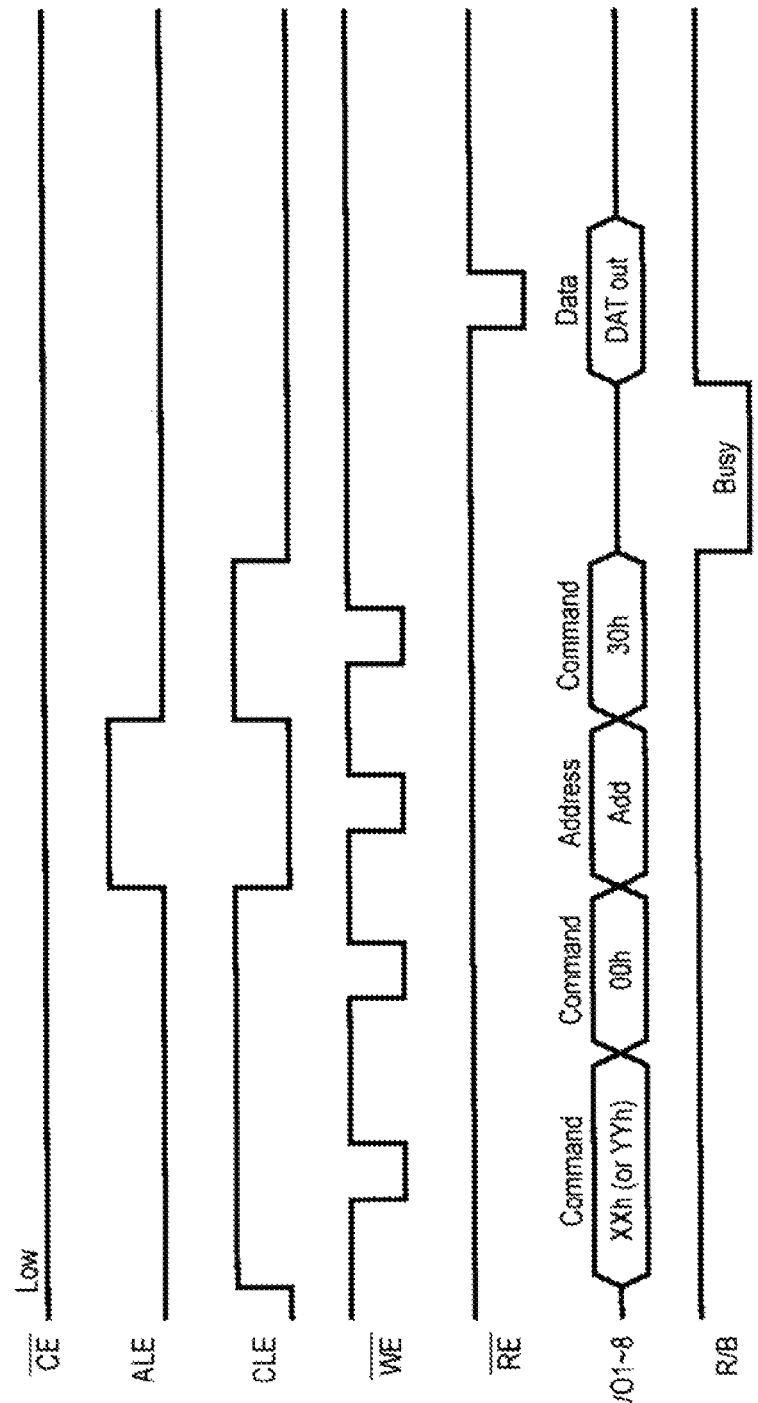
FIG. 31 is a timing chart of various signals during reading according to the second embodiment.

Next, description will be made with respect to a sequence of a signal that is transmitted to and received between the controller 200 and the NAND type flash memory 100 during reading. FIG. 31 is a timing chart of various signals during reading.

As illustrated in the drawing, the CPU 230 of the controller 200 issues the command "xxh" or "yyh" which indicates a page type, and asserts CLE ("H" level). When a command indicating the page type is not issued, this step is omitted.

Next, the CPU 230 of the controller 200 issues a command "00h" for notification of execution of reading, and asserts CLE ("H" level).

Next, the CPU 230 of the controller 200 issues address data "Add" and asserts ALE ("H" level). In addition, in the example of FIG. 31, the address data is set to data of one cycle, but the address data may be set to data of a plurality of cycles.

Next, the CPU 230 of the controller 200 issues a command "30h" for execution of reading, and asserts CLE ("H" level).

The commands and the address are stored, for example, in a register 123 of the NAND type flash memory 100.

Next, the NAND type flash memory 100 initiates reading in response to the command "30h", and it enters a busy state (R/B="L").

Then, when the NAND type flash memory 100 returns to a ready state, read data and "DAT out" indicating type information (or data indicating an error when reading fails) are transmitted from the NAND type flash memory 100 to the controller 200. In addition, in the example illustrated in FIG. 31, that data transmitted to the controller 200 is set to one cycle, but a plurality of cycles are also possible.

2.3 With Respect to Effect of this Embodiment

The writing operation and the reading operation which are described in the first embodiment may be controlled by a configuration according to this embodiment.

3. Third Embodiment

Next, a memory system according to a third embodiment will be described. In this embodiment, writing in one threshold level in the first and second embodiments is performed in combination of a plurality of programming conditions in which a variation amount of the threshold value is different in each case. Hereafter, only a difference from the first and second embodiments will be described.

3.1 With Respect to Writing Operation

First, the writing operation according to this embodiment will be schematically described. In this embodiment, in a procedure of a programming loop in which a programming and verification are repeated, in addition to an intrinsic verification level corresponding to a target threshold level, the sequencer 121 also performs verification using a voltage having an absolute value smaller than the verification level. In addition, a programming is executed by using a programming condition (hereinafter, referred to as a "first condition") in which the variation amount of the threshold value is relatively large) before reaching the level (this level is referred to as a "first verification level") of the verification using the voltage having the smaller absolute value. On the other hand, with respect to a bit reaching the first verification level, the sense amplifier 113 raises a bit line voltage to a certain extent in which non-write does not occur) to execute the programming under a condition (hereinafter, referred to as a "second condition") in which the variation amount of the threshold value is relatively small. According to this, it is possible to make a threshold value distribution width narrow.

FIG. 32 is a graph illustrating a variation in a threshold value in a case of applying a programming using the first condition and the second condition, and as an example, FIG. 32 illustrates a case of performing writing from the "E" level to the "Ap" level. However, in FIG. 32, for easy understanding of the variation amount of the threshold value due to a programming using the first condition or the second condition, an upper section indicates a case of a programming using the first condition, and a lower section indicates a case of a programming using the second condition.

As illustrated in the upper section of FIG. 32, the sequencer 121 executes a programming using the first condition with respect to a memory cell transistor MT in which a threshold value does not reach a first verification level AVLp. Specifically, the sense amplifier 113 applies a voltage (for example, 0 V), which corresponds to the first condition, to the bit line BL that is a programming target. In addition, the row decoder 112 applies a voltage VPGM to the selected word line. According to this, data is programmed. Then, the row decoder 112 applies the first verification level AVLp and a second verification level AVHp (>AVLp) to the selected word line to execute the first verification and the second verification.

In addition, the programming using the first condition is repetitively executed before the threshold value of the memory cell transistor becomes equal to or greater than the first verification level AVLp. In the example in the upper section of FIG. 32, the sequencer 121 executes the programming three times by using the first condition. Specifically, in first and second programmings, since a threshold value of all memory cell transistors MT is less than AVLp, the sequencer 121 executes a programming under the first condition with respect to the all memory cell transistors MT. That is, the sense amplifier 113 applies, for example, 0 V to all bit lines BL. In addition, from a result of the second programming, it is assumed that the threshold value of partial memory cell transistors MT becomes equal to or greater than AVLp.

In this case, with regard to a third programming, the programming is executed under the first condition with respect to a memory cell transistor MT in which a threshold value is less than AVLp, and the programming is executed under the second condition with respect to a memory cell transistor MT in which a threshold value is equal to or greater than AVLp. That is, the sense amplifier 113 applies, for example, 0 V to a bit line BL corresponding to the memory cell transistor MT in which the threshold value is less than AVLp, and applies a voltage higher than 0 V to a bit line BL corresponding to the memory cell transistor MT in which the threshold value is equal to or greater than AVLp. In addition, it is assumed that the threshold value of all of the memory cell transistors MT becomes equal to or greater than AVLp in the third programming.

The lower section of FIG. 32 illustrates an aspect of a variation in the threshold value due to subsequent programmings including a fourth programming. As illustrated in the drawing, a programming under the second condition is repeated before the threshold value of the memory cell transistor MT becomes equal to or greater than AVHp.

As illustrated in the drawing, it is assumed that the threshold value of partial memory cell transistors MT becomes equal to or greater than AVHp in the fourth programming after the third programming described in the upper section of FIG. 32.

In this case, in a fifth programming, the programming is executed under the second condition with respect to a memory cell transistor MT in which the threshold value is less than AVHp. On the other hand, a non-write voltage is applied to a bit line BL corresponding to a memory cell transistor MT in which a threshold value become equal to or greater than AVHp, and thus the programming with respect to the memory cell transistor MT is prohibited. This is also true of a sixth programming. In addition, from a result of the sixth programming, when the threshold value of all of the memory cell transistors MT becomes equal to or greater than AVHp, writing from the "E" level to the "Ap" level is completed. In addition, when the variation amount of the threshold value due to a programming using the first condition is set as $\Delta VT1$, and the variation amount of the threshold value due to a programming using the second condition is set as $\Delta VT2$, a relationship of $|\Delta VT1|>|\Delta VT2|$ is satisfied.

As described above, in the writing operation according to this embodiment, when a current threshold value of a memory cell transistor MT that is a write target greatly deviates from a target threshold level, a programming is executed by using a condition in which the variation amount of the threshold value is large (rough). In addition, when the current threshold value of the memory cell transistor MT closes to the target threshold level, a programming is executed by using a condition in which the variation amount of the threshold value is small (fine).

Next, a case of applying the writing operation of this embodiment to the first and second embodiments will be described.

Figure 33:
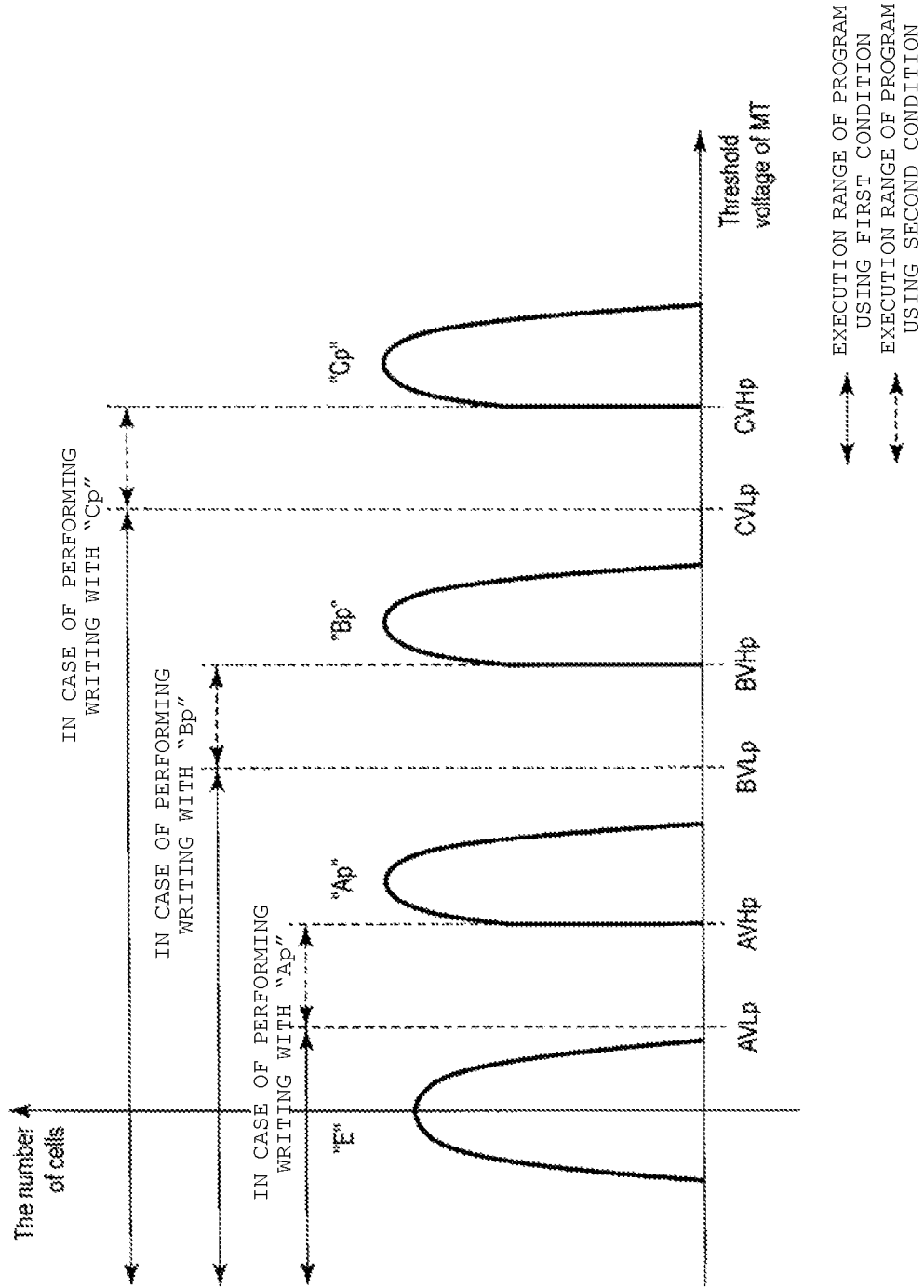
FIG. 33 is a distribution diagram illustrating positive-type threshold voltages of first verification and second verification according to a third embodiment.
Figure 34:
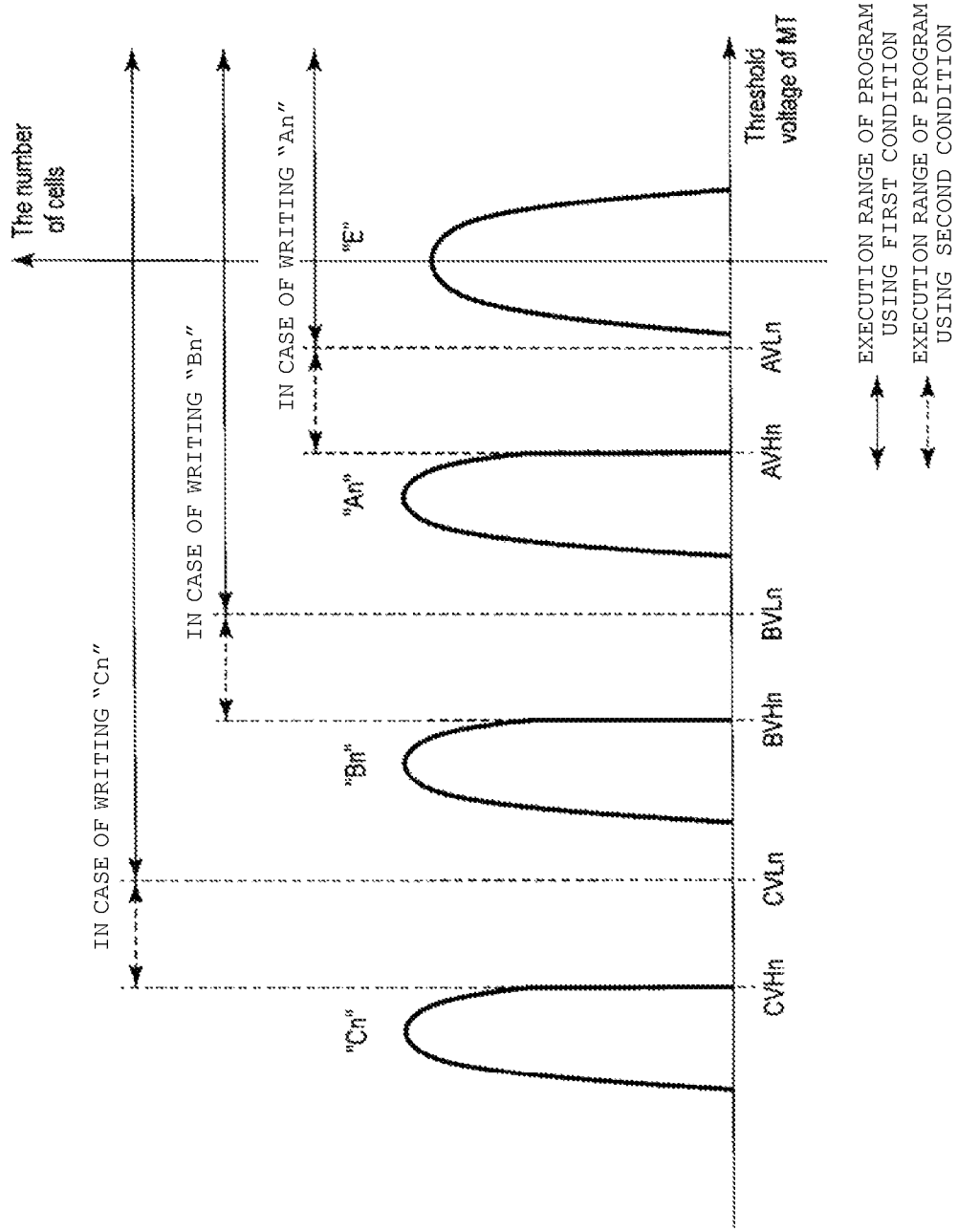
FIG. 34 is a distribution diagram illustrating negative-type threshold voltages of first verification and second verification according to the third embodiment.

FIGS. 33 and 34 are threshold value distribution illustrating an execution range of a programming using the first and second conditions in the positive type and the negative type. As illustrated in the drawings, two verification levels are prepared for each threshold level so as to execute the first verification and the second verification with respect to one threshold level.

As illustrated in FIG. 33, when AVLp, BVLp, and CVLp are in a verification level of the first verification at the "Ap" level, the "Bp" level, and the "Cp" level, and the threshold value of the memory cell transistor MT is lower than this level, a programming is executed by using the first condition. Similarly, when AVHp, BVHp, and CVHp are in a second verification level, and the threshold value of the memory cell transistor MT is equal to or greater than the first verification level and is equal to or less than the second verification level, the programming is executed by using the second condition. In addition, values of AVLp, BVLp, CVLp, AVHp, AVHp, and CVHp satisfy a relationship of 0 V<AVLp<AVHp<BVLp<BVHp<CVLp<CVHp.

In addition, as illustrated in FIG. 34, when AVLn, BVLn, and CVLn are in a verification level of the first verification at the "An" level, the "Bn" level, and the "Cn" level, and the threshold value of the memory cell transistor MT is greater than this level, a programming is executed by using the first condition. Similarly, when AVHn, BVHn, and CVHn are in a second verification level of the second verification, and the threshold value of the memory cell transistor MT is equal to or less than the first verification level and is equal to or greater than the second verification level, the programming is executed by using the second condition. In addition, voltage values of AVLn, BVLn, CVLn, AVHp, BVHp, and CVHn satisfy a relationship of 0 V>AVLn>AVHn>BVLn>BVHn>CVLn>CVHn.

Figure 35:
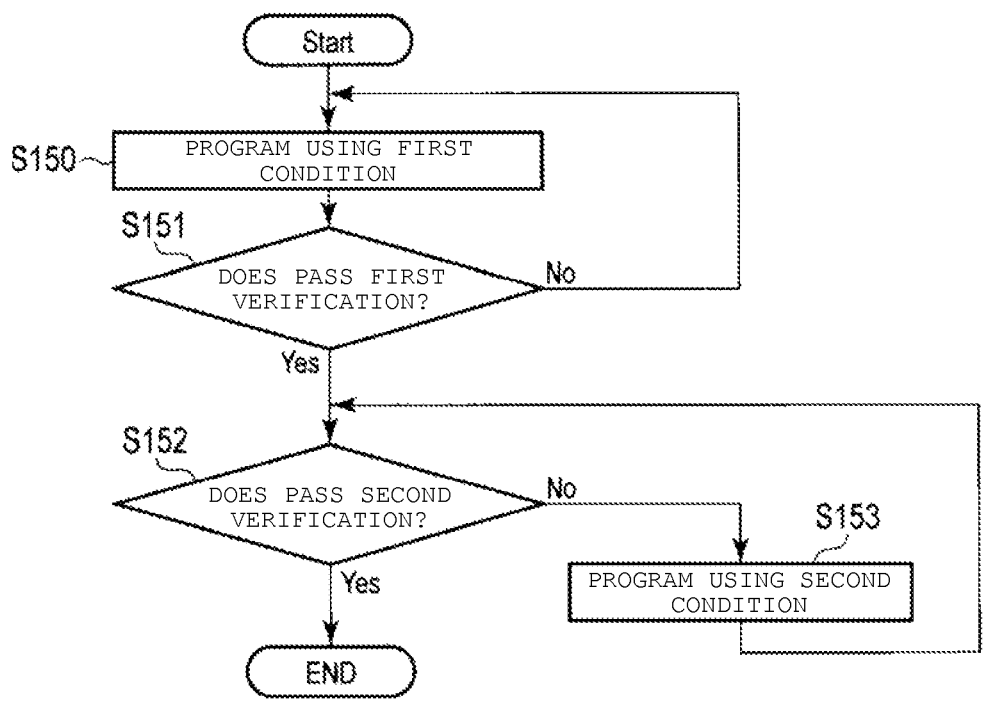
FIG. 35 is a flowchart of a programming operation according to the third embodiment.

Next, a flow of the writing operation according to this embodiment will be described with reference to FIG. 35. FIG. 35 is a flowchart during writing according to this embodiment. In this example, description will be made with respect to a case where application is made with respect to the "Ap" to "Cp" programmings (corresponding to step S114 to S116 in FIG. 11) or the "An" to "Cn" programmings (corresponding to step S127 to S129 in FIG. 11) which are illustrated in FIGS. 10 and 11.

First, the sequencer 121 executes a programming using the first condition (step S150).

Next, the sequencer 121 performs the first verification (step S151). Verification levels of the first verification are AVLp, BVLp, and CVLp in a case of the positive-mode programming, and are AVLn, BVLn, and CVLn in a case of the negative-mode programming.

When failing in the first verification (No in step S151), the sequencer 121 executes a programming by using the first condition (step S150). The sequencer 121 repetitively executes the programming using the first condition before passing the first verification or until the number of times of programming loops reaches the upper limit number of times which is set in advance.

Next, when passing the first verification (Yes in step S151), the sequencer 121 performs the second verification (step S152). Verification levels of the second verification are AVHp, BVHp, and CVHp in a case of the positive-mode programming, and are AVHn, BVHn, and CVHn in a case of the negative-mode programming.

When failing in the second verification (No in step S152), the sequencer 121 executes a programming using the second condition (step S153). The sequencer 121 repetitively executes the programming using the second condition before passing the second verification or until the number of times of programming loops reaches the upper limit number of times that is set in advance.

In addition, when passing the second verification (Yes in step S152), the programming is terminated.

3.2 With Respect to Voltage During Writing

Next, a voltage relationship between respective wirings during writing according to this embodiment will be described.

3.2.1 With Respect to Voltage of Positive-Mode Programming

Figure 36:
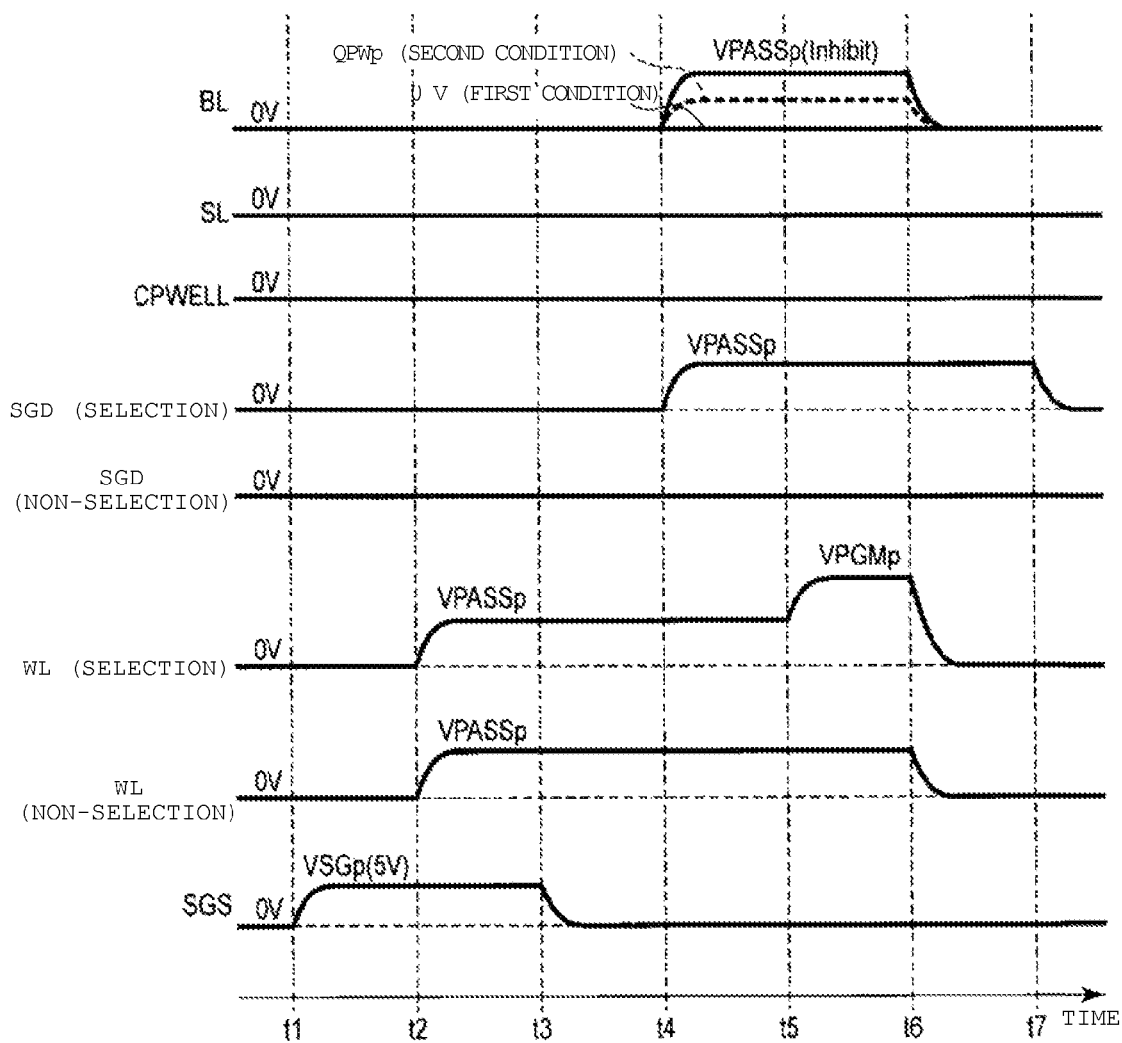
FIG. 36 is a timing chart illustrating a potential of each wiring during a positive-mode programming according to the third embodiment.

First, a voltage relationship between respective wirings in the positive-mode programming will be described. This embodiment is different from the first embodiment in that a voltage applied to the bit line BL is different in the first condition and the second condition. FIG. 36 is a timing chart illustrating a potential of each wiring during the positive-mode programming.

A difference between this timing chart and the timing chart illustrated in FIG. 18 is as follows. As illustrated in FIG. 36, between time t4 and time t6, the sense amplifier 113 applies, for example, 0 V to a bit line BL corresponding to the first condition, and a voltage QPWp to a bit line BL corresponding to the second condition. QPWp is a voltage that is applied to the bit line BL in the positive-mode programming, and is higher than a voltage (for example 0 V) of the bit line BL in the first condition. Accordingly, in the second condition, a voltage difference with VPGMp applied to the selected word line WL is smaller in comparison to the first condition. In addition, QPWp is set to a value lower than a voltage (for example, VPASSp) of the selection gate line SGD so that the selection transistor ST1 does not become an off-state. That is, voltage values of QPWp have a relationship of 0 V (first condition)<QPWp (second condition)<VPASSp (voltage of the selection gate line SGD). According to this, in a memory cell transistor MT corresponding to the bit line BL to which the second condition is applied, an amount of injection of charges due to an FN tunnel current becomes smaller in comparison to a memory cell transistor MT corresponding to the bit line BL to which the first condition is applied. That is, a variation amount of a threshold value under the second condition is smaller than that under the first condition.

3.2.2 With Respect to Voltage of Negative-Mode Programming

Figure 37:
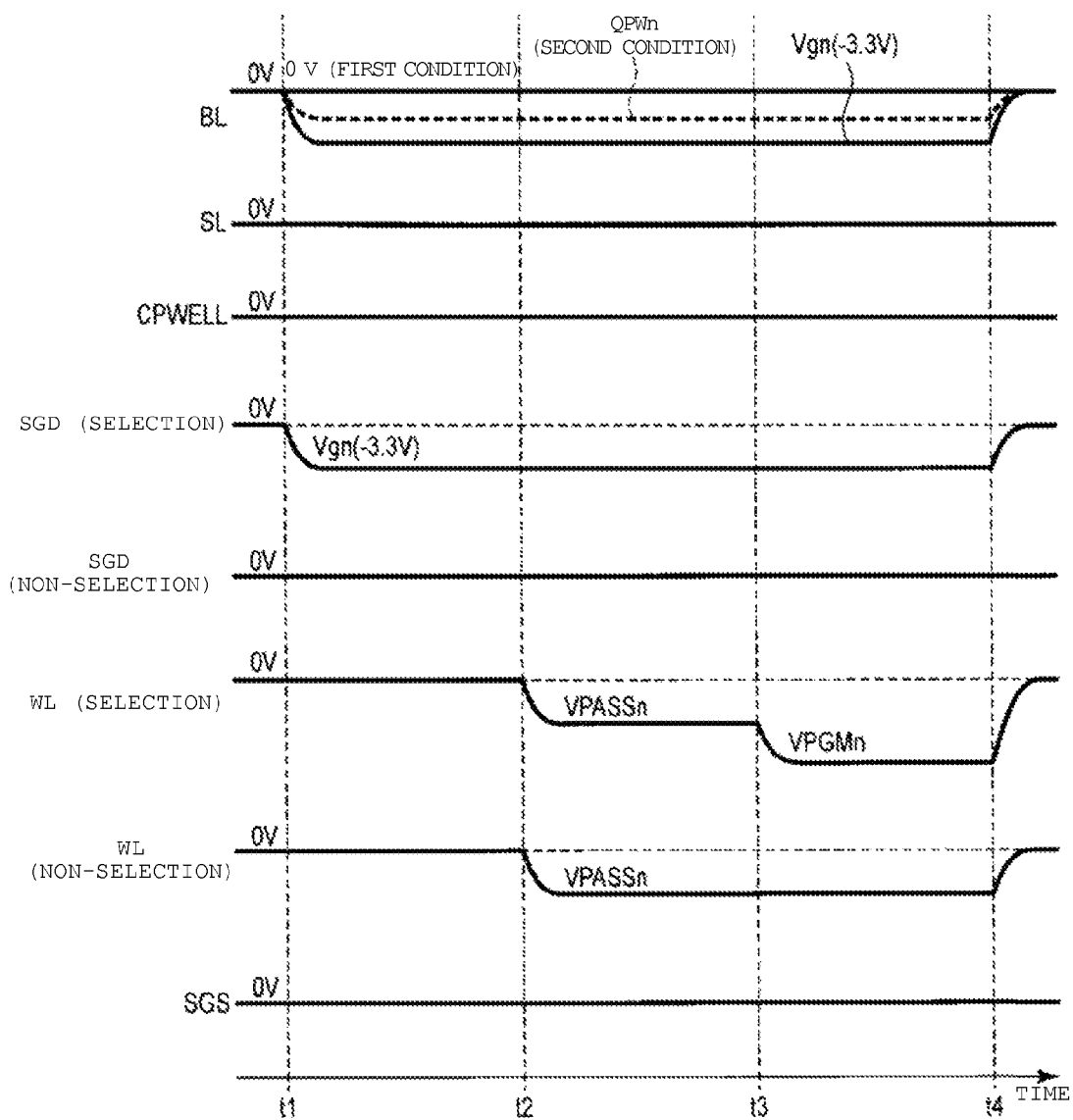
FIG. 37 is a timing chart illustrating a potential of each wiring during a negative-mode programming according to the third embodiment.

Next, a voltage relationship of respective wirings in the negative-mode programming will be described. As is the case with the positive-mode programming, a voltage that is applied to the bit line BL is different between the first condition and the second condition. FIG. 37 is a timing chart illustrating a potential of each wiring during the negative-mode programming.

A difference between this timing chart and the timing chart illustrated in FIG. 21 is as follows. As illustrated in FIG. 37, between time t1 and time t4, the sense amplifier 113 applies, for example, 0 V to a bit line BL corresponding to the first condition, and a voltage QPWn to a bit line BL corresponding to the second condition. QPWn is a voltage that is applied to the bit line BL during the negative-mode programming, and is lower than a voltage (for example 0 V) of the bit line BL in the first condition. Accordingly, in the second condition, a potential difference with VPGMn applied to the selected word line WL is smaller in comparison to the first condition. In addition, QPWn is set to a value higher than a voltage (for example, Vgn) of the selection gate line SGD in order for the selection transistor ST1 not to enter an off-state. That is, voltage values of QPWn have a relationship of 0 V (first condition)>QPWn (second condition)>Vgn (voltage of the selection gate line SGD). According to this, in a memory cell transistor MT corresponding to the bit line BL to which the second condition is applied, an amount of injection of holes due to the FN tunnel current becomes smaller in comparison to a memory cell transistor MT corresponding to the bit line BL to which the first condition is applied. That is, a variation amount of a threshold value under the second condition is smaller than that under the first condition.

3.3 With Respect to Verification

Both the N-channel reading and the P-channel reading which are described in the first embodiment are applicable to verification according to this embodiment.

For example, when the first or second verification in the positive-mode programming is performed with the N-channel reading, the timing chart illustrated in FIG. 26 is applicable. Specifically, in FIG. 26, VCGRVp that is applied to the selected word line WL is set to VCGRVp1 in the case of the first verification, and is set to VCGRVp2 in the case of the second verification.

That is, as an example, VCGRVp1 is set to verification levels AVLp, BVLp, and CVLp, and VCGRVp2 is set to verification levels AVHp, BVHp, and CVHp. In addition, VCGRVp1 and VCGRVp2 satisfy a relationship of VCGRVp1<VCGRVp2.

In addition, for example, in a case of performing the first or second verification during the negative-mode programming with the P-channel reading alone, the timing chart illustrated in FIG. 27 is applicable. Specifically, in FIG. 27, VCGRVn that is applied to the selected word line is set to VCGRVn1 in the case of the first verification, and VCGRVn2 in the case of the second verification.

That is, as an example, VCGRVn1 is set to verification levels AVLn, BVLn, and CVLn, and VCGRVn2 is set to verification levels AVHn, BVHn, and CVHn. In addition, VCGRVn1 and VCGRVn2 satisfy a relationship of VCGRVn1>VCGRVn2. As described above, the first verification and second verification are executed by applying voltages different from each other to the selected word line WL.

3.4 Effect with Respect to this Embodiment

According to this configuration according to this embodiment, the same effect as the first and second embodiments is obtained.

In addition, in the configuration according to this embodiment, the threshold value of the memory cell transistor MT greatly deviates from the target level, the programming is executed by using the first condition to make a variation in the threshold value large. According to this, it is possible to reduce the number of loop times of a programming. In addition, when the threshold value of the memory cell transistor MT closes to the target level, the programming is executed by using the second condition to make the variation in the threshold value small. As described above, it is possible to finely control the threshold value by changing the variation amount of the threshold value, and thus it is possible to perform writing with a small threshold value distribution width. Accordingly, it is possible to improve a processing speed and reliability during a programming.

In addition, whenever repeating a loop of the programming using the first condition and/or the second condition, a programming voltage may be stepped up in the case of the positive-mode programming, and the programming voltage may be stepped down in the case of the negative-mode programming.

In addition, in this example, the programming is executed by using the two conditions including the first and second condition, but the programming may be executed by using three or more conditions. In this case, the verification is also divided into the same condition numbers as that of the programmings.

In addition, here, the programming is first executed by using the first condition (step S150). However, the first verification (step S151) may be first executed, and then determination of whether executing the programming using the first condition or executing the programming using the second condition may be made.

In addition, in this example, description is given to a case of programmingming data of the "Ap" level, the "Bp" level, and "Cp" level, data in the "An" level, the "Bn" level, and the "Cn" level, but application may be made to a programming of "E" level. In a case of the "E"pos programming, the verification level of the first verification is set to Vneg1, and the verification level of the second verification is set to Vneg2. In addition, Vneg1 an Vneg2 are set to satisfy a relationship of Vneg1<Vneg2<0 V. In addition, in a case of the "E"neg programming, the verification level of the first verification is set to Vpos1, and the verification level of the second verification is set to Vpos2. In addition, Vpos1 and Vpos2 are set to satisfy a relationship of 0 V<Vneg2<Vneg1.

In addition, application may also be made to programmings of "LMp" level and "LMn" level. However, since the "LMp" level and "LMn" level pertain to temporary writing before executing the subsequent writing of the "Bp" level and the "Cp" level, or the "Bn" level and the "Cn" level, a threshold value distribution width may be broader than that of the other levels. Accordingly, the fine change of the threshold value similar to the programming using the second condition may not be performed.

4. Fourth Embodiment

Next, a memory system according to a fourth embodiment will be described. In this embodiment, as is the case with the third embodiment, writing in one threshold level in the first and second embodiment is performed in combination of a plurality of programming operations in which a variation amount of the threshold value is different in each case. Differences between this embodiment and the third embodiment are as follows. The sense amplifier 113 uses a type (hereinafter, referred to as a "current sensing type") in which a current flowing through the bit line BL is sensed, a different sense time is set for the first verification and the second verification, and then determination is independently performed. Hereinafter, a difference between the first and third embodiments will be described. In addition, in the current sensing type, a plurality of pieces of data of all of the bit lines BL may be collectively read out. Accordingly, in several string units SU of several blocks BLK, a plurality of memory cell transistors MT, which are commonly connected to several word lines WL, become a unit called "page". Accordingly, in the case of the current sensing type, the number of the memory cell transistors MT which are included in the page becomes two times in the case of the voltage sensing type.

4.1 With Respect to Sense Amplifier

Figure 38:
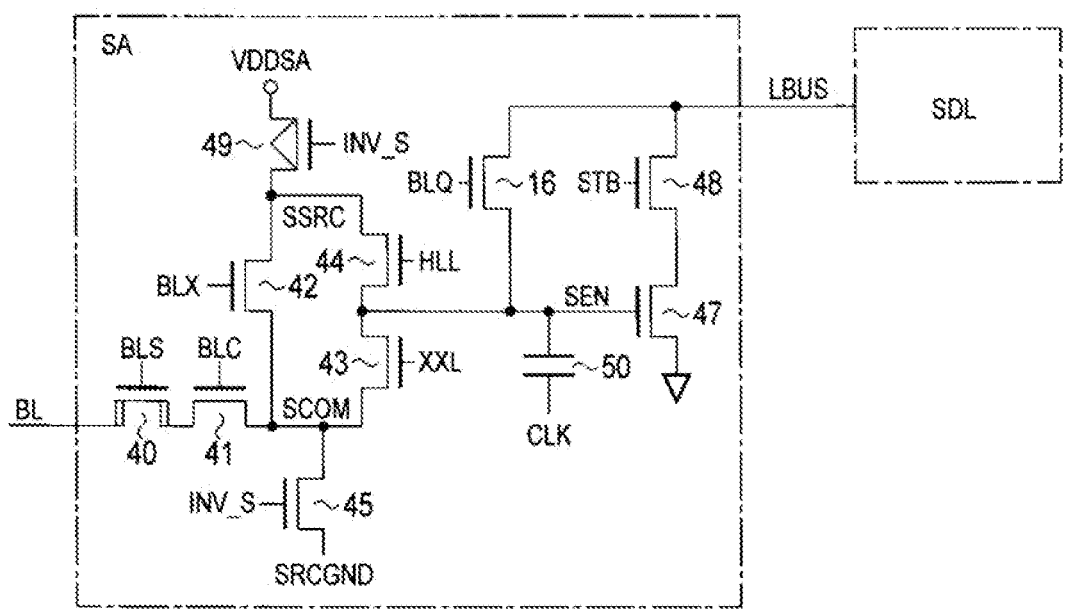
FIG. 38 is a circuit diagram of a sense amplifier according to a fourth embodiment.

A configuration of a sense amplifier 113 according to this embodiment will be described. FIG. 38 is a current sensing type sense amplifier unit. The current sensing type sense amplifier unit corresponds to each bit line. Accordingly, the sense amplifier unit is provided in the same number as the number of bit lines. In addition, the sense amplifier 113 is an assembly of the sense amplifier units illustrated in FIG. 38. As illustrated in the drawing, the sense amplifier unit includes a sense amplifier section SA and a latch circuit SDL. In addition, when an individual memory cell transistor retains data of two bits or more, two or more latch circuits are provided.

The sense amplifier section SA senses and amplifies data read out to the bit line BL, and applies a voltage to the bit line BL in accordance with data retained in the latch circuit SDL. That is, the sense amplifier section SA is a module that directly controls the bit line BL. The latch circuit SDL temporarily retains data. The latch circuit SDL retains write data that is received from the controller 200 during writing data. The latch circuit SDL retain data that is sensed and amplified by the sense amplifier section SA during reading data, and transmits the data to the controller 200.

As illustrated in FIG. 38, the sense amplifier section SA includes N-channel MOS transistors 40 to 48, a P-channel MOS transistor 49, and a capacitive element 50.

In the transistor 40, a gate is connected to a signal line BLS, and one end of a current path is connected to a corresponding bit line BL. In the transistor 41, one end of a current path is connected to the other end of the current path of the transistor 40, a gate is connected to the signal line BLC, and the other end of the current path is connected to a node SCOM. The transistor 41 clamps a corresponding bit line BL to a potential applied to the signal line BLC.

In the transistor 45, one end of a current path is connected to the node SCOM, the other end of the current path is connected to SRCGND (for example, 0 V), and a gate is connected to a node INV_S. In the transistor 42, one end of a current path is connected to the node SCOM, the other end is connected to a node SSRC, and a gate is connected to a signal line BLX. In the transistor 49, one end of a current path is connected to the node SSRC, the other end of the current path is connected to a power supply that supplies a voltage VDDSA, and a gate is connected to the node INV_S. VDDSA is a power supply voltage that is supplied to the sense amplifier unit, and is higher than a power supply voltage VDD that is supplied to the peripheral circuit 120. In the transistor 43, one end of a current path is connected to the node SCOM, the other end of the current path is connected to a node SEN, and a gate is connected to a signal line XXL. In the transistor 44, one end of a current path is connected to the node SSRC, the other end of the current path is connected to the node SEN, and a gate is connected to a signal line HLL.

In the transistor 47, one end of a current path is grounded, and a gate is connected to the node SEN. In the transistor 48, one end of a current path is connected to the other end of the current path of the transistor 47, the other end of the current path is connected a bus LBUS, and a gate is connected to a signal line STB. In the transistor 46, one end of a current path is connected to the node SEN, the other end of the current path is connected to a bus LBUS, and a gate is connected to a signal line BLQ. In the capacitive element 50, an electrode on one side is connected to the node SEN, and a clock CLK is input to an electrode on the other side.

4.1.1 With Regard to Operation of Sense Amplifier During Reading

Next, an operation of the sense amplifier section SA during reading will be described with reference to FIG. 38. In this example, for example, a threshold value of the transistors 41 to 44 is set to VthN, and a threshold value of the transistor 49 is set to VthP. In addition, control voltages of the signal lines BLC, BLX, XXL, and HLL, and the node INV_S when turning on the transistors 41 to 44 and 49 are set to V41 (for example, 0.5 V)+VthN, V42 (for example, 0.7 V)+VthN, V43 (for example, 0.9 V)+VthN, V44 (for example, VDDSA)+VthN, and V49 (for example, VDDSA)−VthP, respectively. In addition, values of V41 to V44 satisfy a relationship of V41<V42<V43<V44. In this case, VDDSA is supplied from the transistor 49 to the node SSRC.

In the above-described relationship, first, the sequencer 121 sets the signal line BLS of the transistor 40 to a "H" level, sets a potential of the signal line BLC to V41+VthN, set a potential of the signal line BLX to a V42+VthN, and sets the node INV_S to V49−VthP. That is, when the transistors 40, 41, 42, and 49 are turned on, a voltage of the bit line BL is controlled by the transistor 41, and is precharged to V41 (for example, 0.5 V) at most. In addition, the sequencer 121 sets a potential of the signal line HLL to V44 (for example, VDDSA)+VthN, and turns on the transistor 44. According to this, the capacitive element 50 is charged, and a potential of the node SEN is raised up to V44 (for example, up to substantially VDDSA).

When the selected memory cell transistor MT is turned off, a current does not flow to a corresponding bit line BL during pre-charging. Accordingly, a potential of the bit line BL becomes a voltage V41 (for example, 0.5 V) which is the maximum value capable of being taken by the bit line BL. On the other hand, when the selected memory cell transistor MT is turned on, a current flows to a corresponding bit line BL. Accordingly, the bit line BL enters a state in which a current flowing to the source line SL and a current supplied from the sense amplifier section SA are balanced. At this time, a potential of the bit line BL becomes a potential higher than that of the source line SL in a range less than V41 (for example, 0.5 V).

Then, when the signal line HLL is set to an "L" level (the transistor 44 is turned off), and the signal line XXL is set to a "H" level (the transistor 43 is turned on), if a memory cell transistor MT that is a target is in an on-state, the node SEN is discharged. Accordingly, a potential of the node SEN decreases up to V42 (for example, 0.7 V). That is, the capacitive element 50 is charged up to V44 (for example, VDDSA), and a potential of V43 (for example, 0.9 V) is higher than that of V42 (for example, 0.7 V), and thus a current flows from the capacitive element 50 to the bit line BL through the current path of the transistor 43, and thus the node SEN is discharged. In addition, when the potential of the node SEN decreases up to the same potential as V42 (for example, 0.7 V), a current flows from the power supply to the bit line BL through the current path of the transistor 42, and thus the potential of the node SEN is retained to the same potential as V42. On the other hand, when the memory cell transistor MT that is a target is in an off-state, the node SEN is not discharged, and substantially retains an initial potential.

In addition, the signal line STB is set to the "H" level, and data is strobed. That is, read data is transmitted to the latch circuit SDL. Specifically, when the potential of the node SEN is the "H" level, the transistor 47 is in an on-state, and thus the "L" level is transmitted to the latch circuit SDL through the node LBUS. On the other hand, when the potential of the node SEN decreases, the transistor 47 is in an off-state, and thus the node LBUS retains the "H" level in an initial state. Accordingly, the latch circuit SDL retains a reset state at which the "H" level is retained.

In addition, the transistor 43 is turned on at timing of discharging the node SEN during the operation, that is, timing of turning off the transistor 44, but the transistor 43 may be turned on at the same timing as the transistors 40, 41, 42, 44, and 49. In this case, a relationship of V43>V42 is satisfied, and thus the bit line BL is pre-charged in a current path from the power supply through the transistor 43.

4.2 With Respect to Wire Operation

Next, the writing operation will be described. In this embodiment, an overall flow of the writing operation and a voltage of each wiring during a programming are the same as in the third embodiment, and are similar to the description with reference to FIGS. 35 to 37.

4.2.1 With Respect to Verification

Next, the first verification and the second verification in this embodiment will be described. In this example, the sense amplifier always supplies a current to the bit line BL during a reading period, and thus the potential of the bit line BL does not vary differently from the voltage sensing type described in the third embodiment. Accordingly, in this example, the first verification and the second verification are set to the same verification level, a different sense time is set, and determination of passing and failing of the verification is performed. The sense time in this example represents time elapsed from time, at which discharging of the node SEN is initiated in a state in which the transistor 44 is turned off and the transistor 43 is turned on in the sense amplifier unit, to time at which the signal line STB is set to the "H" level and data is strobed.

Figure 39:
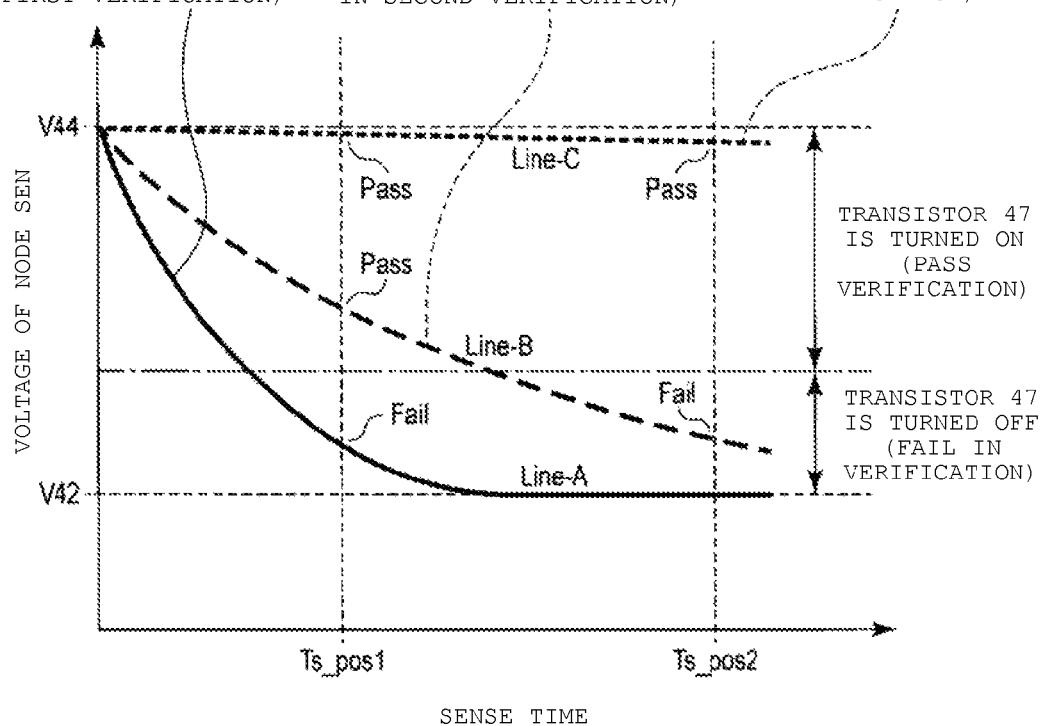
FIG. 39 is a graph illustrating a relationship between a voltage of a node SEN and a sense time during N-channel reading according to the fourth embodiment.

FIG. 39 is a graph illustrating a voltage variation of the node SEN with the passage of time during the N-channel reading and an aspect from the initiation of sensing. In this example, a sense time that is used in the first verification is set to Ts_pos1, and a sense time that is used in the second verification is set to Ts_pos2. In addition, a sense time length is set to satisfy a relationship of Ts_pos1<Ts_pos2.

As illustrated in the drawing, when the threshold value of the memory cell transistor MT is sufficiently lower than the verification level, that is, a difference between a current threshold value of the memory cell transistor and a target threshold value is large, the memory cell transistor MT enters a strong on-state ("1" state"). A voltage that is relatively higher than the threshold value is applied to a gate of the memory cell transistor MT, and thus an amount of current that flows from the bit line BL to the source line SL increases. Accordingly, a potential of the node SEN rapidly decreases (this decrease is indicated by a solid line Line-A in FIG. 39). Accordingly, when sensing a current at a sense time Ts_pos1, in the sense amplifier unit, the transistor 47 is turned off, and the "L" level is transmitted to the latch circuit SDL. As a result, the sequencer 121 determines that it fails in the first verification.

In addition, when the threshold value of the memory cell transistor MT is slightly lower than the verification level, the memory cell transistor MT enters a slight on-state ("1" state). However, a voltage close to the threshold value is supplied to the gate, and thus the amount of current that flows from the bit line BL to the source line SL is relatively small. Accordingly, the potential of the node SEN gradually decreases (this decrease is indicated by a broken line Line-B in FIG. 39). Accordingly, when sensing a current at Ts_pos1, in the sense amplifier unit, the transistor 47 is turned on, and thus the "H" level is transmitted to the latch circuit SDL. As a result, the sequencer 121 determines that it passes the first verification. However, when sensing a current at Ts_pos2, the potential of the node SEN decreases, and thus the transistor 47 is turned off. Accordingly, the sense amplifier unit transmits the "L" level to the latch circuit SDL. As a result, the sequencer 121 determines that it fails in the second verification.

In addition, when the threshold value of the memory cell transistor MT is higher than the verification level, the memory cell transistor MT is in an off-state ("0" state), and thus a current substantially does not flow from the bit line BL to the source line SL. Accordingly, the transistor 47 is retained in an on-state even at Ts_pos2 (the retention is indicated by a dotted line Line-C in FIG. 39). According to this, the sense amplifier unit transmits the "H" level to the latch circuit SDL. As a result, the sequencer 121 determines that it passes the second verification.

As described above, when the transistor 47 is in an off-state due to the potential of the node SEN after any sense time, the sequencer 121 determines that it fails in verification. When the transistor 47 is in an on-state, the sequencer 121 determines that it passes the verification.

In addition, in the P-channel reading, the first verification and the second verification may be similarly executed by setting the sense time that is used in the first verification to Ts_neg1 and by setting the sense time that is used in the second verification to Ts_neg2 to establish a relationship of Ts_neg1<Ts_neg2.

4.3 With Respect to Voltage During Verification

Next, description will be made with respect to a voltage relationship between respective wirings in a case of executing the verification during the positive-mode programming with the N-channel reading, and performing the verification during the negative-mode programming with the P-channel reading. This embodiment is different from the first embodiment in voltage setting in the sense amplifier 113. Hereinafter, only a difference from the first embodiment will be described.

Figure 40:
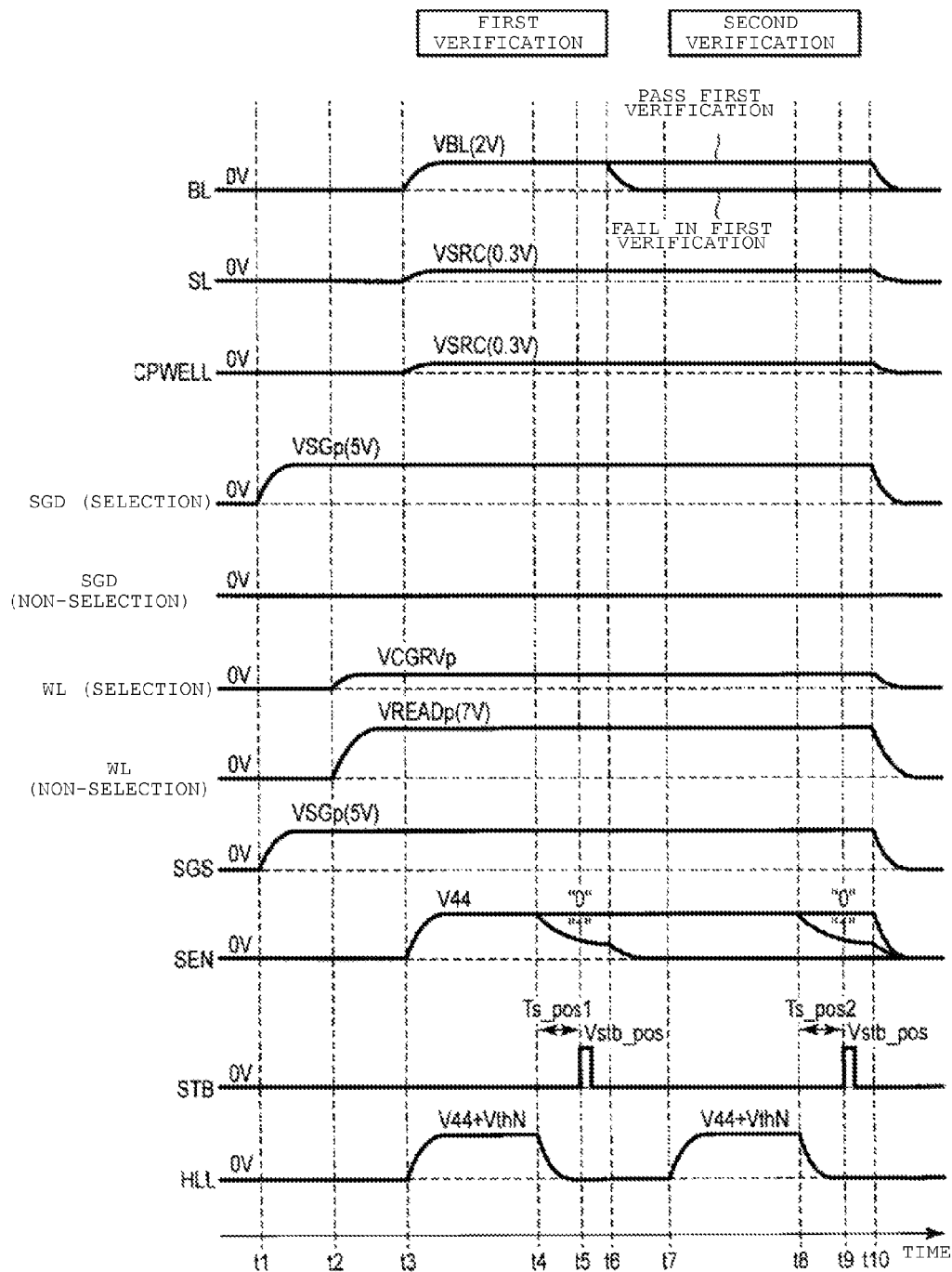
FIG. 40 is a timing chart illustrating a potential of each wiring during the N-channel reading according to the fourth embodiment.

4.3.1 With Respect to Voltage in Case of Performing Verification with N-Channel Reading First, a voltage relationship between respective wirings when performing the verification with the N-channel reading will be described. FIG. 40 is a timing chart illustrating a potential of each wiring in a case of performing the first verification and the second verification with the N-channel reading. Node SEN, signal line STB, and signal line HHL represent potentials of wirings in the sense amplifier unit illustrated in FIG. 38. The sequencer 121 performs control of timing of sensing a potential of the node SEN, that is, a current that flows from the bit line BL to the source line SL by using the signal line STB. In addition, the sequencer 121 performs control of timing of charging the capacitive element 50, that is, charging to the node SEN by using the signal line HHL.

As illustrated in the drawing, voltages that are applied at time t1 to t3 to the bit line BL, the source line SL, the well wiring CPWELL, the selection gate lines SGD and SGS, the selected word line WL, and the non-selected word line WL are the same as the voltages at time t1 to t3 which are illustrated in FIG. 26.

In this state, when the memory cell transistor MT is in an off-state ("0" state), a current does not flow from the bit line BL to a source line side, and thus a potential of the bit line BL becomes VBL (for example, 2 V). In addition, when the memory cell transistor MT is in an on-state ("1" state), as described above, a current flows from the bit line BL to the source line side, and thus the potential of the bit line BL becomes equal to or less than VBL (for example, 2V).

In addition, at time t3, the sequencer 121 applies V44 (for example, VDDSA)+VthN to the signal line HHL to charge the node SEN and the capacitive element 50 up to V44 (for example, VDDSA).

Next, at time t4, the sequencer 121 applies 0 V to the signal line HLL to turn off the transistor 44 of the sense amplifier unit. When the memory cell transistor MT is in an off-state ("0" state), a current does not flow from the bit line BL to a source line side, and thus the potential of the node SEN substantially retain V44 (for example, VDDSA). On the other hand, when the memory cell transistor MT is in an on-state ("1" state), a current flows from the bit line BL to the source line SL, and thus the node SEN is discharged and decreases to V42.

Next, at time t5, the sequencer 121 applies Vstb_pos to the signal line STB. Vstb_pos is a positive voltage that is set to turn on the transistor 48 of the sense amplifier unit during the N-channel reading. According to this, the sense amplifier 113 sense (strobes) a current of the bit line BL. That is, the sequencer 121 performs discharging of the node SEN between time t4 and t5 (sense time Ts_pos1) and performs determination of the first verification according to whether the transistor 47 of the sense amplifier unit is in an on-state or an off-state.

Next, at time t6, the sequencer 121 applies 0 V to the bit line BL that fails in the first verification. That is, the sequencer sets the signal line BLX illustrated in FIG. 38 to the "L" level. According to this, the node SEN is also discharged up to 0 V.

Next, as is the case with time t3 to time t5, at time t7 to time t9, the second verification is performed with respect to a memory cell transistor MT that passes the first verification.

Next, at time t10, the row decoder 112 applies 0 V to the selection gate lines SGD and SGS, and the word line WL. In addition, the sense amplifier 113 applies 0 V to all bit lines. The source line driver 114 applies 0 V to the source line SL. In addition, the well driver 115 applies 0 V to the well wiring CPWELL. According to this, the first verification and the second verification are terminated.

Figure 41:
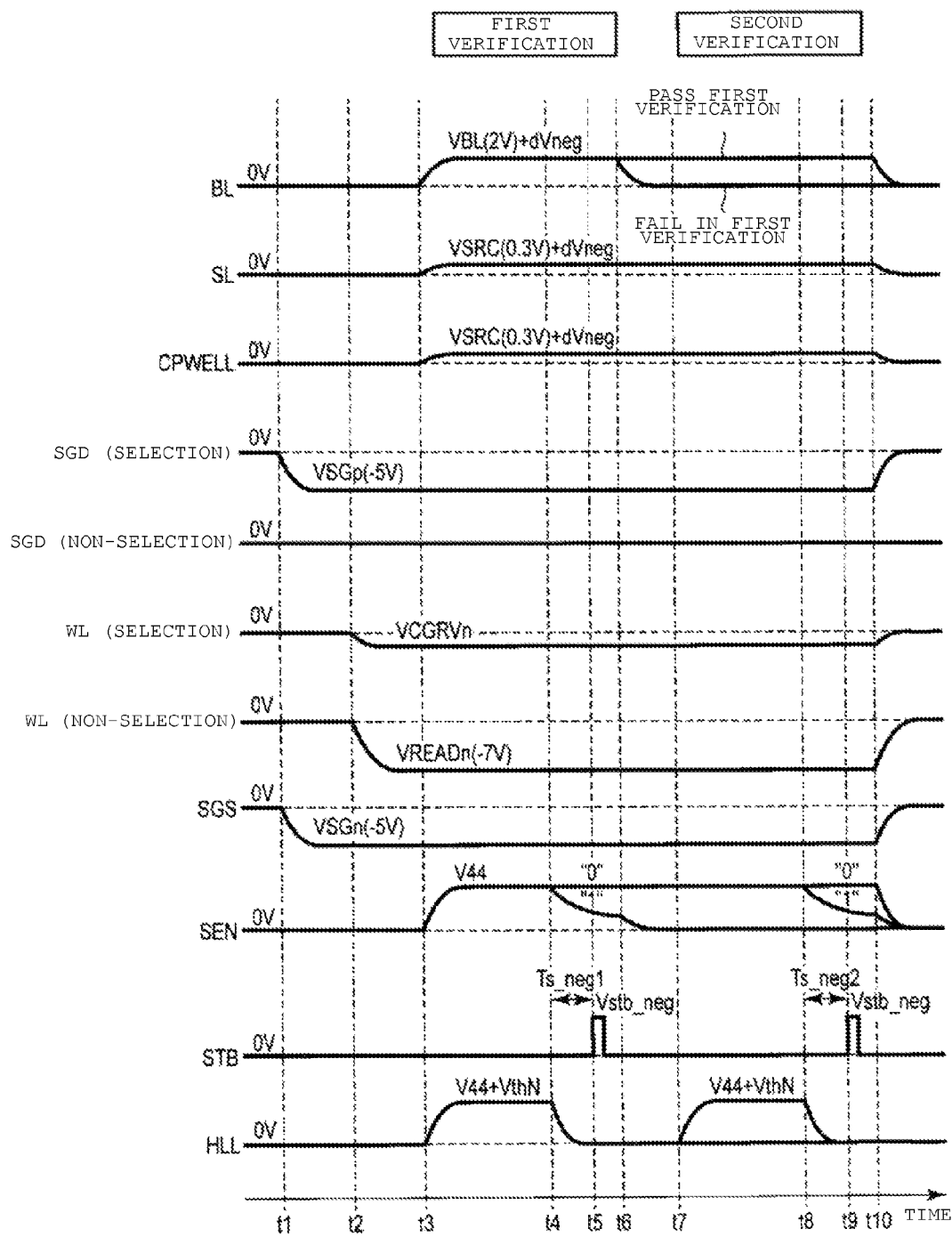
FIG. 41 is a timing chart illustrating a potential of each wiring during P-channel reading according to the fourth embodiment.

4.3.2 With Respect to Voltage in Case of Performing Verification with P-Channel Reading Next, description will be made with respect to a voltage relationship between respective wirings in a case of performing the verification with the P-channel reading. FIG. 41 is a timing chart illustrating a potential of each wiring when performing the first verification and the second verification with the P-channel reading.

As illustrated in the drawing, respective voltages of the bit line BL, and the node SEN, and the signal lines STB and HHL in the sense amplifier unit are the same as the voltages illustrated in FIG. 40. In addition, voltages that are applied to the source line SL, the well wiring CPWELL, the selection gate lines SGD and SGS, and the word line WL are the same as the voltages illustrated in FIG. 27.

In this state, the sequencer 121 applies Vstb_neg to the signal line STB at time t5 and time t9. Vstb_neg is a voltage that is set to turn on the transistor 48 of the sense amplifier unit during the P-channel reading. According to this, the sense amplifier 113 senses (strobes) a current of the bit line BL and executes the first verification and the second verification.

4.4 Effect According to this Embodiment

In the configuration according to this embodiment, the same effect as in the first to third embodiments is obtained.

In addition, in the configuration according to this embodiment, the current sensing type sense amplifier may be applied, or the first verification and the second verification may be executed by changing the sense time. Accordingly, even in the current sensing type sense amplifier, fine control of the threshold value is possible, and thus it is possible to perform writing with a small threshold value distribution width.

In addition, in the configuration according to this embodiment, the second verification may be executed by applying 0 V to a bit line BL corresponding to a memory cell transistor MT that fails in the first verification. According to this, in the second verification, it is possible to reduce a current that flows from the bit line BL to the source line SL, and thus a voltage variation on a source line side is suppressed. As a result, reading accuracy may be improved.

In addition, in this example, description is given to a case of continuously executing the first verification and the second verification, but only either the first verification or the second verification may be executed. For example, as described above in FIG. 35, in a case of failing in the first verification in step S151, it is not necessary for the second verification to be executed. In addition, in step S152, in a case of failing in the second verification, only the second verification may be executed. In this manner, when executing only the necessary verification, it is possible to shorten a write time.

In addition, in this example, a programming of two stages including first and second stage is performed, but a programming of three or more stages may be executed. In this case, the sense time is divided in the same stages as that of the programmings.

5. Fifth Embodiment

Next, a memory system according to a fifth embodiment will be described. In this embodiment, the programming of the "E" level and the programming of the "LM" level, which have a different variation amount of the threshold value, in the first to fourth embodiments are executed with one programming loop. Hereinafter, only a difference from the first to fourth embodiments will be described.

5.1 With Respect to Writing Operation of Data

A writing operation of data according to this embodiment will be described.

5.1.1 With Respect to Overall Flow of Writing Operation

Figure 42:
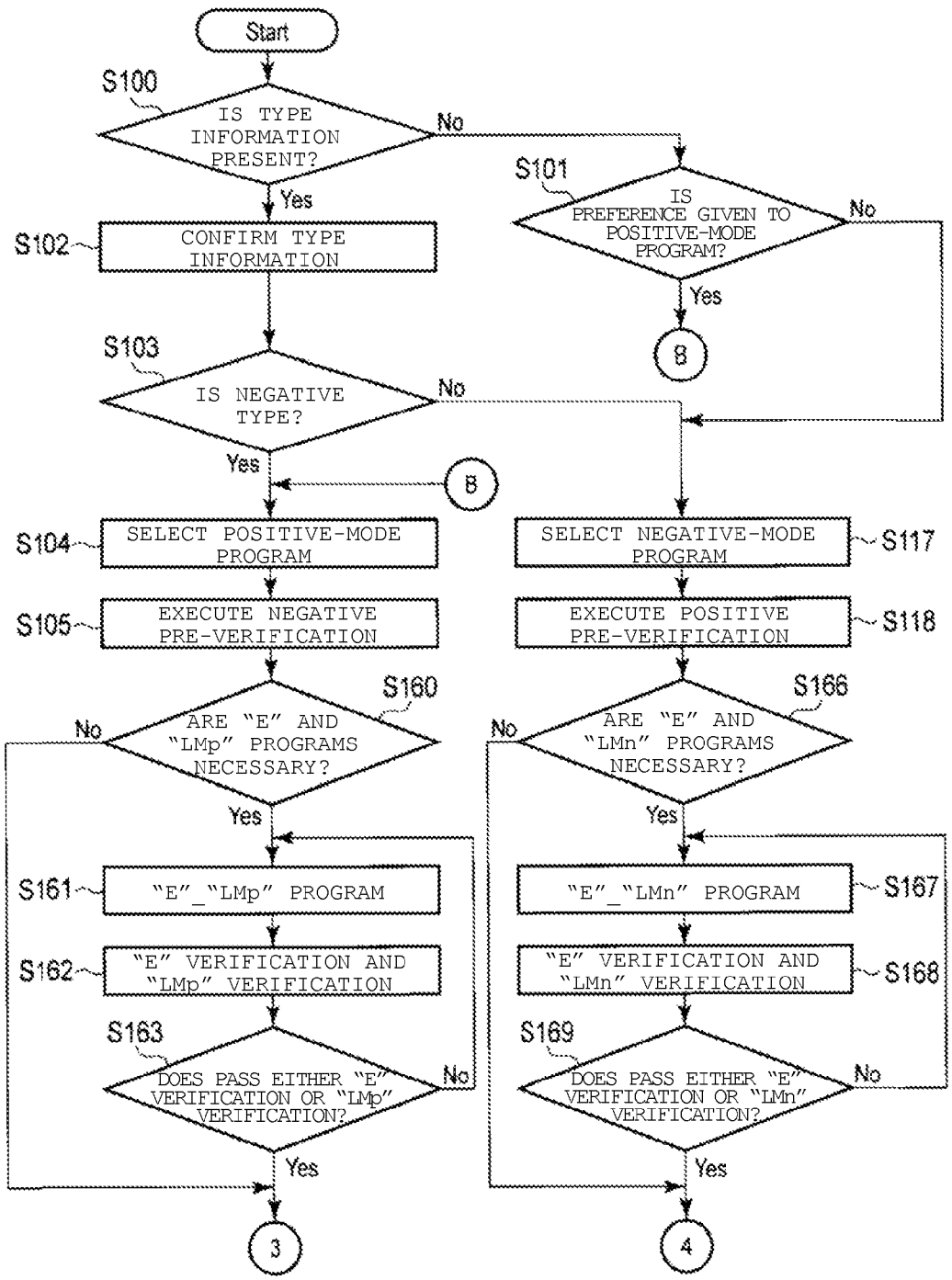
FIG. 42 is a flowchart illustrating an operation flow during a programming operation according to a fifth embodiment.
Figure 43:
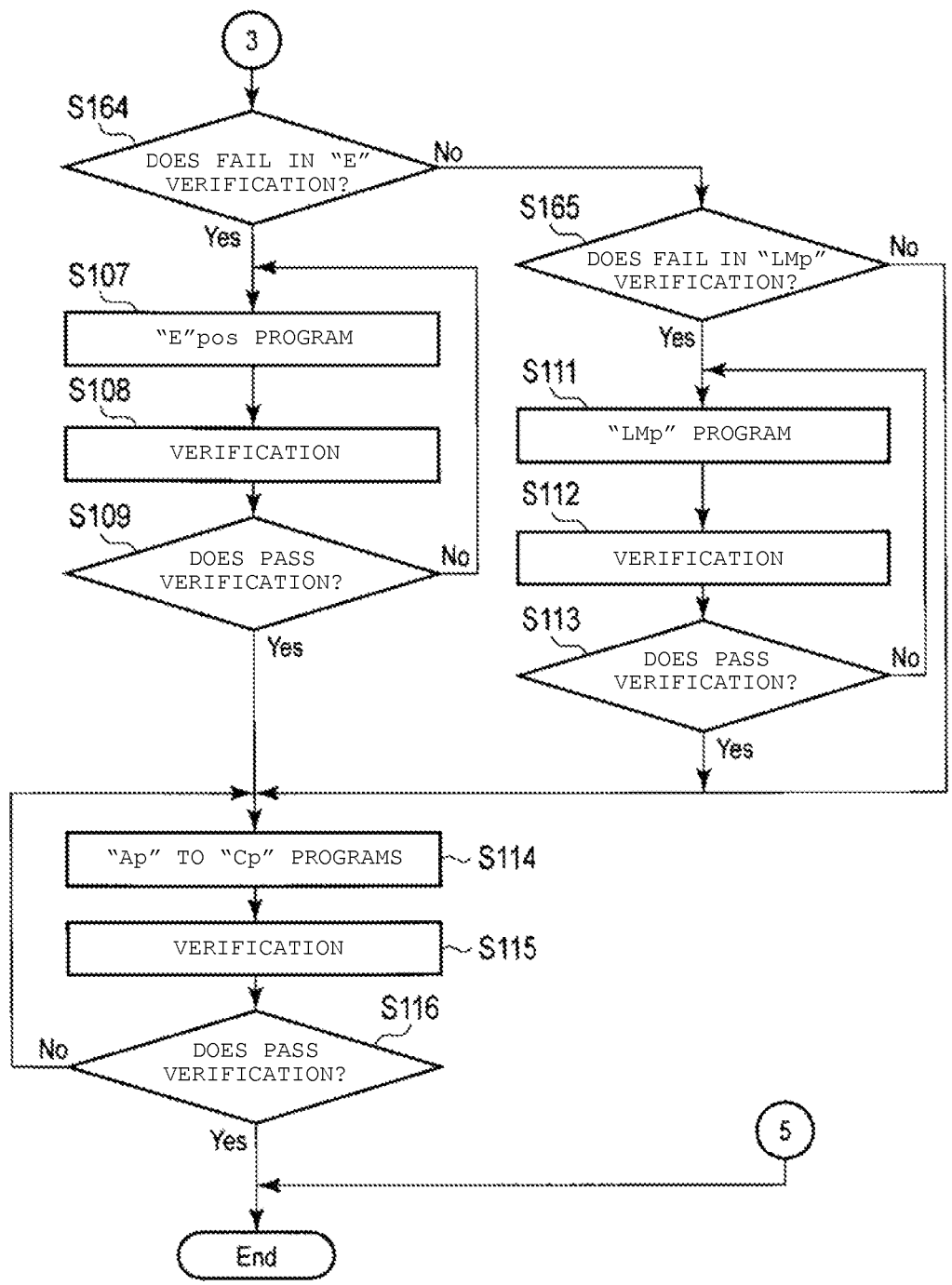
FIG. 43 is a flowchart illustrating the operation flow during the programming operation according to the fifth embodiment.
Figure 44:
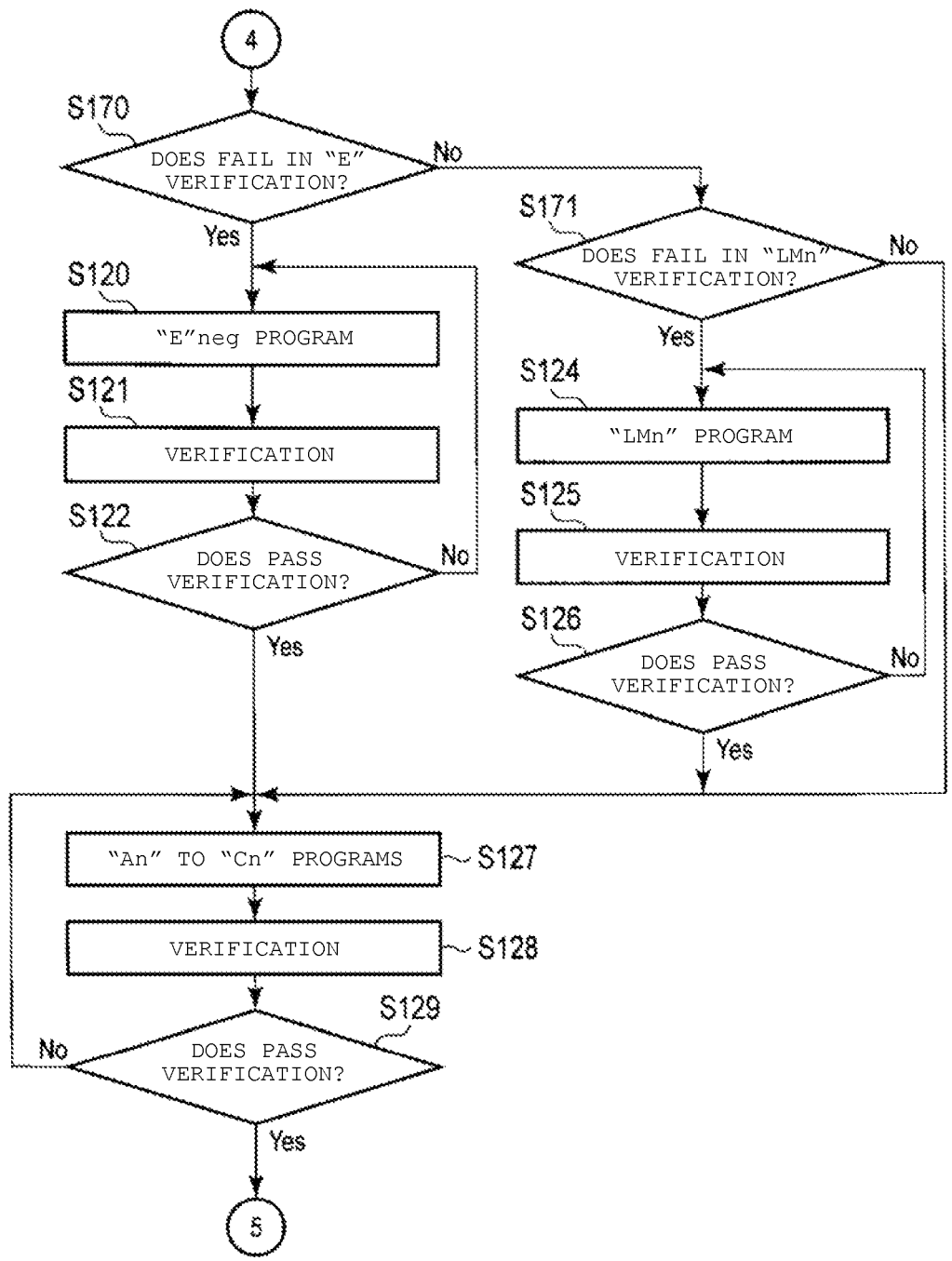
FIG. 44 is a flowchart illustrating the operation flow during the programming operation according to the fifth embodiment.

First, an overall flow of the writing operation will be described. FIGS. 42 to 44 are flowcharts illustrating an operation flow during a programming. As illustrated in the drawings, as is the case with FIGS. 10 and 11, when receiving a write command from the controller 200, the sequencer 121 confirms whether or not type information is present, and whether type information of a selected page is the positive type or the negative type (step S100 to S103). In addition, the sequencer 121 selects the positive-mode programming (step S104) or the negative-mode programming (step S117).

When selecting the positive-mode programming (step S104), first, the sequencer 121 executes the negative pre-verification (step S105).

Next, from the write data received from the controller 200, and a result of the negative pre-verification, the sequencer 121 confirms whether or not both a memory cell transistor MT to which the "E" level is written, and a memory cell transistor MT to which the "LMp" level is written are present (step S160).

Figure 45:
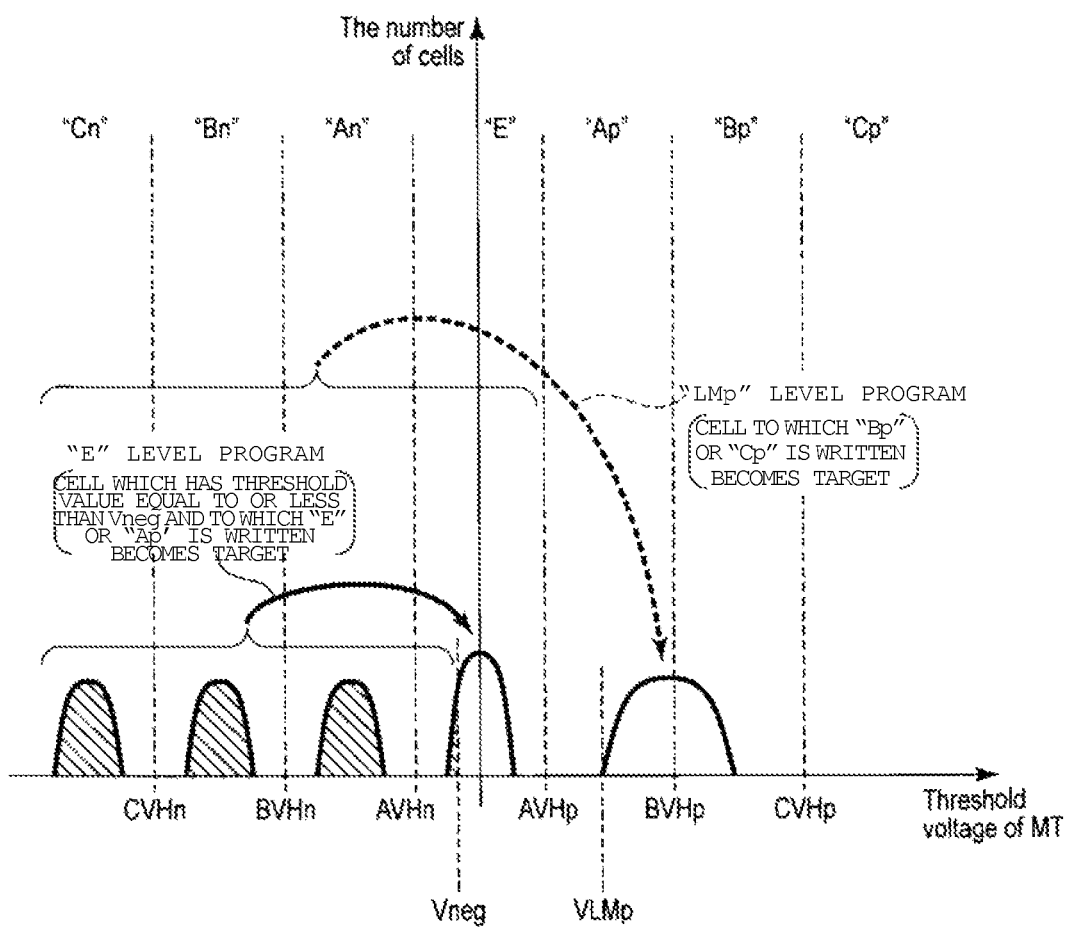
FIG. 45 is a threshold value distribution diagram illustrating a target of an "E"_"LMp" programming according to the fifth embodiment.

FIG. 45 is a threshold value distribution diagram illustrating a write target of the "E" level and the "LMp" level. As illustrated in the drawing, a target to which the "E" level is to be written includes a memory cell transistor MT which fails in the negative pre-verification, that is, which has a threshold value less than Vneg, and a memory cell transistor MT to which the "E" level or the "Ap" level is to be written. A target to which the "LMp" level is to be written includes all memory cell transistors MT to which the "Bp" level or the "Cp" level is to be written regardless of a result of the negative pre-verification.

Next, description will be made with reference to FIGS. 42 to 44. In step S160, the sequencer 121 confirms whether or not either the "E" level or the "Ap" level, and both the "Bp" level and the "Cp" level are included in write data. In addition, when including the levels, the sequencer 121 confirms whether or not a threshold value of the memory cell transistor MT to which the "E" level to the "Ap" level is to be written is less than Vneg. In addition, when the threshold value is less than Vneg, the sequencer 121 determines that the memory cell transistor MT to which the "E" level is written and the memory cell transistor MT to which the "LMp" level is written are present.

When both the memory cell transistor MT to which the "E" level is written and the memory cell transistor MT to which the "LMp" level is written are present (Yes in step S160), the sequencer 121 continuously executes the "E"pos programming and the "LMp" programming (hereinafter, referred to as ""E"_"LMp" programming") which are described in the first embodiment. At this time, the row decoder 112 applies different VPGMp to the selected word line WL during each programming to set a different variation amount of a threshold value (details of a voltage will be described later in Section 5.2).

Next, the sequencer 121 executes verification of the "E" level and the "LMp" level (step S162). As is the case with the "E"_"LMp" programming, the sequencer 121 continuously performs the verification of the "E" level and the "LMp" level. At this time, the row decoder 112 applies different VCGRVp to the selected word line WL in correspondence with respective verification levels Vneg and VLMp (details of a voltage will be described in Section 5.3.1).

In addition, both verification of the "E" level and verification of the "LMp" level fail (No in step S163), the sequencer 121 passes at least one verification of the "E" level and the "LMp" level, or repeats processes of step S161 and S162 until reaching the upper limit number of times which is set in advance.

In addition, when at least one of the memory cell transistor MT to which the "E" level is written and the memory cell transistor MT to which the "LMp" level is written is not present (No in step S160), the sequencer 121 skips the above-described "E"_"LMp" programming.

Next, in step S164, when passing the verification of the "LMp" level, but failing in the verification of the "E" level (Yes in step S164), the sequencer 121 executes the "E"pos programming (step S107 to step S109). This is also true of a case where it is determined as No in determination in step S160 and the "E" level or the "Ap" level is included in the write data. In addition, when the "E"pos programming is completed (Yes in step S109), the sequencer 121 executes the "Ap" to "Cp" programmings (step S114 to step S116).

On the other hand, in step S164, when passing the verification of the "E" level, but failing in the verification of the "LMp" level (No in step S164, Yes In step S165), the sequencer 121 executes the "LMp" programming (step S111 to step S113). This is also true of a case where it is determined as No in determination in step S160, and the "Bp" level or the "Cp" level is included in the write data. In addition, when the "LMp" programming is completed (Yes in step S113), as is the case with the description with reference to FIGS. 10 and 11, the sequencer 121 executes the "Ap" to "Cp" programmings (step S114 to step S116).

In addition, in step S164, when passing both the verification of the "E" level and the verification of the "LMp" level, that is, both writing to the "E" level and writing to the "LMp" level are completed (No in step S164, No in step S165), the sequencer 121 executes programmings to the "Ap" to "Cp" levels without executing the processes in step S107 to step S109, and processes in step S111 to step S113.

In step S101 and step S103, when selecting the negative-mode programming (step S117), the sequencer 121 performs the positive pre-verification (step S118) and confirms whether or not the programming to the "E" level and the "LMn" level (hereinafter, referred to as an ""E"_"LMn" programming") is necessary (step S166). That is, the sequencer 121 confirms whether or not either the "E" level or the "An" level, and either the "Bn" level or the "Cn" level are included in the write data. When the levels are included, the sequencer 121 confirms whether or not the threshold value of the memory cell transistor MT to which the "E" level or the "An" level is to written is equal to or greater than Vpos. In addition, when the threshold value is equal to or greater than Vpos, the sequencer 121 determines the memory cell transistors MT as the memory cell transistor MT to which the "E" level is written, and the memory cell transistor MT to which the "LMp" level is written.

When both the memory cell transistor MT to which the "E" level is written and the memory cell transistor MT to which the LMn" level is written are present (Yes in step S166), as is the case with the "E"_"LMp" programming, the sequencer 121 executes the "E"_"LMn" programming (step S167 to step S169).

When passing at least one of the verification of the "E" level and the verification of the "LMn" level (Yes in step S170), if failing in the verification of the "E" level, the sequencer 121 executes the "E"neg programming (step S120 to step S122), and if failing in the verification of the "LMn" level, the sequencer 121 executes the "LMn" programming (step S124 to step S126). In addition, when both writing of the "E" level and writing of the "LMn" level are completed, as is the case with the description with reference to FIGS. 10 and 11, the sequencer 121 executes the "An" to "Cn" programmings (step S127 to step S129).

5.2 With Respect to Voltage During Writing

Next, a voltage relationship between wirings during writing data will be described.

5.2.1 With Respect to Voltage of "E"_"LMp" Programming

Figure 46:
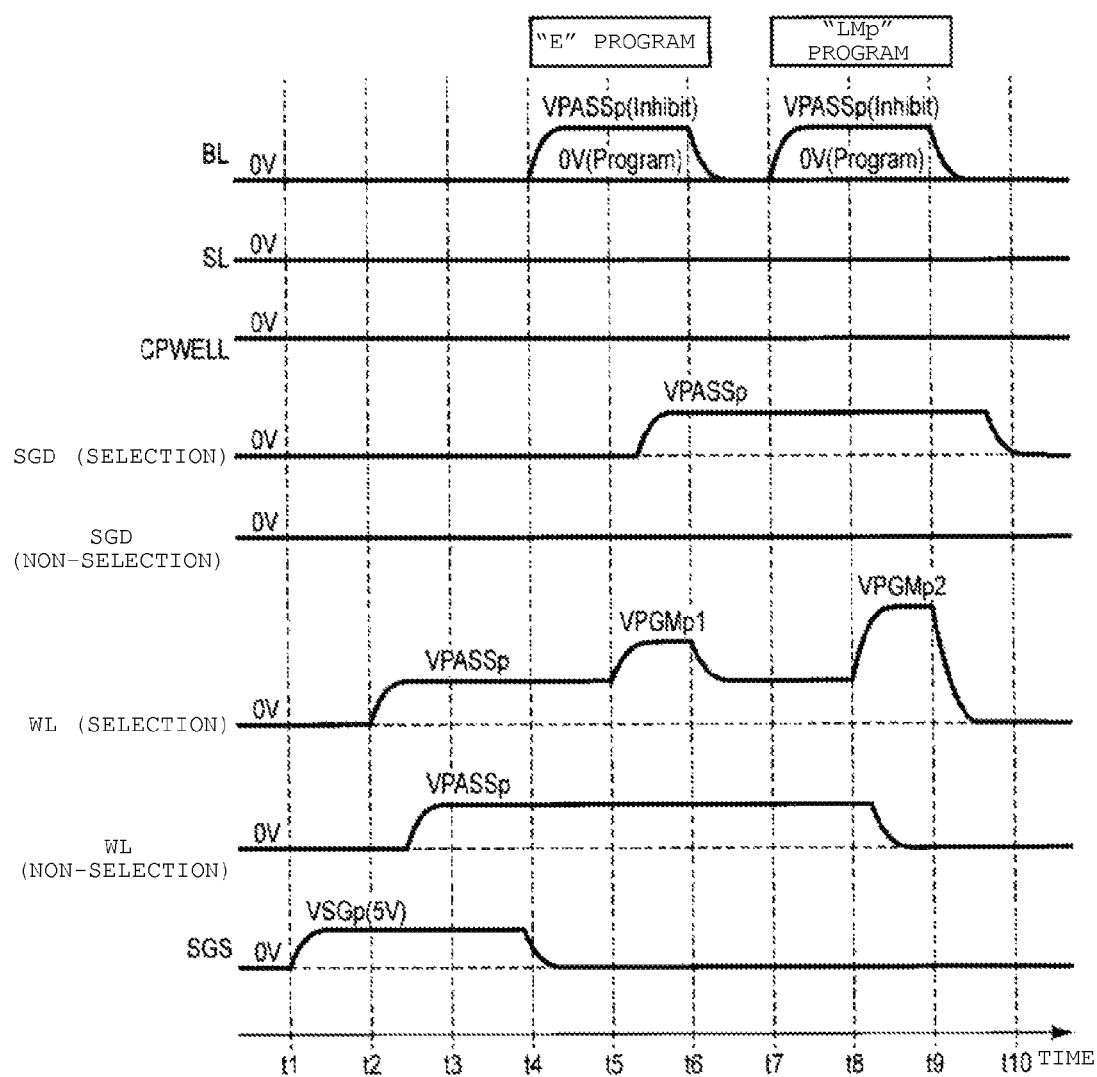
FIG. 46 is a timing chart illustrating a potential of each wiring during the "E"_"LMp" programming according to the fifth embodiment.

First, a voltage relationship between respective wirings during the "E"_"LMp" programming will be described. FIG. 46 is a timing chart illustrating a potential of each wiring during the "E"_"LMp" programming.

As illustrated in the drawing, in this embodiment, the programmings of the "E" level and the "LMp" level are continuously executed, and thus this corresponds to a case of continuously executing the programming illustrated in FIG. 18 two times. Accordingly, a voltage of each wiring at time t1 to time t6 is the same as in the description with reference to FIG. 18, and a voltage of each wiring at time t6 to time t9 is the same as at time t3 to time t6. In addition, in this embodiment, VPGM in a case of writing "E" is set to VPGMp1, and VPGM in a case of writing "LMp" is set to VPGMp2. In addition, VPGMp1 and VPGMp2 satisfy a relationship of 0<VPGMp1<VPGMp2.

5.2.2 With Respect to Voltage of "E"_"LMn" Programming

Figure 47:
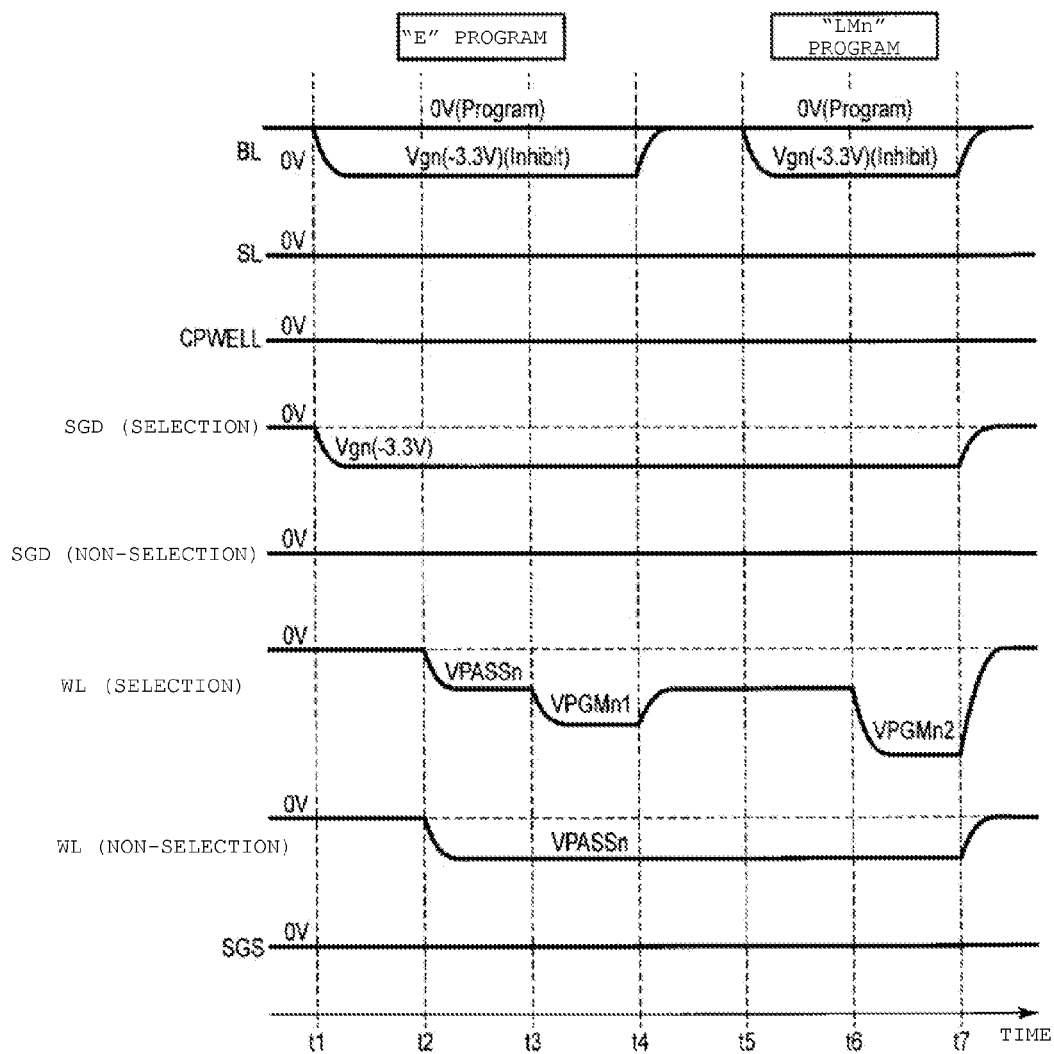
FIG. 47 is a timing chart illustrating a potential of each wiring during a "E"_"LMn" programming according to the fifth embodiment.

Next, a voltage relationship between respective wirings during the "E"_"LMn" programming will be described. FIG. 47 is a timing chart illustrating a potential of each wiring during the "E"_"LMn" programming.

As illustrated in the drawing, in this embodiment, writing of the "E" level and the "LMn" level are continuously executed, and thus this corresponds to a case of continuously executing the programming illustrated in FIG. 21 two times. Accordingly, a voltage of each wiring at time t1 to time t4 is the same as in the description with reference to FIG. 21. At time t4 to time t5, bit lines BL, which become a programming target, are different from each other, and thus the sense amplifier 113 applies 0 V to all bit lines BL. In addition, a voltage of each wiring at time t5 to time t7 is the same as at time t2 to time t3. In addition, in this embodiment, VPGM in a case of writing "E" is set to VPGMn1, and VPGM in a case of writing "LMn" is set to VPGMn2. In addition, VPGMn1 and VPGMn2 satisfy a relationship of 0 V>VPGMn1>VPGMn2.

5.3 With Respect to Verification

In the verification according to this embodiment, both the N-channel reading and the P-channel reading which are described in the first embodiment are applicable. In this embodiment, description will be made with respect to a voltage relationship between respective wirings in a case of performing the verification in the "E"_"LMp" programming, that is, in the positive-mode programming with the N-channel reading, and in a case of performing the verification in the "E"_"LMn" programming, that is, in the negative-mode programming with the P-channel reading. However, the verification of the "E"_"LMp" programming may be performed with the P-channel reading, and the verification of the "E"_"LMn" programming may be performed with the N-channel reading.

5.3.1 With Respect to Verification of "E"_"LMp" Programming

Figure 48:
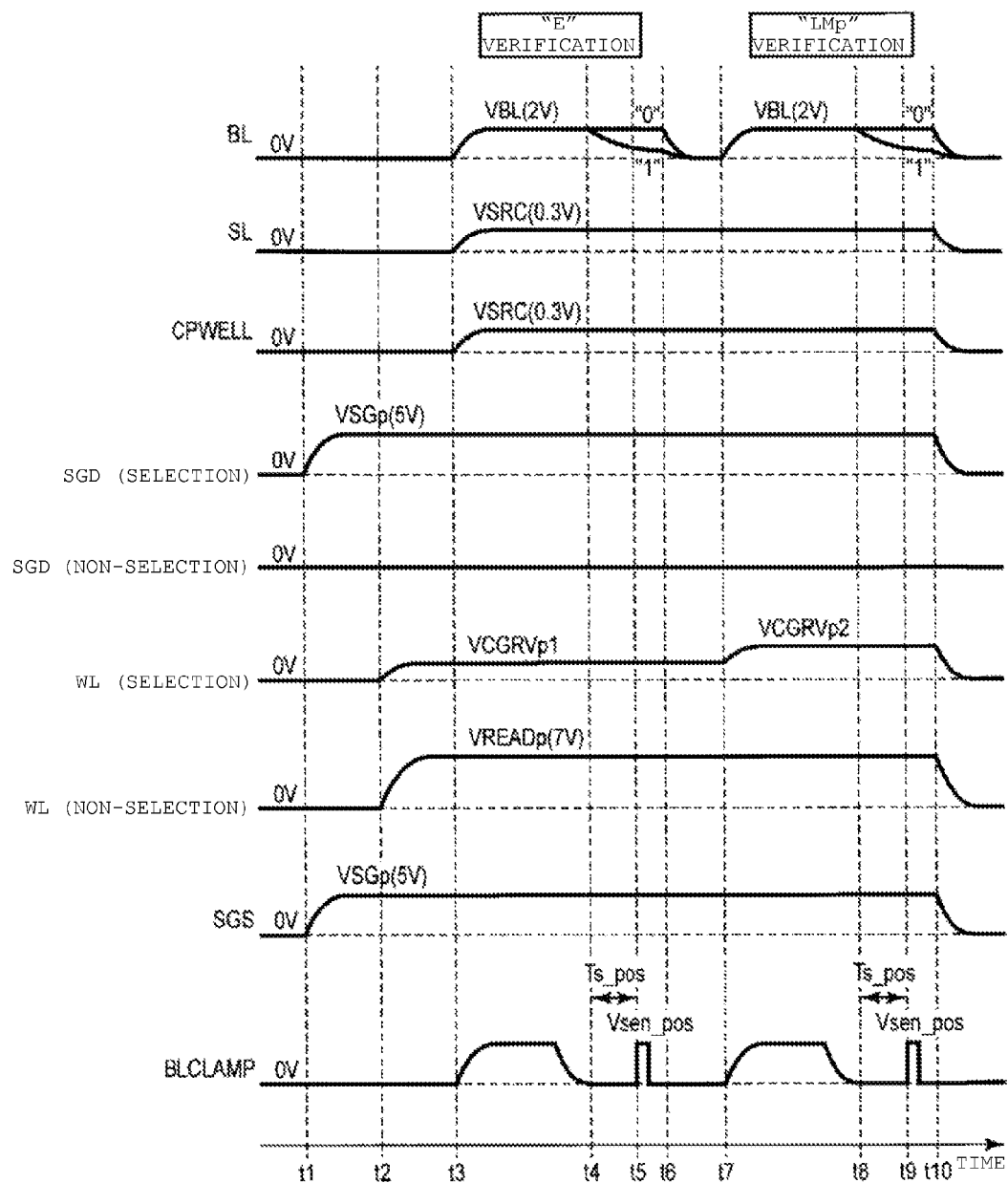
FIG. 48 is a timing chart illustrating a potential of each wiring during N-channel reading according to the fifth embodiment.

Description will be made with respect to a voltage relationship between respective wiring in a case of performing the verification of the "E"_"LMp" programming with the N-channel reading. FIG. 48 is a timing chart illustrating a potential of each wiring during reading.

As illustrated in the drawing, in this embodiment, the verification of the "E" level and the verification of the "LMp" level are continuously performed, and thus this corresponds to a case of continuously performing the N-channel reading two times as illustrated in FIG. 26. Accordingly, a voltage of each wiring at time t1 to time t6 is the same as the description with reference to FIG. 26, and a voltage of each wiring at time t7 to time t10 is the same as at time t3 to time t6. Accordingly, VCGRV corresponding to the verification of the "E" level is set to VCGRVp1, and VCGRV corresponding to the verification of the "LMp" level is set to VCGRVp2. VCGRVp1 and VCGRVp2 correspond to respective verification levels, and are set to approximately Vneg and approximately VLMp, respectively. Accordingly, a relationship of Vneg<VLMp is satisfied, and thus VCGRVp1 and VCGRVp2 also satisfy a relationship of VCGRVp1<VCGRVp2.

5.3.2 With Respect to Verification of "E"_"LMn" Programming

Figure 49:
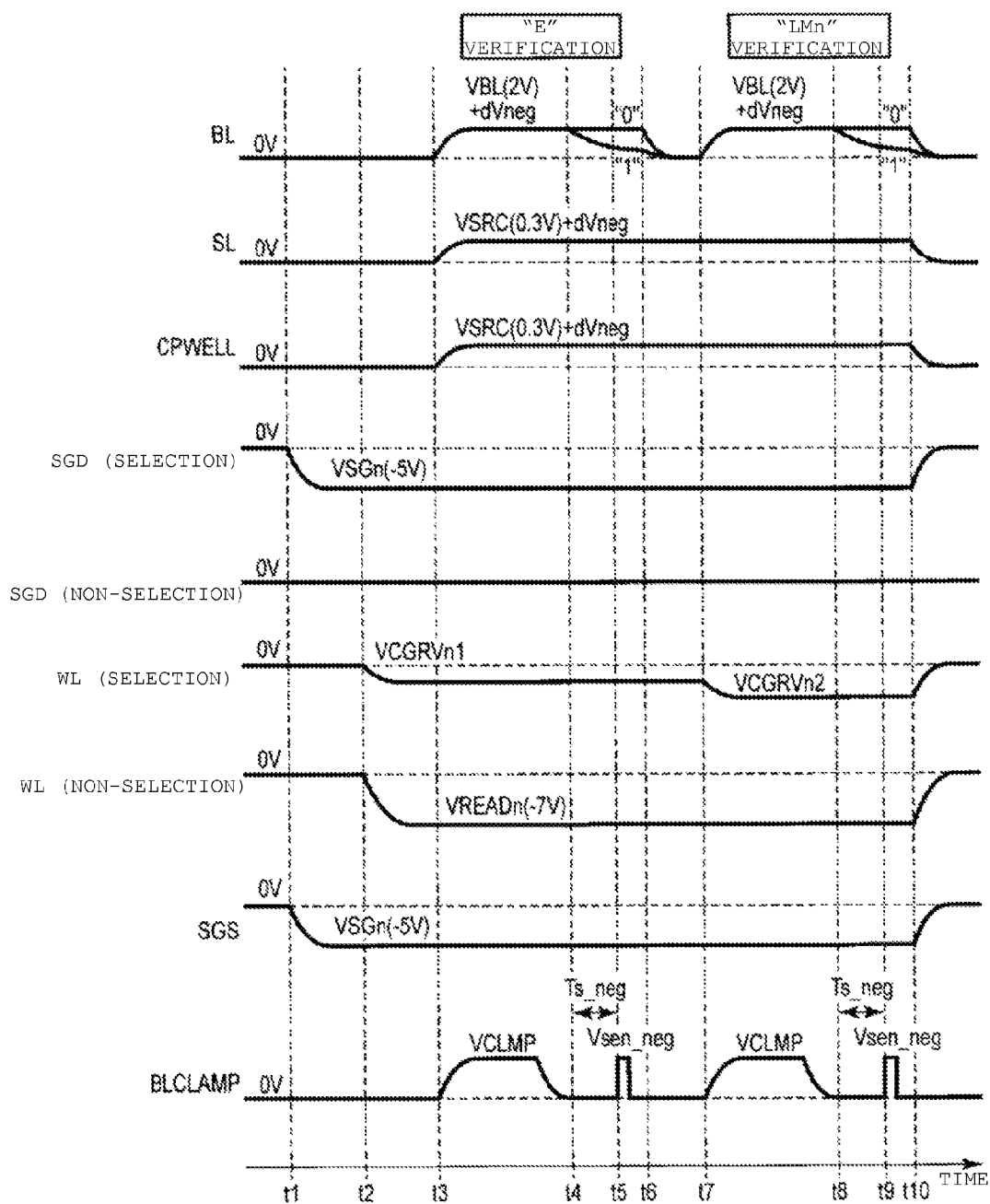
FIG. 49 is a timing chart illustrating a potential of each wiring during P-channel reading according to the fifth embodiment.

Description will be made with respect to a voltage relationship between respective wirings in a case of performing the verification of the "E"_"LMn" programming with the P-channel reading. FIG. 49 is a timing chart illustrating a potential of each wiring during reading.

As illustrated in the drawing, in this embodiment, the verification of the "E" level and the verification of the "LMp" level are continuously performed, and thus this corresponds to a case of continuously performing the P-channel reading two times as illustrated in FIG. 27. In addition, in this embodiment, VCGRV in a case of the verification of the "E" level is set to VCGRVn1, and VCGRV in a case of the verification of the "LMp" level is set to VCGRVn2. VCGRVn1 and VCGRVn2 correspond to respective verification levels, and thus are set to approximately Vpos and approximately VLMn, respectively. Accordingly, a relationship of Vpos>VLMn is satisfied, and thus VCGRVn1 and VCGRVn2 also satisfy a relationship of VCGRVn1>VCGRVn2.

5.4 Effect According to this Embodiment

In the configuration according to this embodiment, the same effect as the first to fourth embodiments is obtained.

In addition, in the configuration according to this embodiment, writing of the "E" level and writing of the "LM" level are continuously performed, and thus it is possible to improve a processing speed of a programming.

In addition, in the configuration according to this embodiment, VPGM when writing of the "E" level and VPGM when writing the "LM" level may be set to values different from each other to change a variation amount of the threshold value for each writing. Accordingly, when the variation amount of the threshold value of the "LM" level is made to be large, the number of times of programming loops is reduced, and thus it is possible to improve a writing speed.

In addition, with regard to VPGMp1 and VPGMp2, a voltage value may be stepped up whenever repeating a programming loop. A step-up width DVPGMp at this time may be different between VPGMp1 and VPGMp2.

In addition, with regard to VPGMn1 and VPGMn2, a voltage value may be stepped down whenever repeating a programming loop. A step-down width DVPGMn at this time may be different between VPGMn1 and VPGMn2.

In addition, in the configuration according to this embodiment, the voltage sensing type sense amplifier 113 may be used. In this case, the voltage of each wiring is set to VCGRVp which is different between the first verification and the second verification in the timing chart illustrated in FIGS. 40 and 41. In addition, a potential of a bit line BL that is not a verification target is set to 0 V.

6. Sixth Embodiment

Next, a memory system according to a sixth embodiment will be described. In this embodiment, a voltage VCGRV, which is applied to a selected word line, is shifted in correspondence with a variation in a threshold value of the memory cell transistor MT when reading data in the above-described first to fifth embodiments. Hereinafter, only a difference from the first to fifth embodiments will be described.

6.1 With Respect to Shift Table

Next, a shift table, which retains by the controller 200 according to this embodiment, will be described. FIG. 50 is a conceptual diagram of the shift table.

The NAND type flash memory 100 according to this embodiment executes a retry reading operation when reading data in response to a command of the controller 200 in addition to a typical reading operation (hereinafter, referred to as a "normal read"). The retry reading operation is an operation of repeating reading of data while shifting the voltage VCGRV, which is applied to the selected word line WL, in accordance with a variation in the threshold value of the memory cell transistor MT due to retention and disturbance of data for a long period of time, and the like. Details of the retry reading operation will be described in the following reading operation in Section 6.2.

As illustrated in the drawing, the shift table retains a shift amount of VCGRV in each retry reading in accordance with the "Ap", "Bp", and "Cp" levels, and the "An", "Bn", and "Cn" levels. Specifically, a shift amount corresponding to the "Ap" level is set to Vs_AP_i in accordance with the number of times of retry i (i is a natural number of 1 to L, and L is a natural number of 1 or greater). In addition, a shift amount corresponding to the "Bp" level is set to Vs_Bp_i, and a shift amount corresponding to the "Cp" level is set to Vs_Cp_i. Similarly, in a case of the negative type, a shift amount corresponding to the "An" level is set to Vs_An_i. In addition, a shift amount corresponding to the "Bn" level is set to Vs_Bn_i, and a shift amount corresponding to the "Cn" level is set to Vs_Cn_i.

In FIG. 50, for example, VCGRVp that reads out data of the "Ap", "Bp", and "Cp" levels during the normal read is set to VCGRV_Ap, VCGRV_Bp, and VCGRV_Cp to be the same as respective read levels. The read level represents a threshold voltage in accordance with a data to be read, and read levels of the "Ap", "Bp", and "Cp" levels are AVHp, BVHp, and CVHp. Accordingly, relationships of VCGRV_Ap=AVHp, VCGRV_Bp=BVHp, and VCGRV_Cp=CVHp are established. In this case, at first retry reading, a voltage that is applied to the selected word line WL during reading of the "Ap" level is shifted from AVHp by Vs_AP_1, and becomes AVHp+Vs_Ap_1. Similarly, a voltage that is applied to the selected word line WL during reading of the "Bp" level becomes BVHp+Vs_Bp_1, and a voltage that is applied to the selected word line WL during reading of the "Bp" level becomes CVHp+Vs_Cp_1.

Similarly, even in a case of the negative type, VCGRVp that reads out data of "An", "Bn", and "Cn" levels is set to set to VCGRV_An, VCGRV_Bn, and VCGRV_Cn to be the same as respective read levels. Accordingly, relationships of VCGRV_An=AVHn, VCGRV_Bn=BVHn, and VCGRV_Cn=CVHn are established. In this case, at first retry reading, a voltage that is applied to the selected word line WL during reading of the "An" level becomes AVHn+Vs_An_1, a voltage that is applied to the selected word line WL during reading of the "Bn" level becomes BVHn+Vs_Bn_1, and a voltage that is applied to the selected word line WL during reading of the "Cn" level becomes CVHn+Vs_Cn_1. In the following description, in a case of not distinguishing the respective shift amounts, the shift amounts are simply described as Vshift.

6.2 With Respect to Reading Operation of Data

Next, a reading operation of data according to this embodiment will be described.

6.2.1 With Respect to Flow During Reading Operation

Figure 51:
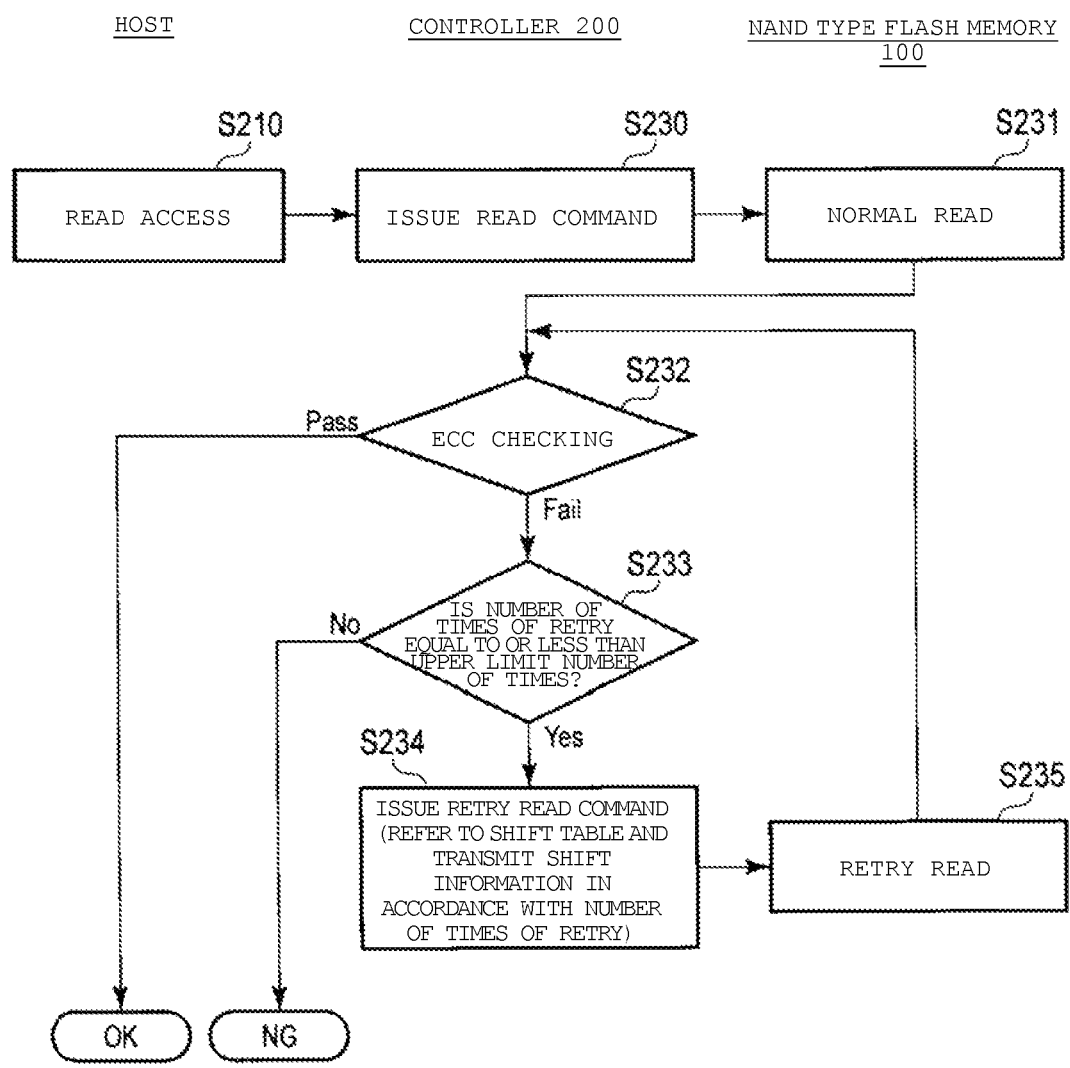
FIG. 51 is a flowchart illustrating an operation of a controller during reading data according to the sixth embodiment.

FIG. 51 is a flowchart illustrating an operation of the controller 200 during reading data according to this embodiment.

First, when being subjected to read access from the host apparatus, the CPU 230 of the controller 200 issues a read command, and the NAND interface circuit 250 transmits the read command to the NAND type flash memory 100 (step S230). In addition, details of the operation of the controller 200 regarding to the issue of the read command are the same as in the description with reference to FIG. 30.

In response to this, the sequencer 121 of the NAND type flash memory 100 executes the normal read (step S231). That is, the sequencer 121 executes reading of data according to the flow illustrated in FIG. 24.

Next, data that is read out in step S231 is retained in, for example, the buffer memory 240 of the controller 200 through the NAND interface circuit 250. In addition, the ECC circuit 260 checks the read data for determination of whether or not an error is present, and when an error is present, the ECC circuit 260 corrects the error (step S232). When the error is not present, or the number of errors (the number of defective bits) is equal to or less than a prescribed number, and correction of the errors is possible (Pass in step S232), the CPU 230 transmits the data to the host apparatus, and the reading operation of data from a corresponding page is completed.

On the other hand, when the number of errors (the number of defective bits) exceeds the prescribed number, the ECC circuit 260 cannot correct the errors (Fail in step S232). Accordingly, the CPU 230 executes the retry reading. First, the CPU 230 confirms whether or not the number of retry j (j is a natural number of 1 or greater) exceeds the upper limit number of times (1 to (L−1)) which is set in advance (step S233). When the number of retry j exceeds the upper limit number of times (No in step S233), the CPU 230 determines that the reading operation of data from the corresponding page fails.

When the number of times of retry j does not exceed the upper limit number of times (Yes in step S233), the CPU 230 reads out the shift table related to the retry reading from the built-in memory 220. In addition, the CPU 230 issues information related to a voltage shift amount Vshift and a retry reading command (step S234). In addition, the NAND interface circuit 250 transmits the information and the command to the NAND type flash memory 100.

The NAND type flash memory 100 executes the retry reading in response to the received command (step S235). At this time, the row decoder 112 changes VCGRVp or VCGRVn in accordance with the received information of the voltage shift amount Vshift.

The data that is read out in step S235 is retained in, for example, the buffer memory 240 of the controller 200 through the NAND interface circuit 250. In addition, returning to step S232, the ECC circuit 260 checks the read data for determination of whether or not an error is present. In addition, the retrying operation passes the ECC check or repetitively performed before the number of times of retry L exceeds the upper limit number of times.

Figure 52:
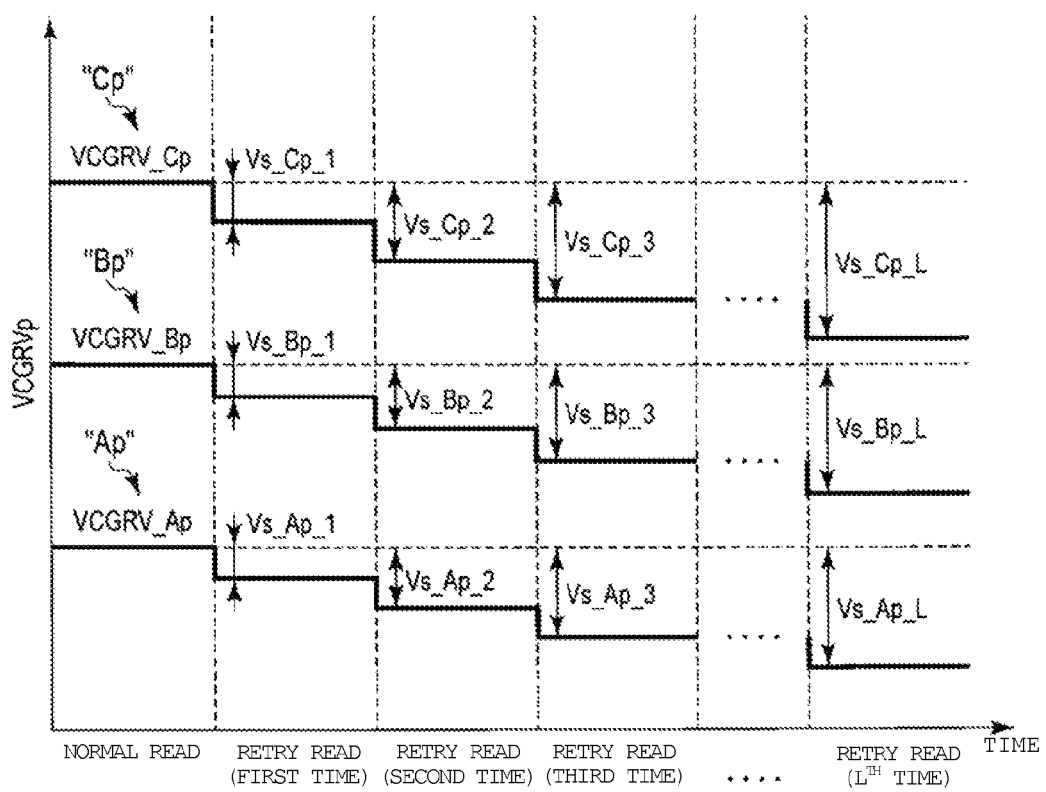
FIG. 52 is a timing chart illustrating a variation in a positive-type read voltage value from normal read to retry reading according to the sixth embodiment.

6.2.2 With Respect to Variation in Voltage of Selected Word Line During Reading Operation FIG. 52 is a timing chart illustrating a variation in a voltage value of VCGRVp from the normal read to $L^{th}$ retry reading in the positive type. However, in this example, description will be made with respect to a case where VCGRVp shifts toward a negative side, the shift amount Vs_Ap_i, which corresponds to the "Ap" level in which the threshold value is low, is the smallest, and the shift amount Vs_Cp_i, which corresponds to the "Cp" level in which the threshold value is high, is the largest. That is, Vs_Ap_i, Vs_Bp_i, and Vs_Cp_i satisfy a relationship of 0 V>Vs_Ap_i>Vs_Bp_i>Vs_Cp_i.

As illustrated in the drawing, the shift amounts Vs_Ap_i, Vs_Bp_i, and Vs_Cp_i are negative values. Accordingly, VCGRVp of the "Ap", "Bp", and "Cp" levels are stepped down whenever the retry reading is repeated. For example, with regard to the "Ap" level, a voltage that is applied to the selected word line WL satisfies a relationship of VCGRV_Ap>VCGRV_Ap+Vs_Ap_1>VCGRV_Ap+Vs_Ap_2>...>VCGRV_Ap+Vs_Ap_L. This is also true of the "Bp" level and the "Cp" level.

Figure 53:
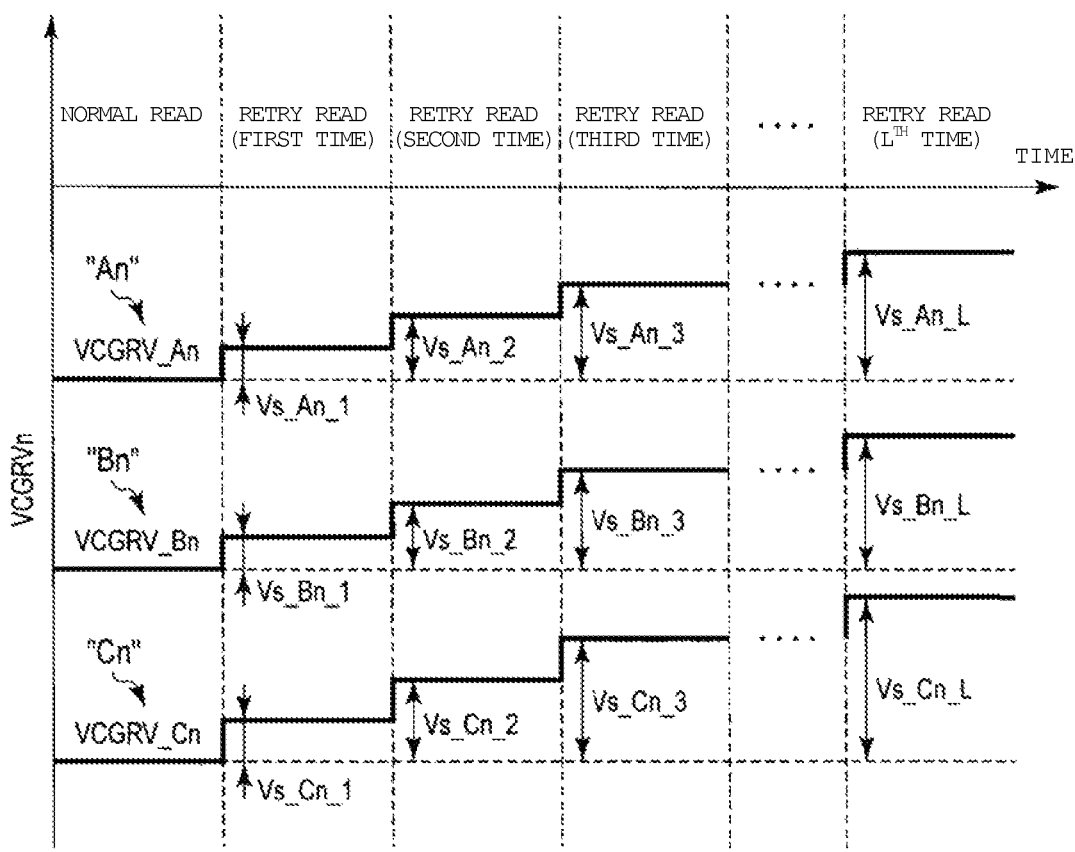
FIG. 53 is a timing chart illustrating a variation in a negative-type read voltage value from normal read to retry reading according to the sixth embodiment.

FIG. 53 is a timing chart illustrating a variation in a voltage value of VCGRVn from the normal read to $L^{th}$ retry reading in the negative type. However, in this example, description will be made with respect to a case where VCGRVn shifts toward a positive side, the shift amount Vs_An_i, which corresponds to the "An" level in which the threshold value is high, is the smallest, and the shift amount Vs_Cn_i, which corresponds to the "Cp" level in which the threshold value is low, is the largest. That is, the shift amounts Vs_An_L to Vs_Cn_L satisfy a relationship of 0 V<Vs_An_i<Vs_Bn_i<Vs_Cn_i.

As illustrated in the drawing, the shift amounts Vs_An_i, Vs_Bn_i, and Vs_Cn_i are positive values. Accordingly, VCGRVn of the "An", "Bn", and "Cn" levels are stepped up whenever the retry reading is repeated. For example, with regard to the "An" level, a voltage that is applied to the selected word line WL satisfies a relationship of VCGRV_An<VCGRV_An+Vs_An_1<VCGRV_An+Vs_An_2<...<VCGRV_An+Vs_An_L. This is also true of the "Bn" level and the "Cn" level.

6.3 Effect According to this Embodiment

In the configuration according to this embodiment, the same effect as the first to fifth embodiments is obtained.

In the configuration according to this embodiment, a voltage is shifted by performing reading with the positive type and the negative type, and thus erroneous data reading is suppressed. Accordingly, it is possible to improve reliability of the reading operation. Hereinafter, this effect will be described.

Figure 54:
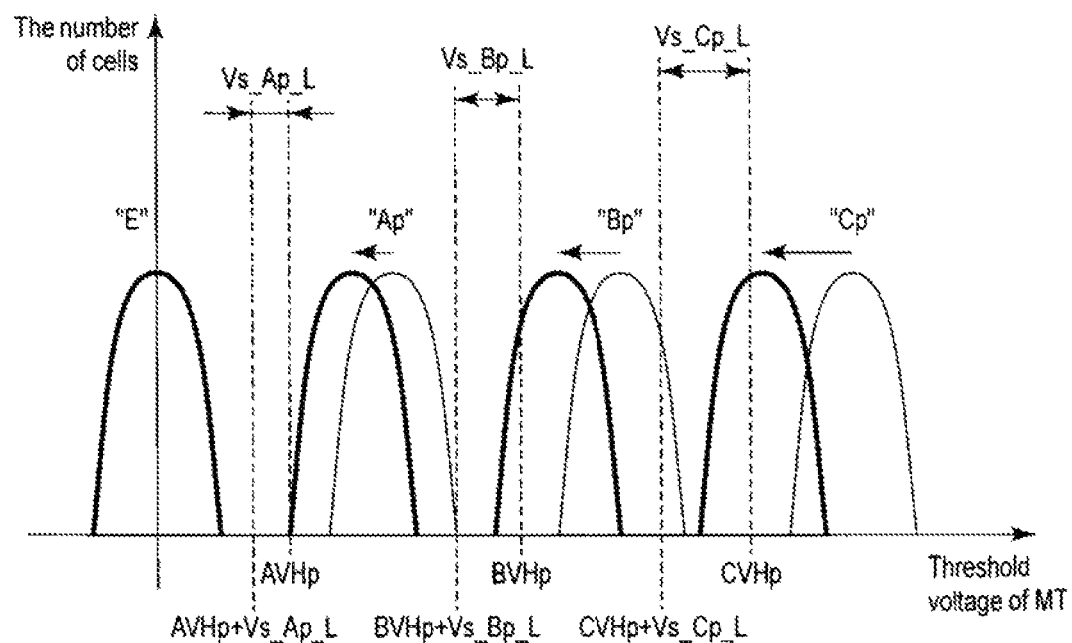
FIG. 54 is a positive-type threshold value distribution diagram according to the sixth embodiment.
Figure 55:
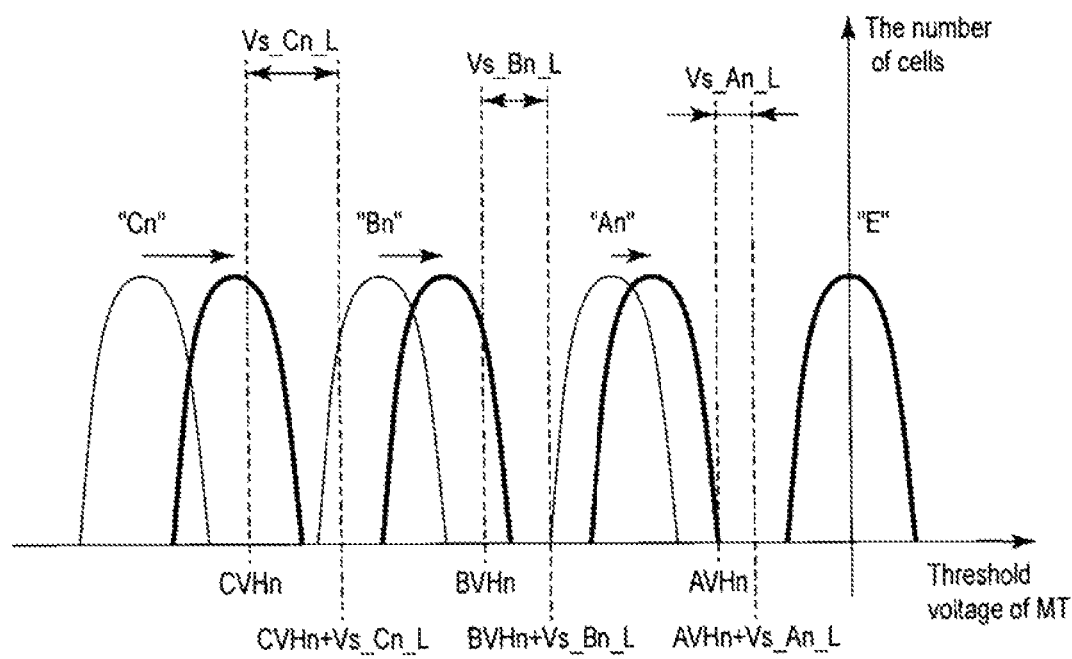
FIG. 55 is a negative-type threshold value distribution diagram according to the sixth embodiment.

First, a threshold value distribution, which the memory cell transistor MT according to this embodiment may take, will be described. FIGS. 54 and 55 illustrate threshold value distributions of the positive type and the negative type, respectively.

In an example of FIG. 54, for example, when a charge of the charge storage layer 28 disappears due to an effect of retention and disturbance of data for a long period of time, and the like, the threshold value of the memory cell transistors MT in the "Ap", "Bp", and "Cp" levels shifts toward an "E" level side. That is, the threshold value of the memory cell transistors MT decreases. Due to this, when VCGRV, that is, the read level remains as is, the memory cell transistor MT may be unintentionally activated during reading, and thus correct data may not be read out in some cases.

In contrast, in this embodiment, the read level of the "Ap" level is shifted toward the "E" level side by Vs_Ap_i (<0 V) in correspondence with a variation amount of the threshold value of the memory cell transistor MT, and is set to AVHp+Vs_Ap_i. Similarly, even in the case of the "Bp" level and the "Cp" level, the shift amount are set to Vs_Bp_i (<0 V) and Vs_Cp_i (<0 V), respectively, and thus the read levels are set to BVHp+Vs_Bp_i and CVHp+Vs_Cp_i, respectively. For example, in FIG. 54, the larger an injection amount of charges into the charge storage layer 28 is, the further the variation amount of the threshold value tends to increase. Accordingly, the magnitude of the shift amount in accordance with the magnitude of the variation amount of the threshold value satisfies a relationship of |Vs_Ap_i|≤|Vs_Bp_i|≤|Vs_Cp_i|.

In addition, in the example in FIG. 55, when a hole disappears from the charge storage layer 28, the threshold value of the memory cell transistors MT in the "An", "Bn", and "Cn" levels shifts toward a "E" level side. Accordingly, similarly, even in a case of the negative type, the read levels of "An", "Bn", and "Cn" are set to AVHn+Vs_An_i, BVHn+Vs_Bn_i, and CVHn+Vs_Cn_i in accordance with the variation amount of the threshold value. In this case, the magnitude of the shift amount satisfies a relationship of 0 V<Vs_An_i≤Vs_Bn_i≤Vs_Cn_i. As described above, the read level is also shifted in correspondence with a variation in the threshold value of the memory cell transistor MT, and then the retry reading is executed. Accordingly, it is possible to suppress erroneous data reading.

In addition, in this example, description is made with respect to a case where VCGRV and the read level are set to the same value as an example, but VCGRV and the read level may be values different from each other. For example, a value of VCGRV may be set to a voltage obtained by adding the read level to a voltage of a source line also in consideration of a voltage of the conductive film 30 (source line SL). For example, in a case where VSRC is applied to the source line SL, relationships of VCGRV_Ap=VSRC+AVHp, VCGRV_Bp=VSRC+BVHp, and VCGRV_Cp=VSRC+CVHp may be established.

In addition, in this example, description is made with respect to a case where a charge or a hole disappears from the charge storage layer 28, and the threshold value shifts toward the "E" level side, but the following case is possible. Specifically, a charge or a hole injected due to an effect of a programming mode when writing data to a different memory cell transistor MT, and thus the threshold value shifts to be distant from the "E" level. In this case, a threshold value of a memory cell transistor MT having the positive type threshold value shifts toward a positive side, and a threshold value of a memory cell transistor MT having the negative type threshold value shifts toward a negative side.

7. Seventh Embodiment

Next, a memory system according to a seventh embodiment will be described. In this embodiment, verification, which corresponds to first arbitrary number of times of programmings when repeating the writing operation plural times for an arbitrary level in the first to sixth embodiments, is skipped. Hereinafter, only a difference from the first to sixth embodiments will be described.

7.1 With Respect to Flow During Writing Operation

Figure 56:
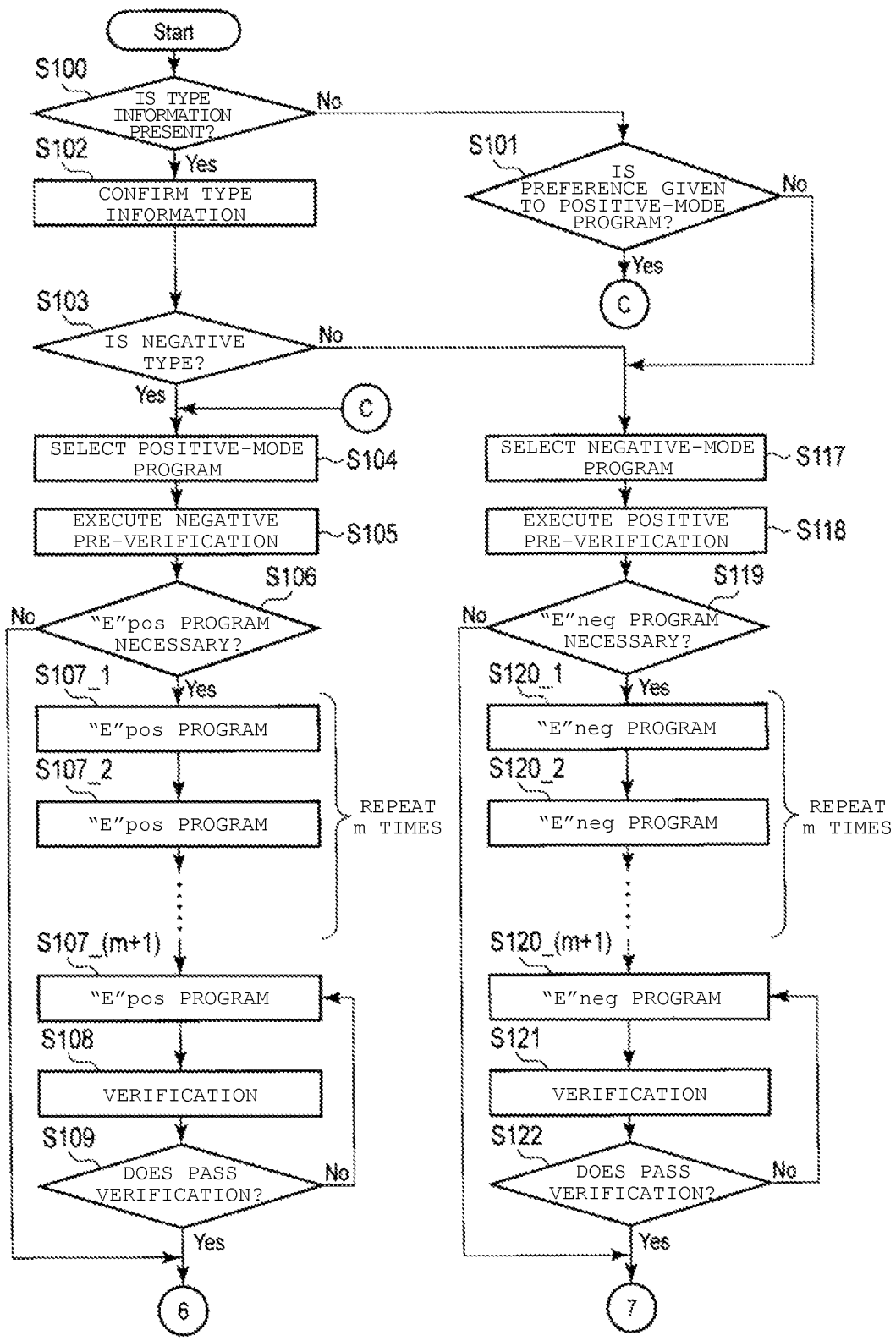
FIG. 56 is a flowchart illustrating an operation flow during a programming operation according to a seventh embodiment.
Figure 57:
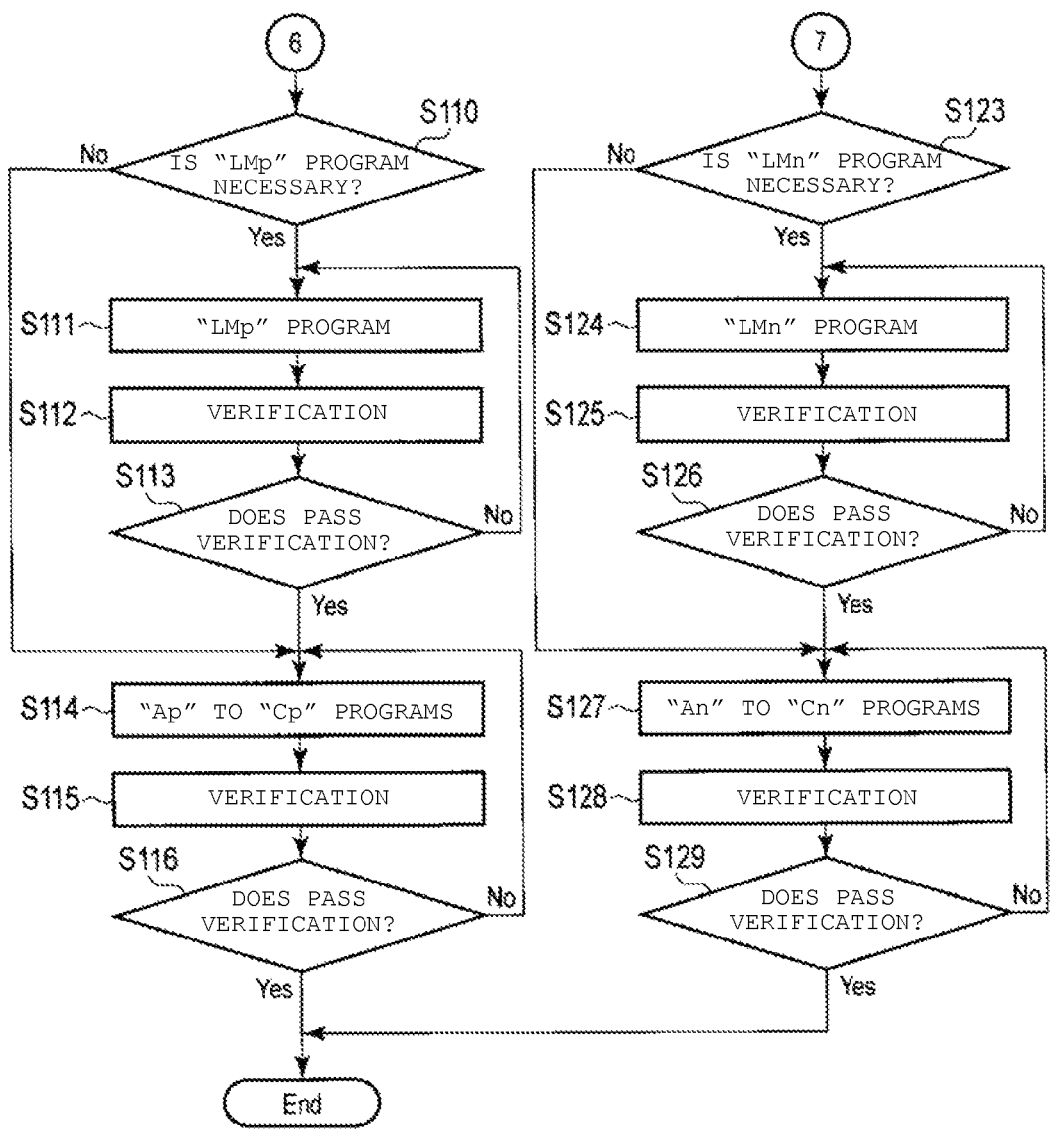
FIG. 57 is a flowchart illustrating the operation flow during the programming operation according to the seventh embodiment.

Hereinafter, this embodiment will be described with reference to an example in which verification with respect to a first plurality of times of programmings is omitted in the "E"pos programming or the "E"neg programming. FIGS. 56 and 57 are flowcharts illustrating an operation flow during a programming according to this embodiment.

As illustrated in the drawings, in the writing operation according to this embodiment, a verification operation, which corresponds to first $m^{th}$ (m is a natural number of 1 or greater) programming in FIGS. 10 and 11 which are described in the first embodiment, is omitted.

7.2 Effect According to this Embodiment

In the configuration according to this embodiment, the same effect as the first to sixth embodiments is obtained.

In addition, in the configuration according to this embodiment, the verification is skipped, and thus it is possible to improve a processing speed of the writing operation. Hereinafter, this effect will be described.

When a difference between a current threshold value and a target writing level (in this embodiment, the "E" level) of a memory cell transistor MT that is an arbitrary write target is greater than a threshold value variation amount due to a programming executed at once, that is, when it is difficult to perform changing to a target threshold level by writing performed once, it is necessary for the sequencer 121 to repeat a programming loop plural times. That is, it is certain that the verification fails up to the number of times.

Therefore, in this embodiment, when it is known that it is difficult to set a threshold value of the memory cell transistor MT to a target value with a programming performed at least once, and when it is known that the number of times of programmings which is required at least, verification with respect to the programming is skipped. The reason for this is because even when performing the verification, it is sure to fail in the verification. According to this, it is not necessary to perform a useless verification operation, and thus it is possible to improve a writing operation speed.

In addition, in the above-described example, the skipping of verification is applied to the writing of the "E" level, but the skipping of verification is applicable to the writing of the "LMp", "LMn", "Ap", "Bp", "Cp", "An", "Bn", and "Cn" levels.

8. Eighth Embodiment

Next, a memory system according to an eighth embodiment will be described. In this embodiment, the configuration of the memory cell array 111 according to the first to seventh embodiments is modified. Hereinafter, a difference from the first to seventh embodiments will be described.

8.1 With Respect to Configuration of Memory Cell Array

Figure 58:
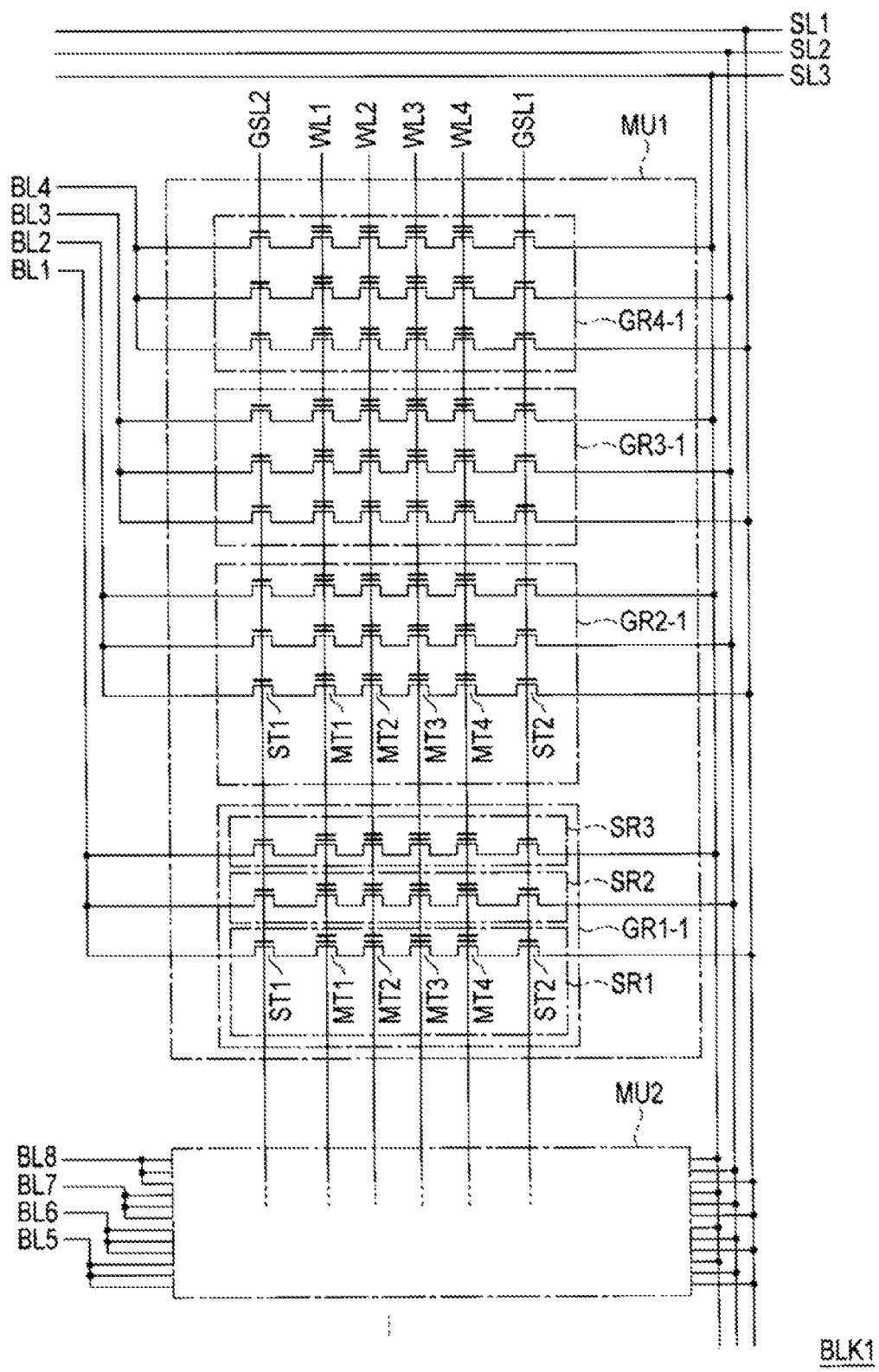
FIG. 58 is a circuit diagram of a memory cell array 111 according to an eighth embodiment.

FIG. 58 is a circuit diagram of a memory cell array 111 according to this embodiment, and illustrates a configuration in an arbitrary one block. As illustrated in the drawing, the memory cell array 111 includes a plurality of memory units MU (MU1, MU2) in each block BLK. In FIG. 58, only two memory units MU are illustrated, but three or more memory units MU are possible, and the number of the memory units MU is not limited.

Each of the memory units MU includes, for example, four string groups GR (GR1 to GR4). The number of the string groups GR is also not limited to four, and may be three or less or five or greater. In addition, when the memory units MU1 and MU2 are distinguished from each other, the string groups GR of the memory unit MU1 are referred to as GR1-1 to GR4-1, and the string groups GR of the memory unit MU2 are referred to as GR1-2 to GR4-2.

Each of the string groups GR includes, for example, three NAND strings SR (SR1 to SR3). The number of the NAND strings SR is also not limited to three, and may be four or greater. Each of the NAND strings SR includes the selection transistors ST1 and ST2, and four memory cell transistors MT (MT1 to MT4). The number of the memory cell transistor MT is not limited to four, and may be five or greater or three or less. The memory cell transistors MT are connected in series between a source of the selection transistor ST1 and a drain of the selection transistor ST2.

The three NAND strings SR1 to SR3 in each of the string groups GR are sequentially stacked on an upper side of a semiconductor substrate, and the NAND string SR1 is formed at a lowest layer, and the NAND string SR2 is formed at an intermediate layer, and the NAND string SR3 is formed at an uppermost layer. In addition, gates of selection transistors ST1 are commonly connected to a selection gate line GSL2, and gates of the selection transistors ST2 are commonly connected to a selection gate line GSL1. In addition, control gates of the memory cell transistors MT which are located at the same column are connected to the same word line WL. In addition, drains of the three selection transistors ST1 in an arbitrary string group GR are commonly connected to a bit line BL, and sources of the selection transistors ST2 are connected to source lines SL different from each other.

For example, when attention is given to the memory unit MU1, drain ends of the NAND strings SR1 to SR3 in the string group GR1-1 are commonly connected to a bit line BL1, and source ends thereof are connected to source lines SL1 to SL3, respectively. In addition, drain ends of the NAND strings SR1 to SR3 in the string group GR2-1 are commonly connected to a bit line BL2, and source ends thereof are connected the source lines SL1 to SL3, respectively. In addition, drain ends of the NAND strings SR1 to SR3 of the string group GR3-1 are commonly connected to a bit line BL3, and source ends thereof are connected to the source lines SL1 to SL3, respectively. Similarly, drain ends of the NAND strings SR1 to SR3 in the string group GR4-1 are commonly connected to a bit line BL4, and source ends thereof are connected to the source lines SL1 to SL3, respectively.

This connection relationship is true of the memory unit MU2, and drains end of the string groups GR1-2 to GR4-2 are connected to bit lines BL5 to BL8, respectively. On the other hand, source ends of the NAND strings SR1 to SR3 of the string groups GR1-2 to GR4-2 are connected to the source lines SL1 to SL3, respectively.

Accordingly, the number of bit lines BL corresponding to each memory unit MU corresponds to a total number of the string groups GR which are included in one memory unit MU.

In the above-described configuration, in the NAND string SR which is selected one by one from each memory unit MU, an assembly of a plurality of the memory cell transistors MT, which are connected to the same word line WL, becomes a unit called "page". In addition, writing and reading of data are performed for each page unit.

Figure 59:
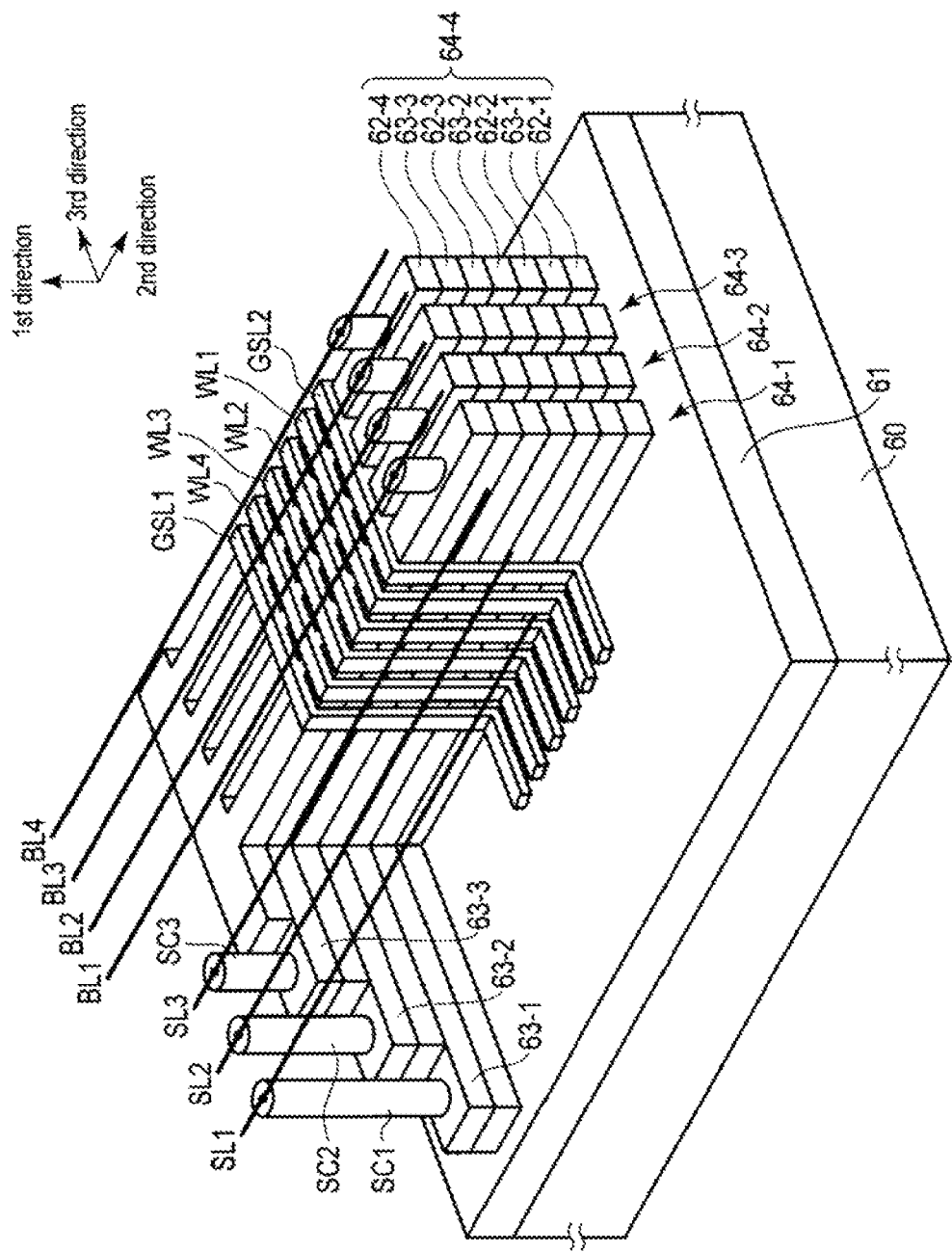
FIG. 59 is a perspective view of a memory unit MU according to the eighth embodiment.
Figure 60:
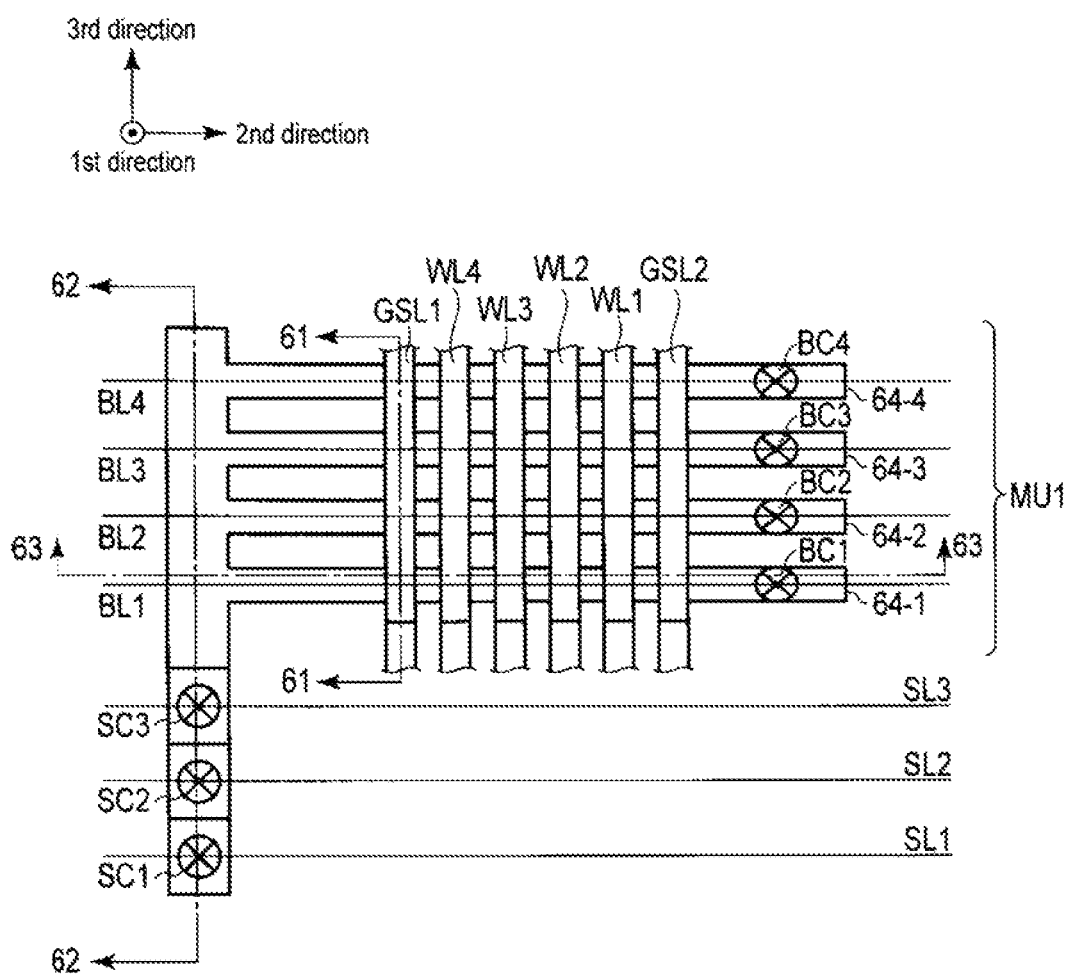
FIG. 60 is a plan view of a memory cell array according to the eighth embodiment.
Figure 62:
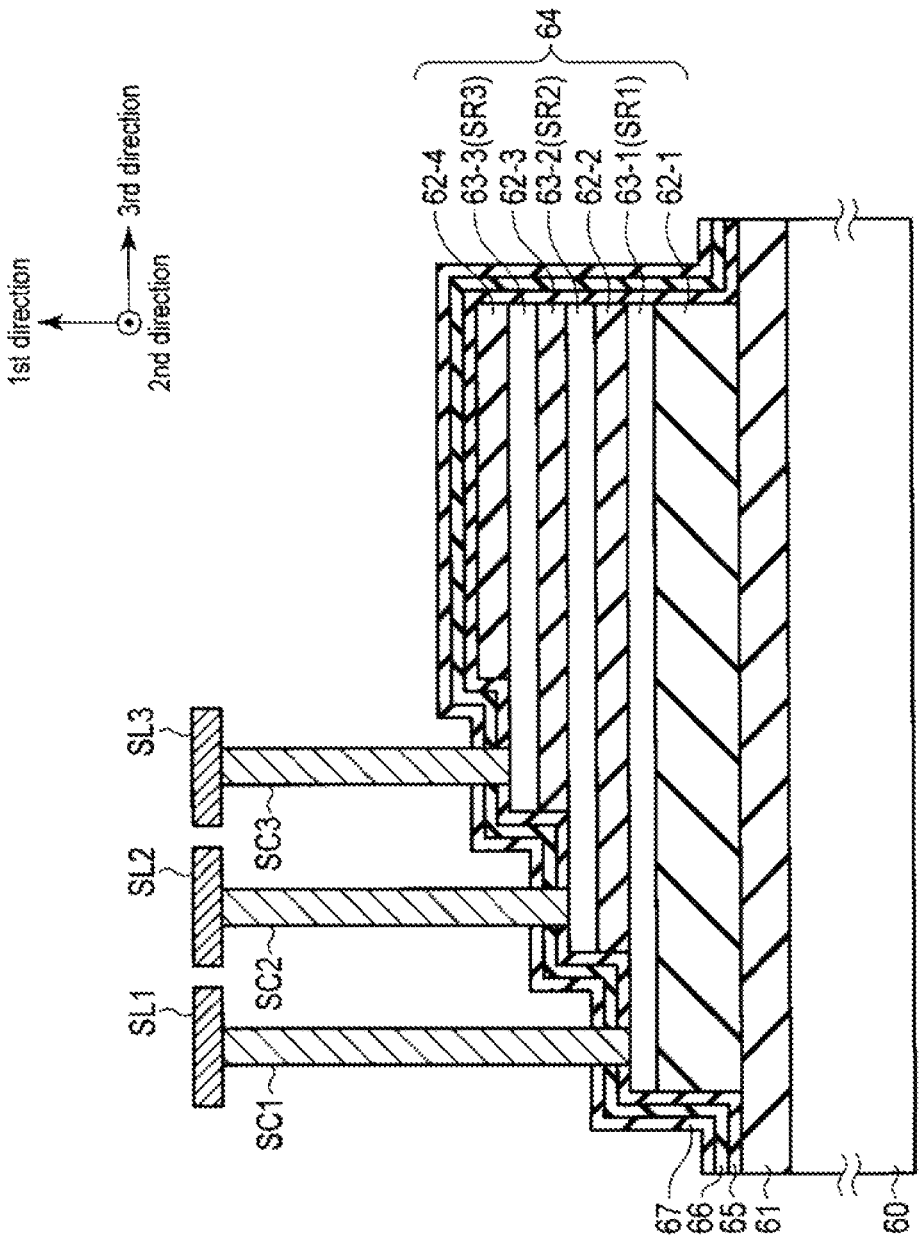
FIG. 62 is a cross-sectional view taken along line 58-58 in FIG. 60.
Figure 63:
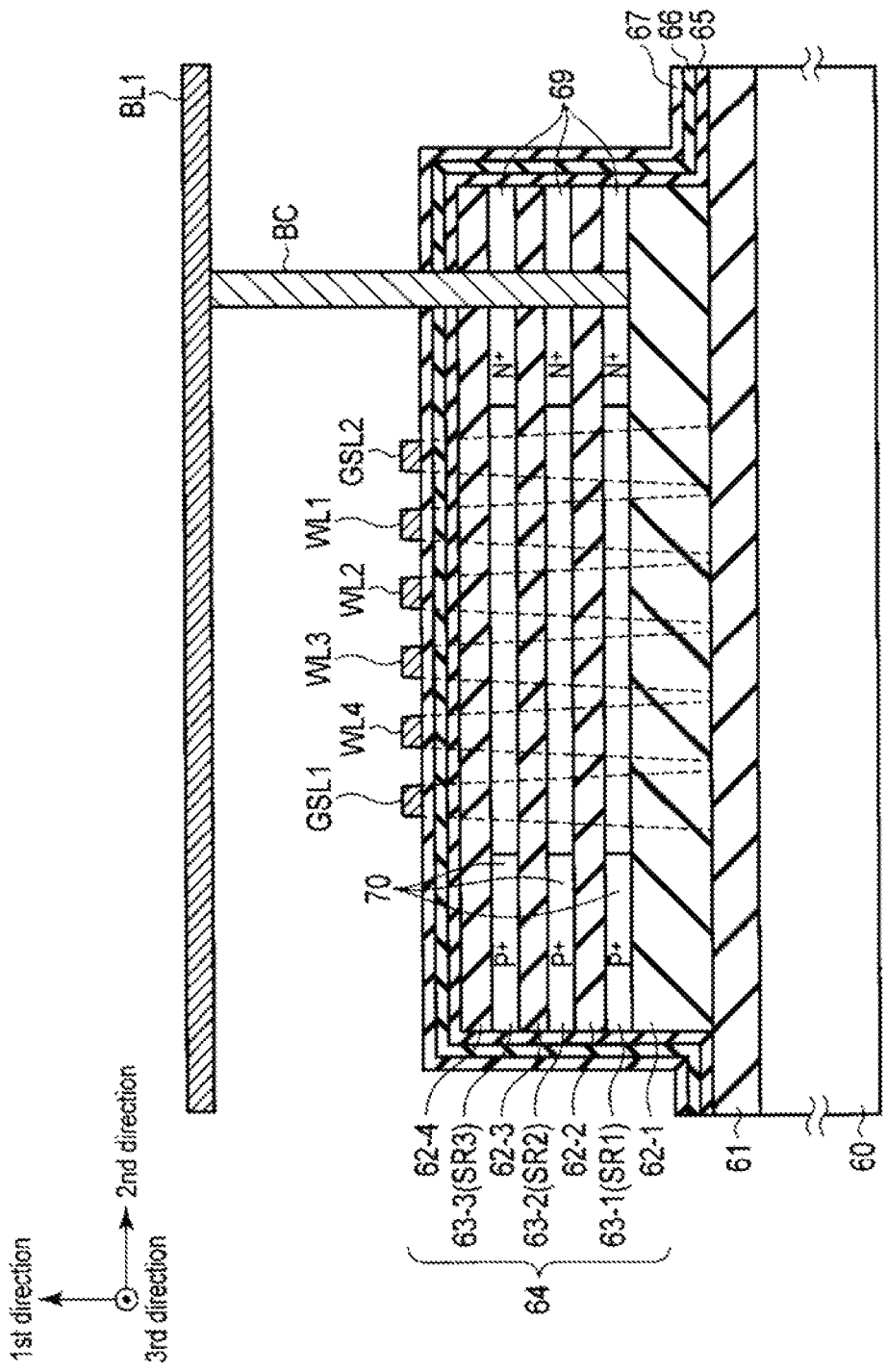
FIG. 63 is a cross-sectional view taken along line 59-59 in FIG. 60.

FIG. 59 is a perspective view of the memory unit MU. In addition, FIG. 60 is a plan view of the memory unit MU, FIG. 61 is a cross-sectional view taken along line 61-61 in FIG. 60, FIG. 62 is a cross-sectional view taken along line 62-62 in FIG. 60, and FIG. 63 is a cross-sectional view taken along line 63-63 in FIG. 60.

As illustrated in the drawings, an insulating film 61 is formed on a semiconductor substrate 60, and the memory cell array 111 is formed on the insulating film 61.

For example, four pin-type structures 64 (64-1-to 64-4), which have a strip shape along a second direction perpendicular to a first direction that is a vertical direction with respect to a surface of the semiconductor substrate 60, are formed on the insulating film 61, and thus one memory unit MU is formed. Each of the pin-type structures 64 includes insulating films 62 (62-1 to 62-4) and semiconductor layers 63 (63-1 to 63-3) which are alternately stacked. Each of the pin-type structures 64 corresponds to the string group GR illustrated in FIG. 58. In addition, the semiconductor layer 63-1 on the lowest layer corresponds to a current path (region in which a channel is formed) of the NAND string SR1, the semiconductor layer 63-3 on the uppermost layer corresponds to a current path of the NAND string SR3, and the semiconductor layer 63-2 positioned between the semiconductor layers 63-1 and 63-3 corresponds to a current path of the NAND string SR2.

Figure 61:
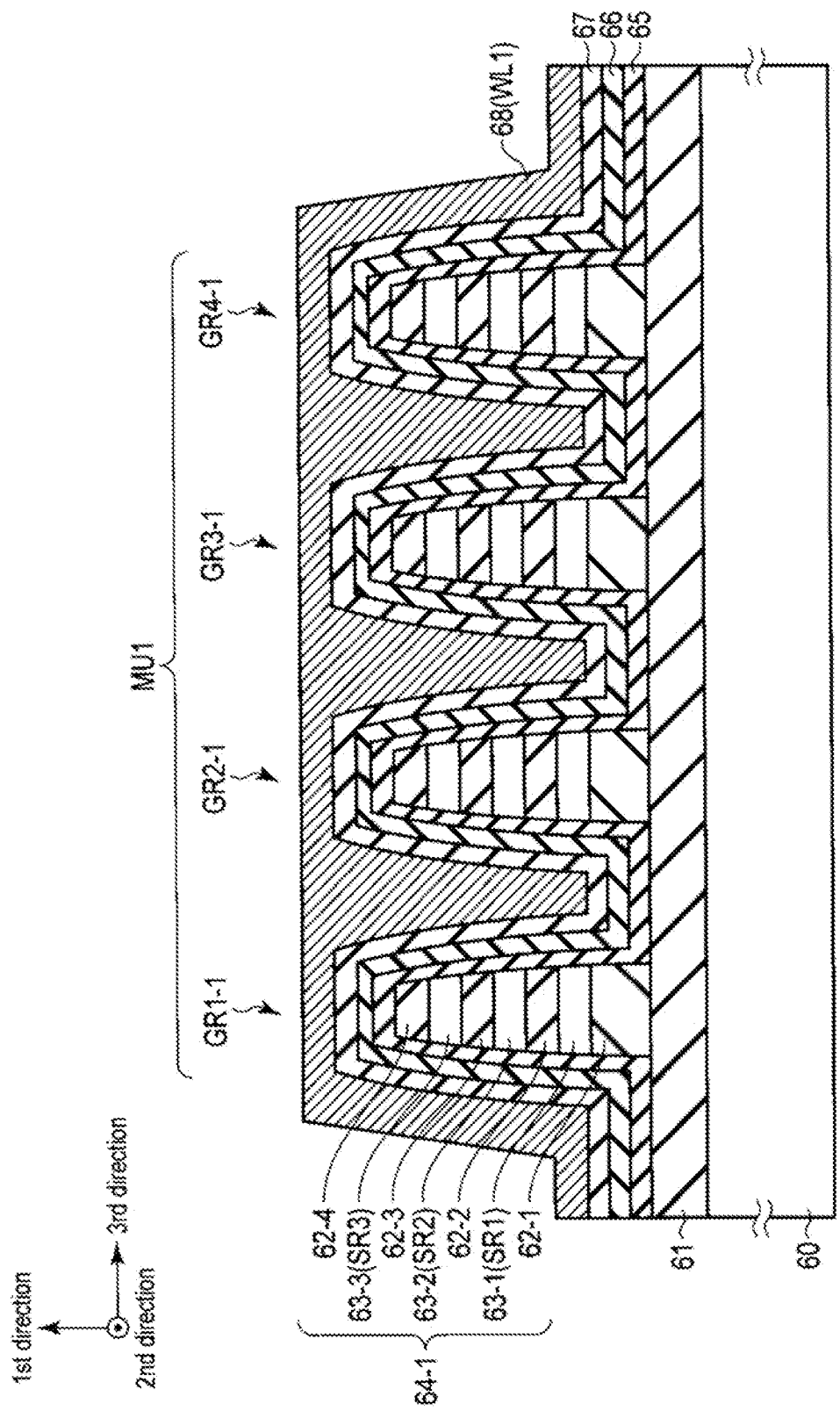
FIG. 61 is a cross-sectional view taken along line 57-57 in FIG. 60.

A tunnel insulating film 65, a charge storage layer 66, a block insulting film 67, and a conductive film 68 are sequentially formed on an upper surface and a side surface of the pin-type structure 64 (refer to FIG. 61). The charge storage layer 66 is configured with, for example, an insulating film. In addition, the conductive film 68 is formed from, for example, metal, and functions as a word line WL, and selection gate lines GSL1 and GSL2. The word line WL and the selection gate line GSL1 and GSL2 are formed to stride over a plurality of the pin-type structures 64 between a plurality of memory units MU.

As illustrated in FIGS. 59 and 60, in the configuration according to this embodiment, ends on one side of the plurality of pin-type structures 64 are led out to an end of the memory cell array 111, and are connected to the bit lines BL, respectively, in the led-out region. Ends on the other side of the plurality of pin-type structure 64 are commonly connected to each other, and are connected to the source line SL.

More specifically, each of contact plugs BC1 to BC4, which penetrates through each of the semiconductor layers 63-1 to 63-3 and comes into contact with each of the semiconductor layers 63-1 to 63-3, is formed on one end side of each of the pin-type structures 64-1 to 64-4. In addition, the bit lines BL1 to BL4 are connected to the bit line contact plugs BC1 to BC4, respectively (refer to FIG. 63).

On the other hand, the semiconductor layers 63-1 to 63-3 are led out in a step-like shape on the other end side of each of the pin-type structures 64-1 to 64-4. In addition, source line contact plugs SC1 to SC3 are formed on upper surfaces of the semiconductor layers 63-1 to 63-3, respectively, and are connected to the source lines SL1 to SL3, respectively (refer to FIG. 62).

In addition, as illustrated in FIG. 63, both an $N^+$-type diffusion layer 69 and a $P^+$-type diffusion layer 70 are formed in each of the semiconductor layers 63-1 to 63-3. More specifically, the $N^+$-type diffusion layer 69 function as a drain region of the selection transistor ST1. In addition, the bit line contact BC is provided to penetrate through the $N^+$-type diffusion layer 69 and come into contact with the $N^+$-type diffusion layer 69. On the other hand, the $P^+$-type diffusion layer 70 functions as a source region of the selection transistor ST2. In addition, the source line contact SC is provided on the $P^+$-type diffusion layer 70 in each of the semiconductor layers 63-1 to 63-3.

8.2 With Respect to Voltage During Writing

Next, a voltage of each wiring during a writing operation according to this embodiment will be described. An overall flow of the writing operation according to this embodiment is the same as that in the first embodiment, and a flow chart thereof is the same as those illustrated in FIGS. 10 and 11. In the configuration according to this embodiment, differently from the first embodiment, the $N^+$-type diffusion layer 69 is formed on a bit line side, and the $P^+$-type diffusion layer 70 is formed on a source line side. According to this, voltages which are applied to the bit line BL, the source line SL, and the selection gate lines GSL1 and GSL2 during the writing operation are different from those in the first embodiment. Hereinafter, only a difference from the first embodiment will be described.

8.2.1 With Respect to Voltage During Positive-Mode Programming

Figure 64:
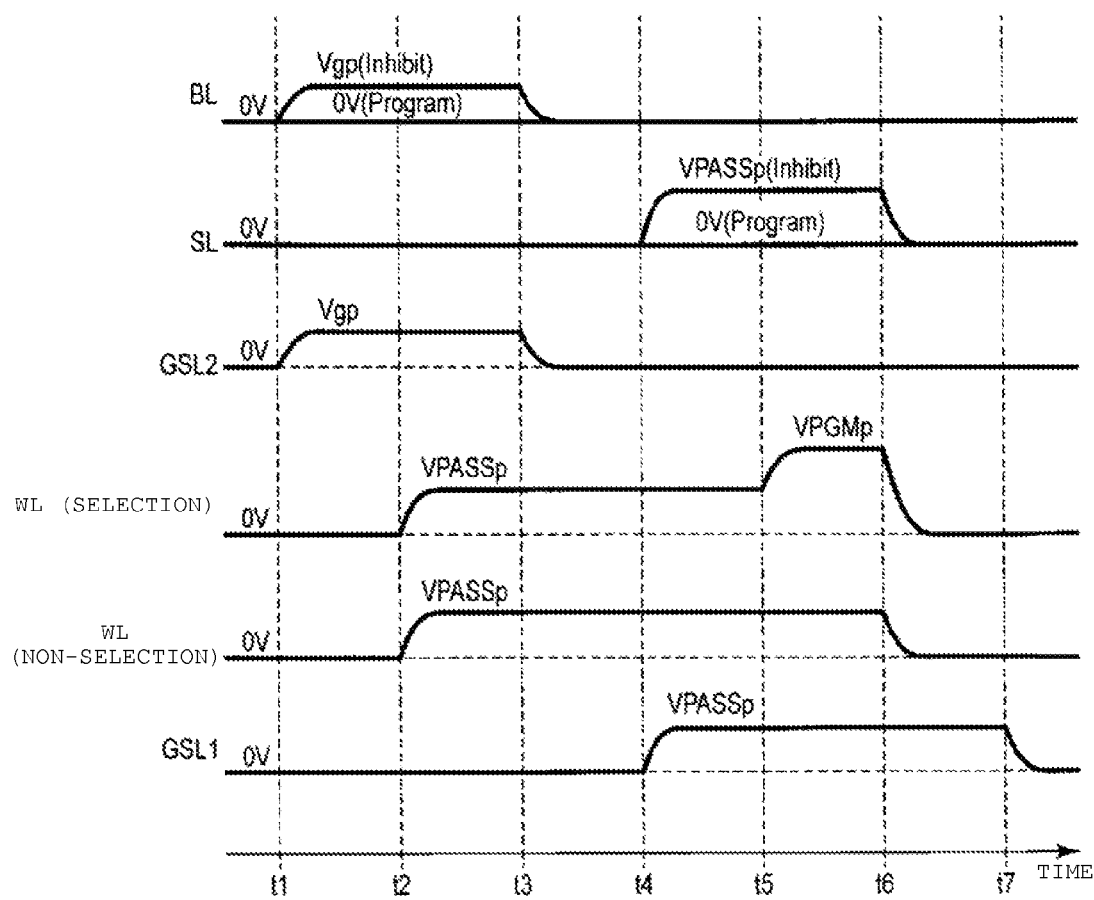
FIG. 64 is a timing chart illustrating a potential of each wiring during a positive-mode programming according to the eighth embodiment.

First, a voltage relationship between wirings during the positive-mode programming according to this embodiment will be described. FIG. 64 is a timing chart illustrating a potential of each wiring during the positive-mode programming.

As illustrated in the drawing, first, at time t1, the row decoder 112 applies Vgp (for example, 3.3 V) to the selection gate line GSL2. Vgp is a positive voltage that is applied to the selection gate line GSL1 or GSL2 to turn on the selection transistors ST1 and ST2 when the selection transistors ST1 and ST2 operate as an N-channel transistor during a programming. In addition, the sense amplifier 113 applies, for example, 0 V to a bit line BL corresponding to a memory cell transistor MT that becomes a programming target, and applies Vgp (for example, 3.3 V), which has the same potential as that of the selection gate line GSL2, to a bit line BL corresponding to a memory cell transistor MT that is not the programming target. According to this, a selection transistor ST1 corresponding to the bit line BL that is the programming target is turned on, and a selection transistor ST1 corresponding to a bit line BL that is not the programming target is turned off.

Next, at time t2, the row decoder 112 applies VPASSp (for example, 7 V) to all word lines WL. According to this, in an NAND string SR corresponding to the bit line BL that is the programming target, the selection transistor ST1 is in an on-state, and thus a charge is supplied to the semiconductor layer 63. Accordingly, an N-channel is formed in the memory cell transistors MT1 to MT4, and the selection transistor ST1, and the transistors operate as an N-channel transistor. On the other hand, in the NAND string corresponding to the bit line BL that is not the programming target, the selection transistor ST1 is in an off-state, and thus a charge is not supplied to the semiconductor layer 63.

Next, at time t3, the row decoder 112 applies 0 V to the selection gate line GSL2, and the sense amplifier 113 applies 0 V to all bit lines BL. According to this, the selection transistor ST1 is turned off.

Next, at time t4, the row decoder 112 applies VPASSp (for example, 7 V) to the selection gate line GSL1. In addition, the source line driver 114 applies, for example, 0 V to the source line SL corresponding to the memory cell transistor MT that becomes the programming target, and applies, for example, VPASSp having the same potential as that of the selection gate line GSL1 to the source line SL corresponding to the memory cell transistor MT that is not the programming target. According to this, the selection transistor ST2 corresponding to the source line SL that is the programming target is turned on, and the selection transistor ST2 corresponding to the source line SL that is not the programming target is turned off.

Next, at time t5, the row decoder 112 applies VPGMp (for example, 20 V) to the selected word line WL. According to this, in the memory cell transistor MT that is the programming target, a potential difference between the selected word line WL and the semiconductor layer 63 increases. Accordingly, a charge is injected into the charge storage layer 66 due to FN tunneling. On the other hand, in the memory cell transistor MT that is not the programming target, the selection transistor ST2 is in an off-state, and thus a potential of the semiconductor layer 63 also increases due to coupling. According to this, even when VPGMp is applied, the potential difference does not vary, and thus a charge is not injected into the charge storage layer 66.

Next, at time t6, the row decoder 112 applies 0 V to all word lines WL, and the source line driver 114 applies 0 V to the source line SL corresponding to the memory cell transistor MT that is not the programming target. According to this, the charge injection due to the FN tunneling is terminated.

Finally, at time t7, the row decoder 112 applies 0 V to the selection gate line GSL1. According to this, the programming is terminated.

8.2.2 With Respect to Voltage During Negative-Mode Programming

Figure 65:
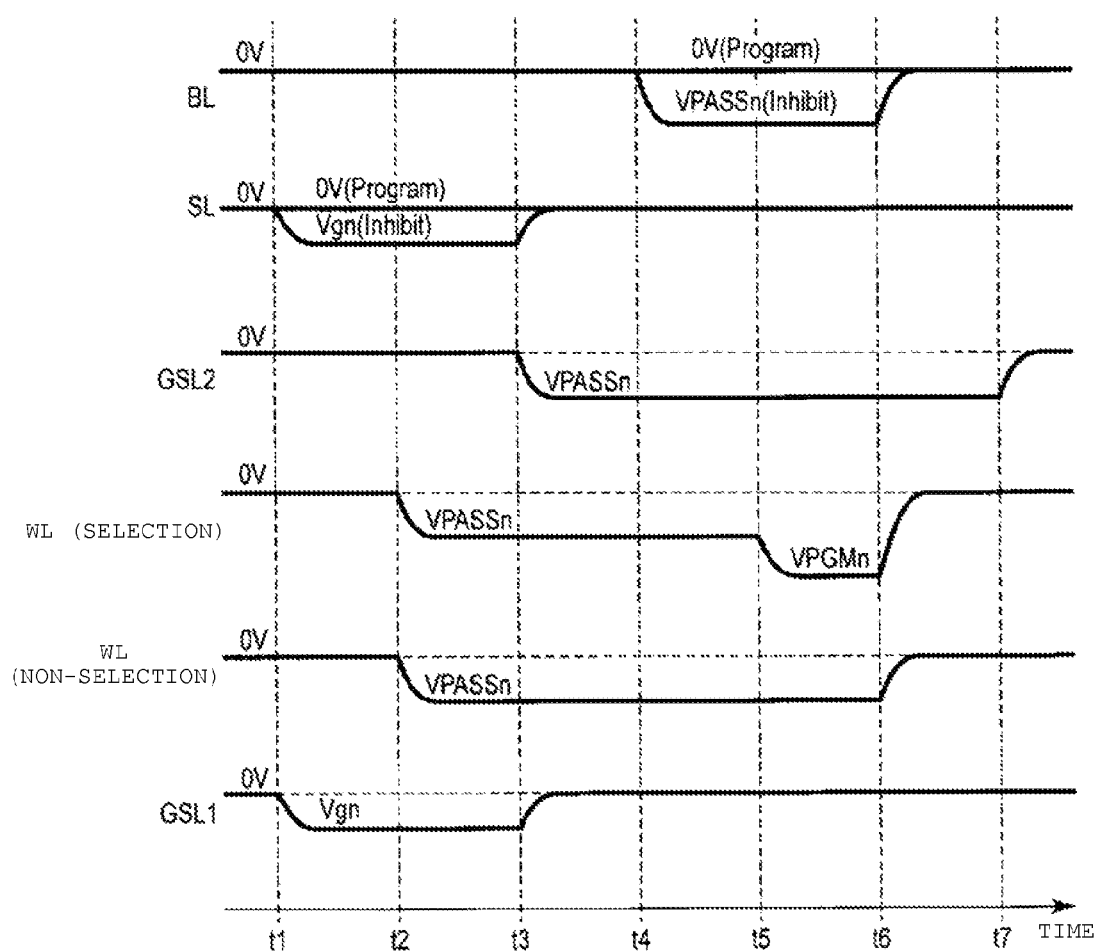
FIG. 65 is a timing chart illustrating a potential of each wiring during a negative-mode programming according to the eighth embodiment.

Next, a voltage relationship between wirings during the negative-mode programming according to this embodiment will be described. FIG. 65 is a timing chart illustrating a potential of each wiring during the negative-mode programming. First, at time t1, the row decoder 112 applies Vgn (for example, −3.3 V) to the selection gate line GSL1. In addition, the source line driver 114 applies, for example, 0 V to a source line SL corresponding to a selected page to turn on a corresponding selection transistor ST2. In addition, the source line driver 114 applies Vgn (for example, −3.3 V) having the same potential as that of the selection gate line GSL1 to a source line SL corresponding to non-section page to turn off a corresponding selection transistor ST2.

Next, at time t2, the row decoder 112 applies VPASSn (for example, −7 V) to all word lines WL. According to this, a hole is supplied to the semiconductor layer 63 of an NAND string SR corresponding to the selected page. Accordingly, a P-channel is formed in the memory cell transistors MT1 to MT4, and the selection transistor ST2, and the transistors operate as a P-channel transistor.

Next, at time t3, the row decoder 112 applies, for example, 0 V to the selection gate line GSL1. In addition, the source line driver 114 applies, for example, 0 V to the source line SL. According to this, the selection transistor ST2 corresponding to a selected page is turned off.

Next, at time t4, the row decoder 112 applies VPASSn (for example, −7 V) to the selection gate line GSL2. In addition, the sense amplifier 113 applies, for example, 0 V to the bit line BL that is the programming target, and applies, for example, VPASSn (for example, −7 V) having the same potential as that of the selection gate line GSL2 to the bit line BL that is not the programming target. According to this, the selection transistor ST1 corresponding to the bit line BL that is the programming target is turned on, and the selection transistor ST1 corresponding to the bit line BL that is not the programming target is turned off.

Next, at time t5, the row decoder 112 applies VPGMn to the selected word line WL. According to this, a hole is injected into the memory cell transistor MT that becomes the programming target (data is written).

Next, at time t6, the sense amplifier 113 applies 0 V to the bit line BL. The row decoder 112 applies 0 V to all word lines WL. According to this, the hole injection is terminated.

Finally, at time t7, the row decoder 112 applies 0 V to the selection gate line GSL2. According to this, the programming is terminated.

8.3 With Respect to Voltage During Reading

Next, a voltage of each wiring during the reading operation according to this embodiment will be described. An overall flow of the reading operation according to this embodiment is the same as in the first embodiment, and a flowchart thereof is the same as that illustrated in FIG. 24. Hereinafter, only a difference from the first embodiment will be described.

8.3.1 With Respect to N-Channel Reading

Figure 66:
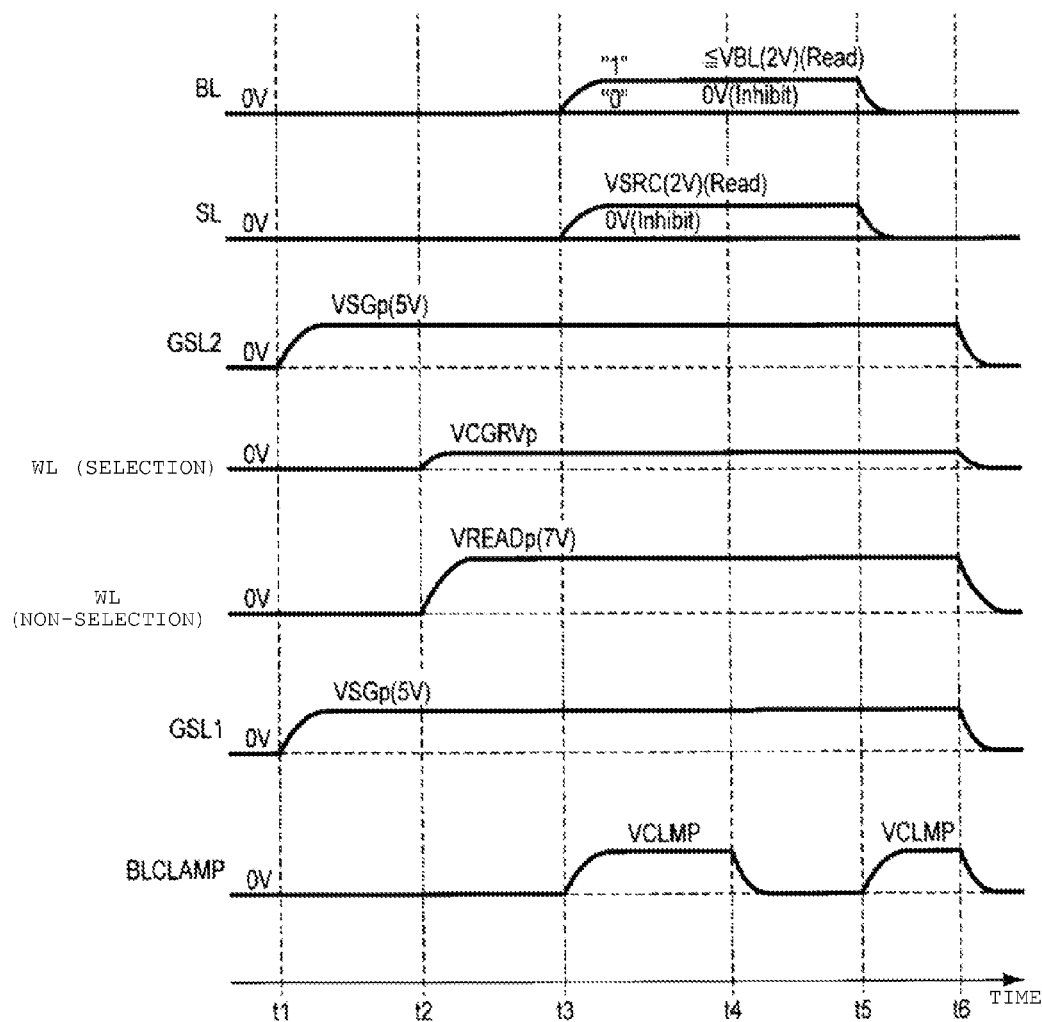
FIG. 66 is a timing chart illustrating a potential of each wiring during N-channel reading according to the eighth embodiment.

First, a voltage relationship between wirings during the N-channel reading according to this embodiment will be described. FIG. 66 is a timing chart illustrating a potential of each wiring during reading. Hereinafter, only a difference from the first embodiment will be described.

As illustrated in the drawing, voltages, which are applied to the selected word line WL, the non-selected word line WL, the selection gate line GSL2 (the same as SGD (selection) in FIG. 26), and the selection gate line GSL1 (the same as SGS in FIG. 26) at time t1 to time t6, are the same as those illustrated at time t1 to time t6 in FIG. 26.

In this state, at time t3, the sequencer 121 applies the voltage VCLMP to the signal line BLCLAMP to turn on the transistor NMOS10. At this time, in the sense amplifier unit illustrated in FIG. 5, the sequencer 121 sets VPRE which is applied to the power supply to, for example, 0 V, and sets the signal line BLPRE to a "H" level to turn on the transistor NMOS11. In addition, the source line driver 114 applies a voltage VSRC (for example, 2 V), which is higher than that of the bit line BL, to the source line SL corresponding to a selected page, and applies 0 V to the source line SL correspond to the non-section page. According to this, when the memory cell transistor MT that is the read target is in on-state ("1" state), a current flows from the source line SL to the bit line BL. Accordingly, the bit line BL enters a state in which a current supplied from a source line side and a current flowing to the sense amplifier side are balanced. At this time, the voltage VBL (for example, 2 V) of the bit line BL having the same potential as that of the source line SL at most. In addition, at this time, the capacitor C of the temporary data cache 434 illustrated in FIG. 5 is charged to the same potential VBL (for example, 2 V) as that of the bit line BL at most. In addition, when the memory cell transistor MT that is a read target is in an off state ("0" state), a current is not supplied from a source line side, and thus the bit line BL becomes 0 V.

Next, at time t4, the sequencer 121 applies 0 V to the signal line BLCLAMP. At this time, 0 V is also applied to the signal line BLPRE. In addition, the sequencer 121 senses a voltage of the bit line BL and the capacitor C, and performs determination of whether the state is "0" or "1".

Next, at time t5, the source line driver 114 applies 0 V to the source line SL. In addition, the sequencer 121 applies VCLMP to the signal line BLCLAMP to turn on the transistor NMOS11. At this time, the sequencer 121 sets the signal line BLPRE to the "H" level, and also turns on the transistor NMOS11. In this case, a current flows to a power supply side that applies VPRE (for example, 0 V), and the bit line BL and the capacitor C are discharged.

Next, at time t6, the sequencer 121 applies 0 V to the signal line BLCLAMP (and the signal line BLPRE). According to this, reading of data is completed.

In addition, here, description is made with respect to data reading performed once, but the data reading is performed plural times, for example, when multi-value data is read. In this case, the processes at time t3 to t6 are repeated, and VCGRVp is set to a different voltage. According to this, it is possible to countermeasure reading of a different value.

In addition, in this example, description is made with respect to a case where the signal line BLPRE of the sense amplifier unit is set to the "H" level at time t3 to time t4, and a current is allowed to flow to the power supply that applies VPRE (for example, 0 V), but the signal line BLPRE may be set to the "L" level, and the transistor NMOS11 may be allowed to enter an off-state. Even in this case, the capacitor C is charged with VBL (for example, 2 V).

8.3.2 With Respect to P-Channel Reading

Figure 67:
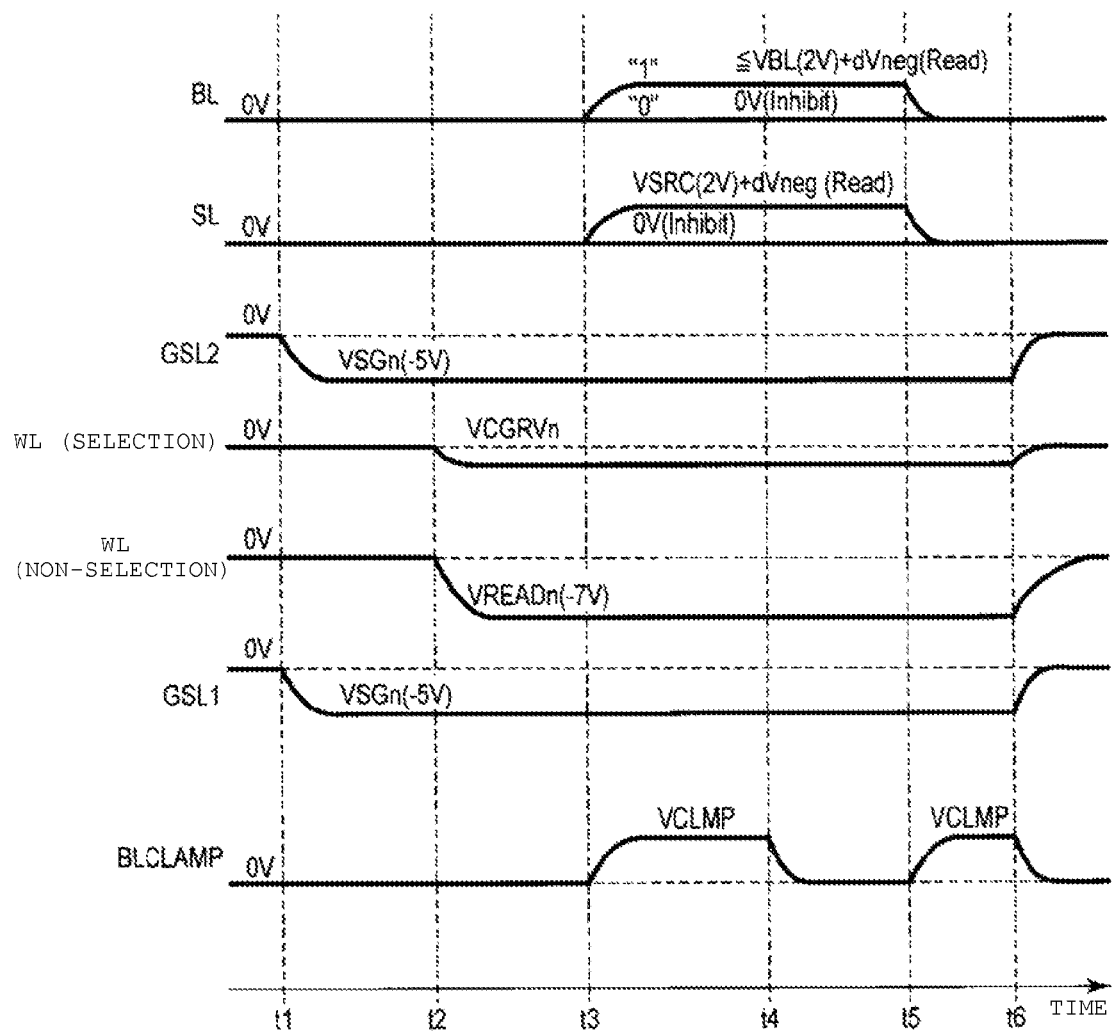
FIG. 67 is a timing chart illustrating a potential of each wiring during P-channel reading according to the eighth embodiment.

Next, a voltage relationship between wirings during the P-channel reading according to this embodiment will be described. FIG. 67 is a timing chart illustrating a potential of each wiring during reading. Hereinafter, only a difference from the first embodiment and the first example will be described.

As illustrated in the drawing, voltages, which are applied to the selected word line WL, the non-selected word line WL, the selection gate line GSL2 (the same as SGD (selection) in FIG. 27), and the selection gate line GSL1 (the same as SGS in FIG. 27) at time t1 to time t6, are the same as those illustrated at time t1 to time t6 in FIG. 27. In addition, voltages, which are applied to the bit line BL, the source line SL, and the signal line BLCLAMP, are the same as those at time t1 to time t6 in FIG. 66.

8.4 Effect According to this Embodiment

Even in the memory cell array having the configuration according to this embodiment, the same effect as in the first to seventh embodiment is obtained.

9. Ninth Embodiment

Next, a memory system according to a ninth embodiment will be described. This embodiment relates to a data erasing operation in the first to eighth embodiments. The erase operation in this embodiment represents an operation of unifying threshold values of all memory cell transistors MT of an erase target block to the negative type or the positive type.

Figure 68:
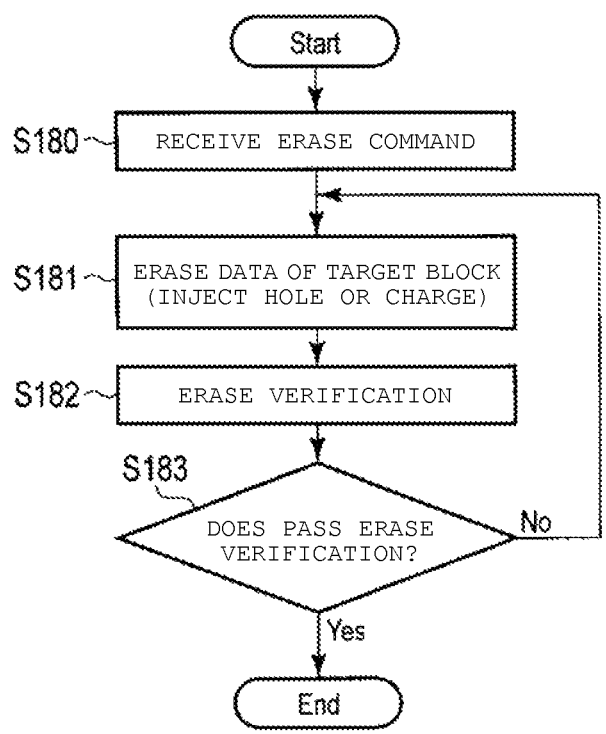
FIG. 68 is a flowchart illustrating an erase operation flow according to a ninth embodiment.

In the first to eighth embodiments, writing of data is repeated, and thus memory cell transistors MT having threshold values of the negative type or the positive type are present together in one block. Therefore, in this embodiment, the threshold values of all memory cell transistors MT in the erase target block are set to negative type by performing hole injection. Alternatively, the threshold values of all memory cell transistors MT are set to the positive type by performing charge injection. Hereinafter, only a difference from the first to eighth embodiments will be described. 9.1 With Respect to Flow of Erasing Operation FIG. 68 is a flowchart illustrating an erase operation flow in the NAND type flash memory 100.

As illustrated in the drawing, first, the sequencer 121 receives an erase command from the controller 200 (step S180). When receiving the erase command, the sequencer 121 performs erasing with respect to a target block. That is, the sequencer 121 injects a hole or charge to all memory cell transistors MT (step S181).

Next, the sequencer 121 performs erase verification. The erase verification is a verification operation of determining whether or not erasing is completed. In this embodiment, for example, in a case of injecting a hole into each of the memory cell transistors MT, when the threshold value of the memory cell transistor MT is smaller than AVHp, the sequencer 121 determines that it passes the erase verification, and when the threshold value is greater than AVHp, the sequencer 121 determines that it fails in the erase verification. In addition, for example, in a case of injecting a charge into the memory cell transistor MT, when the threshold value of the memory cell transistor MT is greater than AVHn, the sequencer 121 determines that it passes the verification, and when the threshold value is less than AVHn, the sequencer 121 determines that it fails in the verification (step S182).

Next, when failing in the erase verification (No in step S183), returning to step S181, and erasing is performed again. Hereinafter, a series of operations including the data erase and erase verification is referred to as an erase loop. The erase loop is repeated before passing the erase verification or until reaching an upper limit number of times which is set in advance.

When passing the erase verification (Yes in step S183), the sequencer 121 determines that the erase operation is completed.

In addition, when the erase operation is normally completed, the CPU 230 of the controller 200 updates the write situation table of the built-in memory 220. For example, in a case of injecting a hole into the memory cell transistor MT, the CPU 230 updates the type information to the negative type, and in a case of injecting a charge into the memory cell transistor MT, the CPU 230 updates the type information to the positive type. In addition, the CPU 230 updates information indicating validity of data to "Invalid". In this case, when executing the programming next time, a programming mode is determined based on the type information of the threshold value.

Alternatively, for example, the CPU 230 may erase the type information of the threshold value of a corresponding block with the erase operation. That is, when executing the programming next time, if the type information is not present in the write situation table, the sequencer 121 preferentially executes a programming that is set in advance. According to this, during the erase operation, the sequencer 121 selects either the hole injection or the charge injection in order for a threshold value type to correspond to the programming that is set to be preferentially executed. Specifically, in a case where the positive-mode programming is set to be preferentially executed, the sequencer 121 injects a hole during erasing in order for the threshold value to be negative type. In addition, in a case where the negative-mode programming is set to be preferentially executed, the sequencer 121 injects a charge during the erasing in order for the threshold value to be the positive type.

9.2 With Respect to Voltage During Erase Operation

Figure 69:
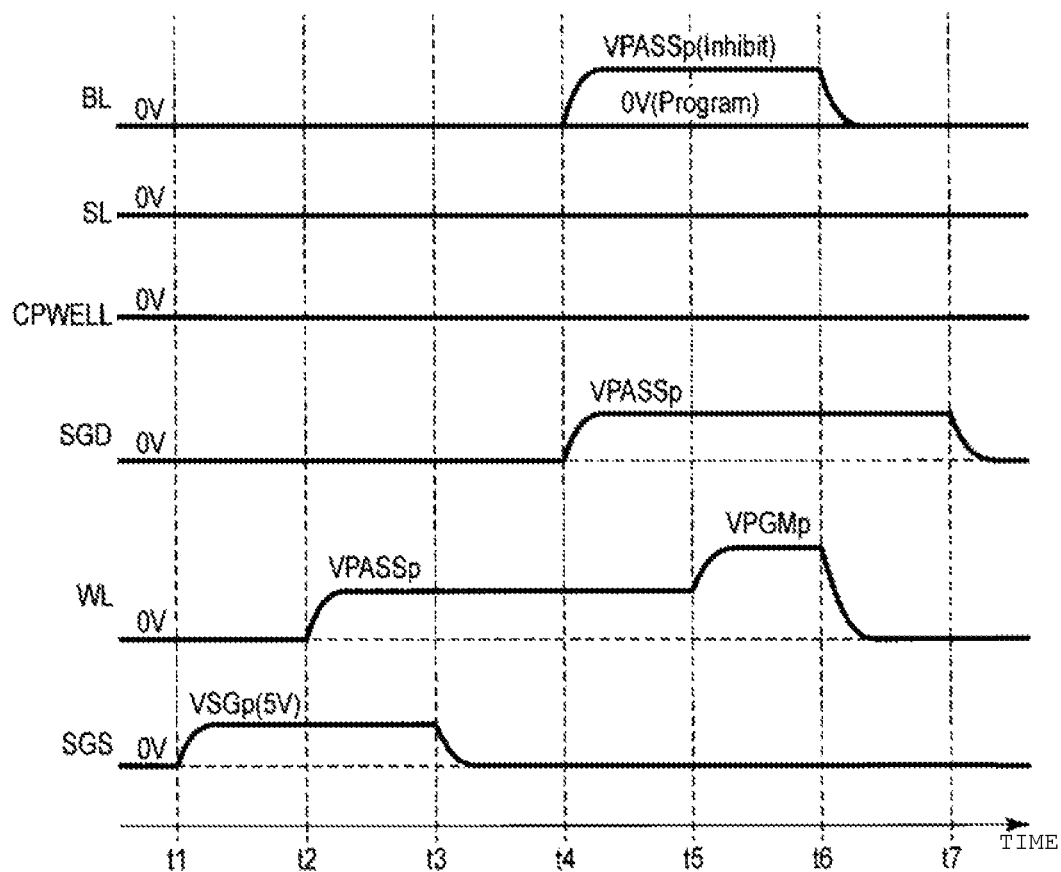
FIG. 69 is a timing chart illustrating a potential of each wiring in a case where a charge is injected into a memory cell transistor of a target block according to the ninth embodiment.
Figure 70:
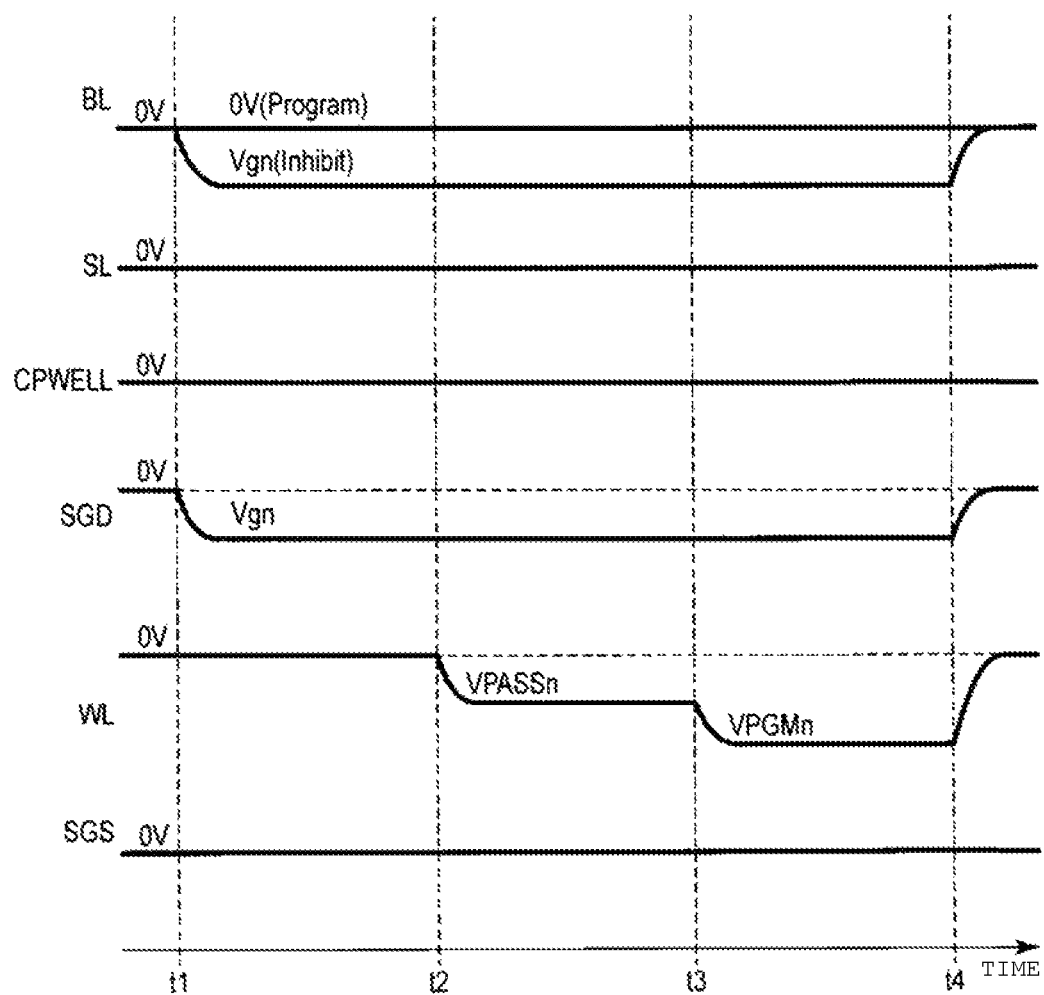
FIG. 70 is a timing chart illustrating a potential of each wiring in a case where a hole is injected into the memory cell transistor of the target block according to the ninth embodiment.

Next, a voltage of each wiring during the erase operation according to this embodiment will be described. FIGS. 69 and 70 timing charts illustrating the potential of the wiring in a case of injecting a charge or a hole into all memory cell transistors MT of the target block. In FIG. 69, all selection gate lines SGD and all word lines WL are selected as a target in the positive-mode programming illustrated in FIG. 18. In addition, in FIG. 70, all selection gate line SGD and all word lines WL are selected as a target during the negative-mode programming illustrated in FIG. 21.

9.3 Effect According to this Embodiment

The configuration according to this embodiment is applicable to the first to eighth embodiments.

In addition, the erase operation according to this embodiment is applied, it is possible to unify the threshold value type in a block with the positive type or the negative type. Accordingly, when executing a programming with respect to a plurality of pages in an arbitrary block, either the negative-mode programming or the positive-mode programming may be executed, and thus the sequencer 121 may execute the programming without changing a programming mode. Accordingly, it is possible to improve a processing speed of the writing operation.

In addition, the erase operation according to this embodiment, it is not necessary for the erase operation to be performed every times after the writing operation, and for example, the erase operation may be performed for every number of times which are determined at fixed intervals. For example, in an arbitrary block, a specific page may always be a programming target, and thus a situation, in which the number of times of programmings is greatly different between pages, may occur. In this case, when erasing is performed at fixed intervals, it is possible to select a page in which the number of times of writing is small after the erasing. Accordingly, it is possible to reduce a deviation in the number of times of programmings, and thus it is possible to suppress a difference in characteristic variation of the memory cell transistor MT from increasing between pages due to repetition of the programming. Accordingly, it is possible to improve reliability of the writing operation.

In addition, during the erase operation, a hole or a charge is collectively injected into the all memory cell transistors MT of the erase target block, but an erase target may be selected based on type information in the write situation table. Specifically, during erasing, a charge may be injected into only a page in which the type information is the negative type, or a hole may be injected into only a page in which the type information is the positive type.

In addition, writing of the "E" level may be performed after passing the erase verification. Specifically, when the threshold value of the memory cell transistor MT becomes the negative type due to the erasing, the "E"pos programming is executed. In addition, when the threshold value of the memory cell transistor MT is the positive type, the "E"neg programming is executed. According to this, it is possible to set the threshold value of all memory cells to the "E" level.

10. Modification Examples and the Like

The memory system according to the above-described embodiments includes the semiconductor memory device 100 and the controller 200 (FIG. 1). The semiconductor memory device 100 performs the writing operation with either the first writing method and the second writing method (FIGS. 7 and 8). When receiving first data and a first address, and receiving a write instruction from the outside, the controller 200 may output a command, which indicates a writing method corresponding to the first address between the first writing method and the second writing method, to the semiconductor memory device 100 (FIG. 28).

When applying the above-described embodiments, it is possible to provide a memory system in which a processing speed is improved.

In addition, embodiments are not limited to the above-described embodiments, and various modifications may be made.

10.1 First Modification Example

Figure 71:
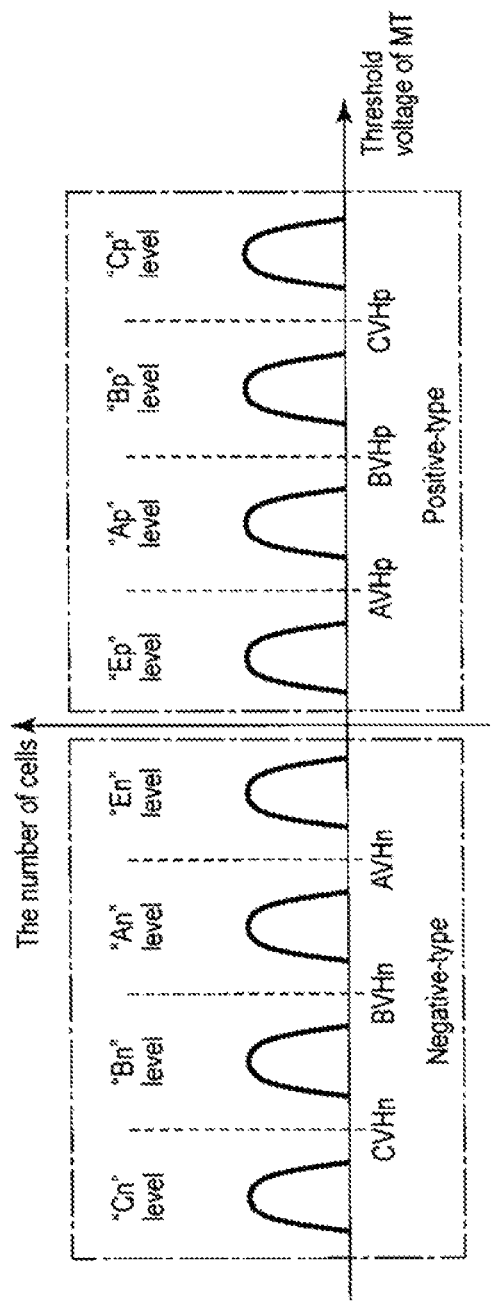
FIG. 71 is a threshold value distribution diagram of a memory cell transistor MT according to a first modification example.

First, a first modification example will be described. In the above-described embodiments, the "E" level may be divided into the positive type and the negative type. FIG. 71 illustrates a threshold value distribution of the memory cell transistor MT in this example. As illustrated in the drawing, the "E" level of the positive type is set to "Ep", and the "E" level of the negative type is set to "En". The "Ep" level has a value that is greater than 0 V and is less than AVHp, and the "En" level has a value that is less than 0 V and is greater than AVHn. In this manner, the "E" level may be separately set to the positive type and the negative type.

Figure 72:
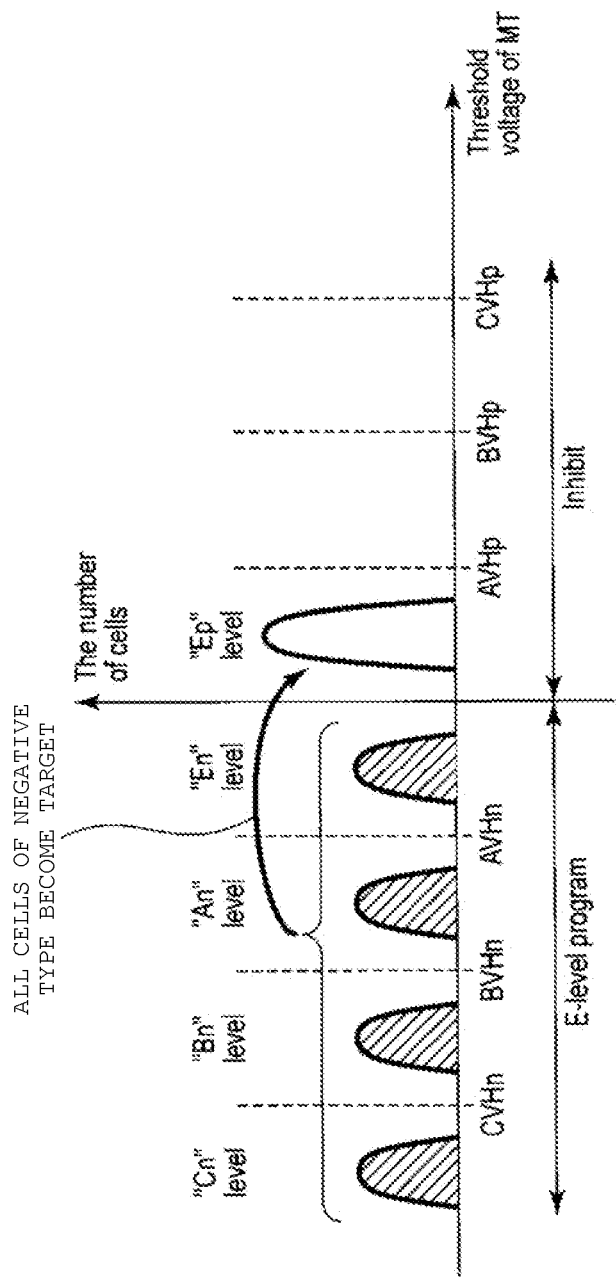
FIG. 72 is a threshold value distribution diagram illustrating an "E"pos programming according to the first modification example.
Figure 73:
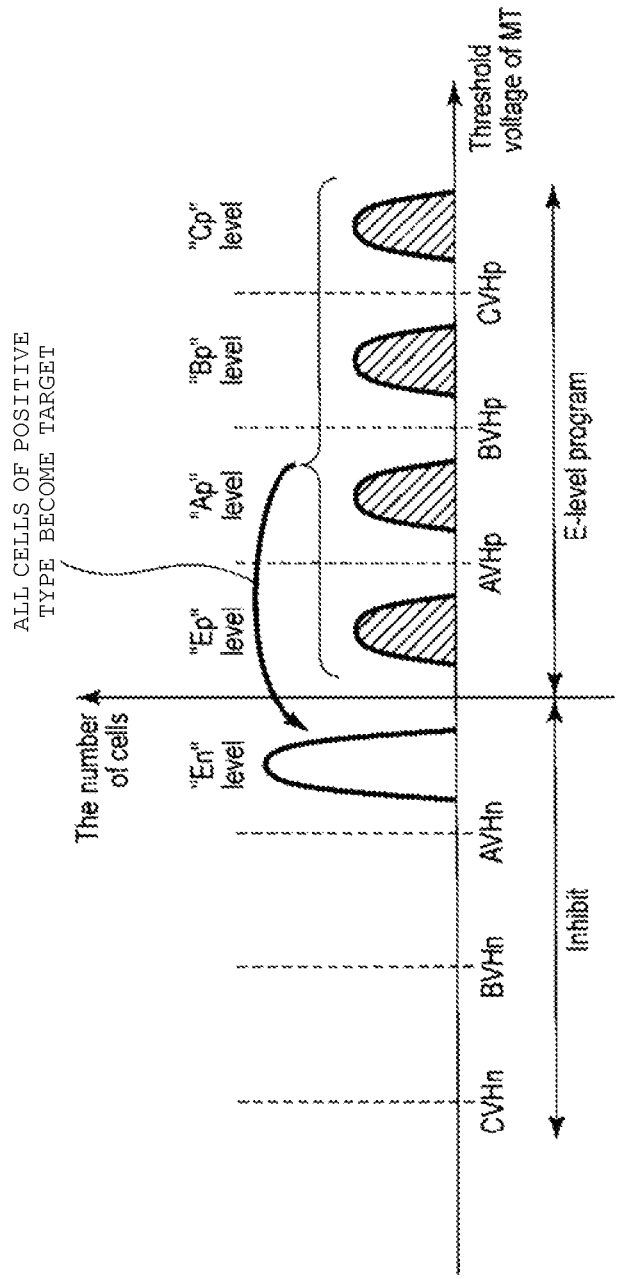
FIG. 73 is a threshold value distribution diagram illustrating an "E"neg programming according to the first modification example.

FIGS. 72 and 73 are threshold value distribution diagrams illustrating an "E"pos programming and an "E"neg programming. As illustrated in FIG. 72, in the case of the "E"pos programming, all memory cell transistors MT, which have a threshold value of the negative type, become a programming target. Accordingly, the negative pre-verification may be omitted. Similarly, as illustrated in FIG. 73, in the case of the "E"neg programming, all memory cell transistors MT, which have a threshold value of the positive type, become a programming target. Accordingly, the positive pre-verification may be omitted.

Specifically, step S105 and step S118 which are illustrated in FIGS. 10, 11, 42 to 44, 56, and 57 may be omitted.

10.2 Second Modification Example

Figure 74:
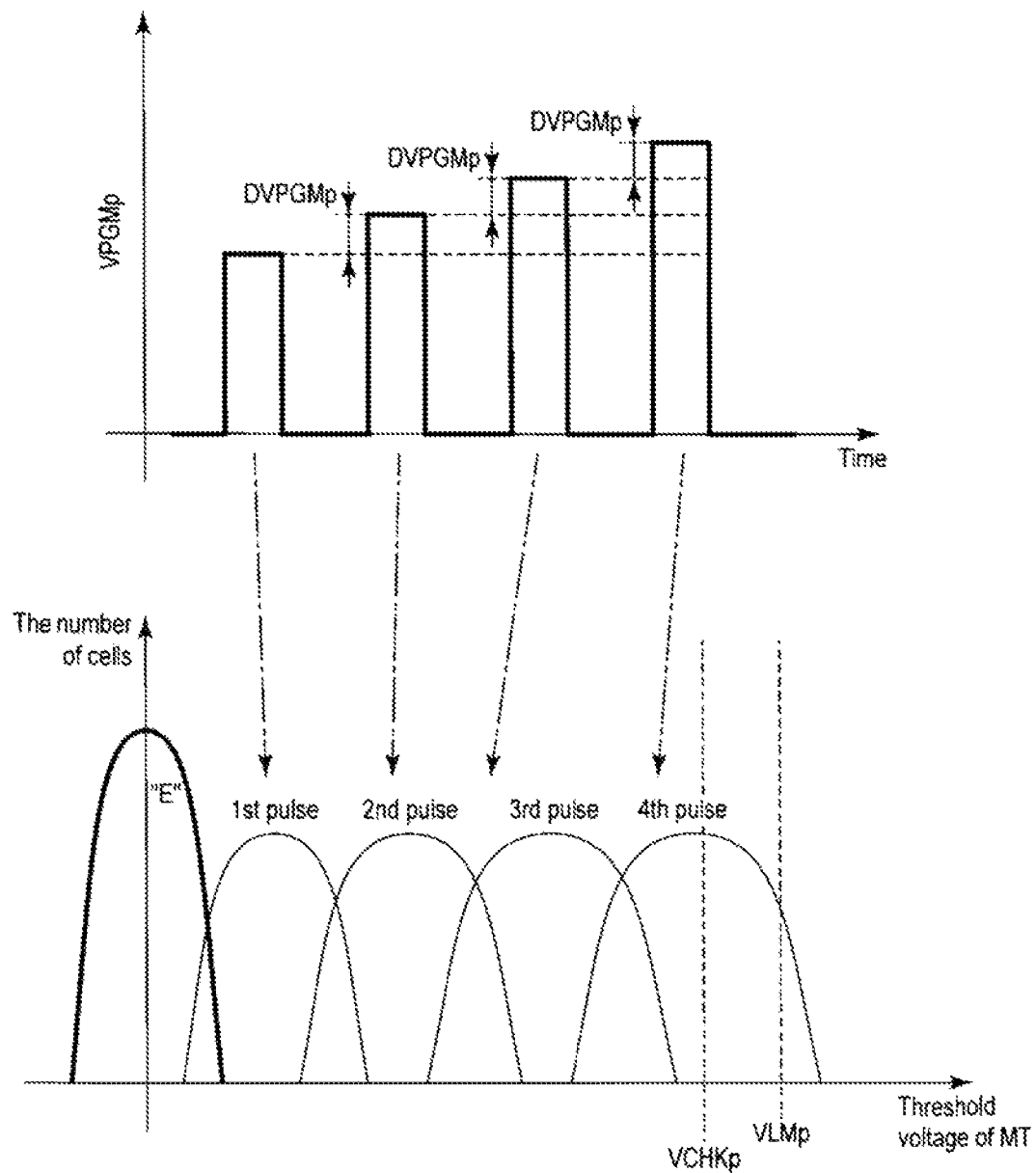
FIG. 74 is a diagram illustrating VPGMp and a variation in a threshold value of a memory cell transistor MT during an "LMp" programming according to the second modification example.

Next, a second modification example will be described. In the above-described embodiments, VPGMp applied during the "Ap" to "Cp" programmings may be corrected by monitoring a step-up width of VPGMp, and the number of memory cell transistors in which the threshold value exceeds VLMp during the "LMp" programming (hereinafter, the corrected VPGMp is referred to as VPGMp_SV). FIG. 74 is a diagram illustrating a voltage value of VPGMp that is applied to the selected word line WL and a variation in a threshold value of the memory cell transistor MT during the "LMp" programming.

As illustrated in the drawing, in this example, a verification level VCHKp that is lower than VLMp is set. In addition, when the number of memory cell transistors in which the threshold value is equal to or greater VCKHp is equal to or greater than a prescribed value, VPGMp_SV is set by using the fourth times of programming loop ($4^{th}$ pulse illustrated in FIG. 74) at that time, a step-up width (DVPGMp×3 (the number of times of programming loops−1)) of VPGMp, the number of memory cell transistors in which the threshold value exceeds VLMp, and the like. For example, when the number of memory cell transistors in which the threshold value is equal to or greater than VLMp is less than the prescribed value, the setting is performed to satisfy a relationship of VPGMp_SV=VPGMp+DVPGMp×3. On the other hand, when the number of the memory cell transistors in which the threshold value is equal to or greater than VLMp is greater than the prescribed value, the setting is performed to satisfy a relationship of VPGMp_SV=VPGMp+DVPGMp×2.5.

Figure 75:
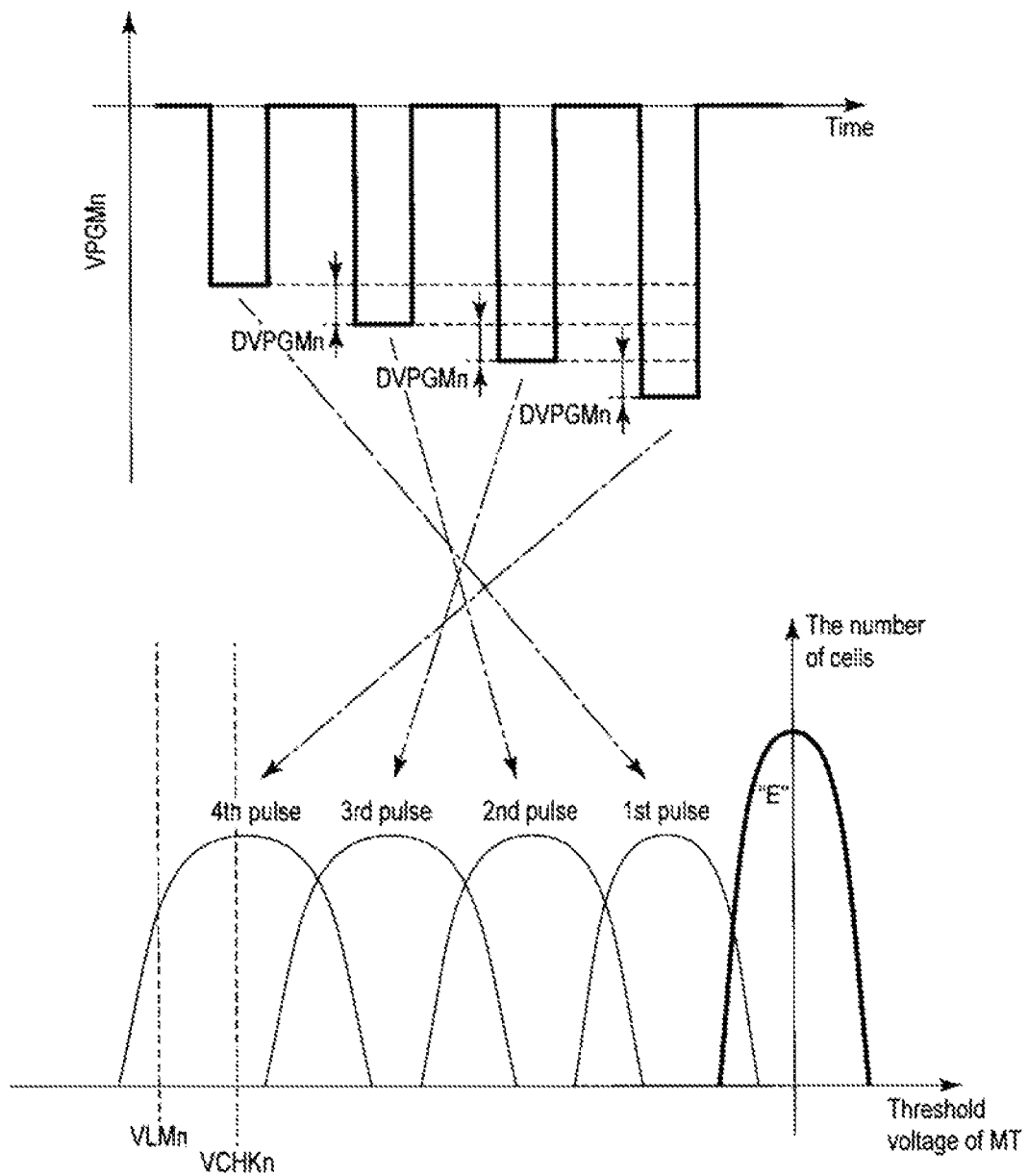
FIG. 75 is a diagram illustrating VPGMn and a variation in a threshold value of the memory cell transistor MT during an "LMn" programming according to the second modification example.

Similarly, VPGMn applied during the "An" to "Cn" programmings may be corrected by monitoring the number of times of programming loops, a step-down width of VPGMn, and the number of memory cell transistors in which the threshold value is equal to or less than VLMn during the "LMn" programming (hereinafter, the corrected VPGMn is referred to as VPGMn_SV). FIG. 75 is a diagram illustrating a voltage value of VPGMn that is applied to the selected word line WL and a variation in a threshold value of the memory cell transistor MT during the "LMn" programming.

As illustrated in the drawing, in this example, a verification level VCHKn that is higher than VLMn is set. In addition, as is the case with the "LMp" programming, when the number of memory cell transistors in which the threshold value is equal to or less than VCKHn is equal to or greater than a prescribed value, VPGMn_SV is set by using the fourth times of programming loop ($4^{th}$ pulse illustrated in FIG. 75) at that time, a step-up width (DVPGMn×3 (the number of times of programming loops−1)) of VPGMn, the number of memory cell transistors in which the threshold value is equal to or less than VLMn, and the like.

In this example, as described above, VPGMp is set to VPGMp_SV and VPGMn is set to VPGMn_SV, and thus it is possible to reduce the number of times of the programming loops. Accordingly, it is possible to improve a processing speed during the writing operation.

In addition, in this embodiment, when obtaining a correction value of VPGMp_SV, three conditions including the number of times of programming loops in a case where the number of memory cell transistors in which the threshold value is equal to or greater than VCHKp is equal or greater than a prescribed number, the step-up width of VPGMp, and the number of memory cell transistors in which the threshold value is equal to or greater than VLMp are used. However, the conditions may be two or less conditions, and conditions other than the above-described conditions may be used. This is also true of VPGMn_SV.

10.3 Third Modification Example

Figure 76:
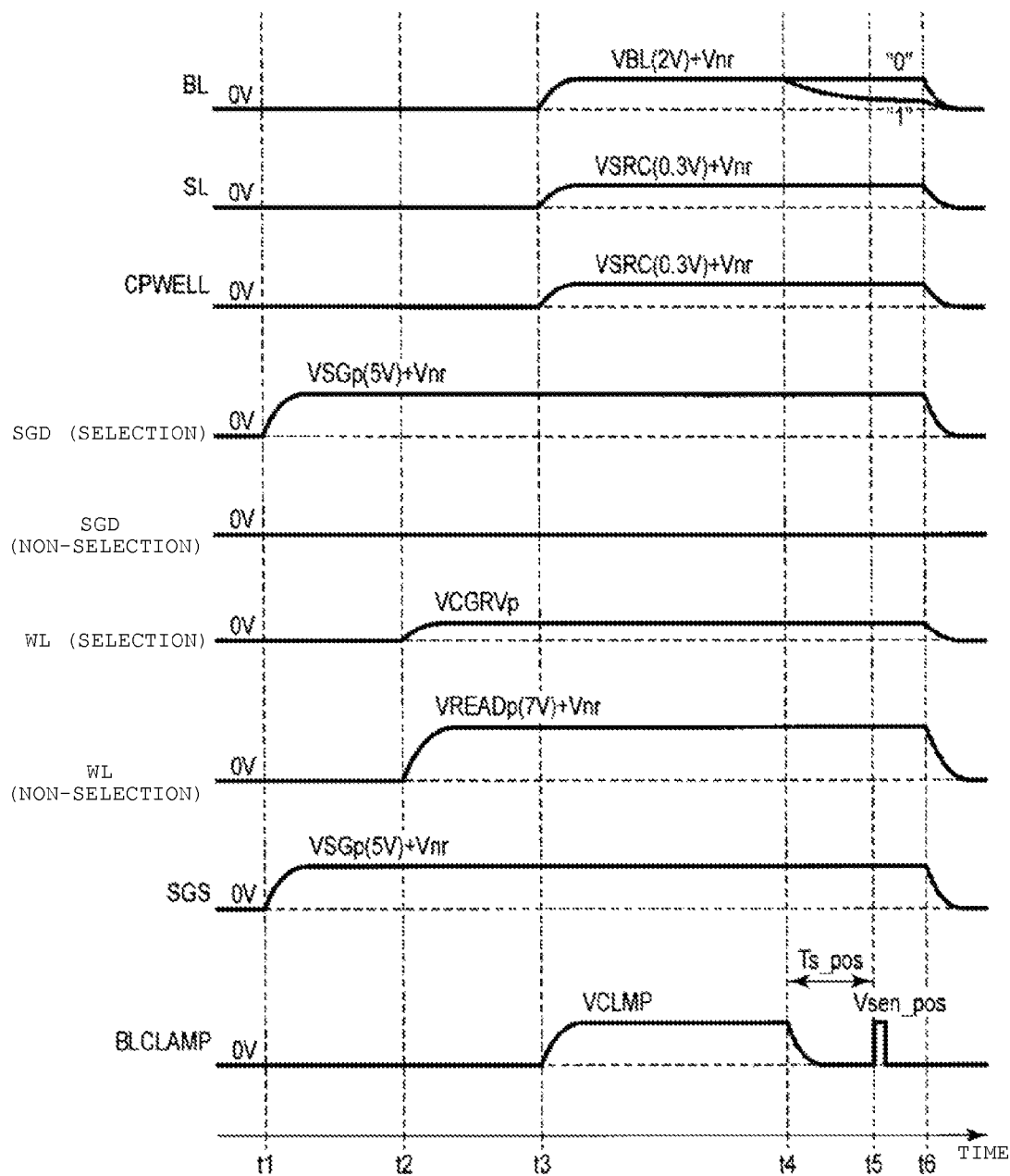
FIG. 76 is a timing chart illustrating a potential of each wiring during N-channel reading according to a third modification example.
Figure 77:
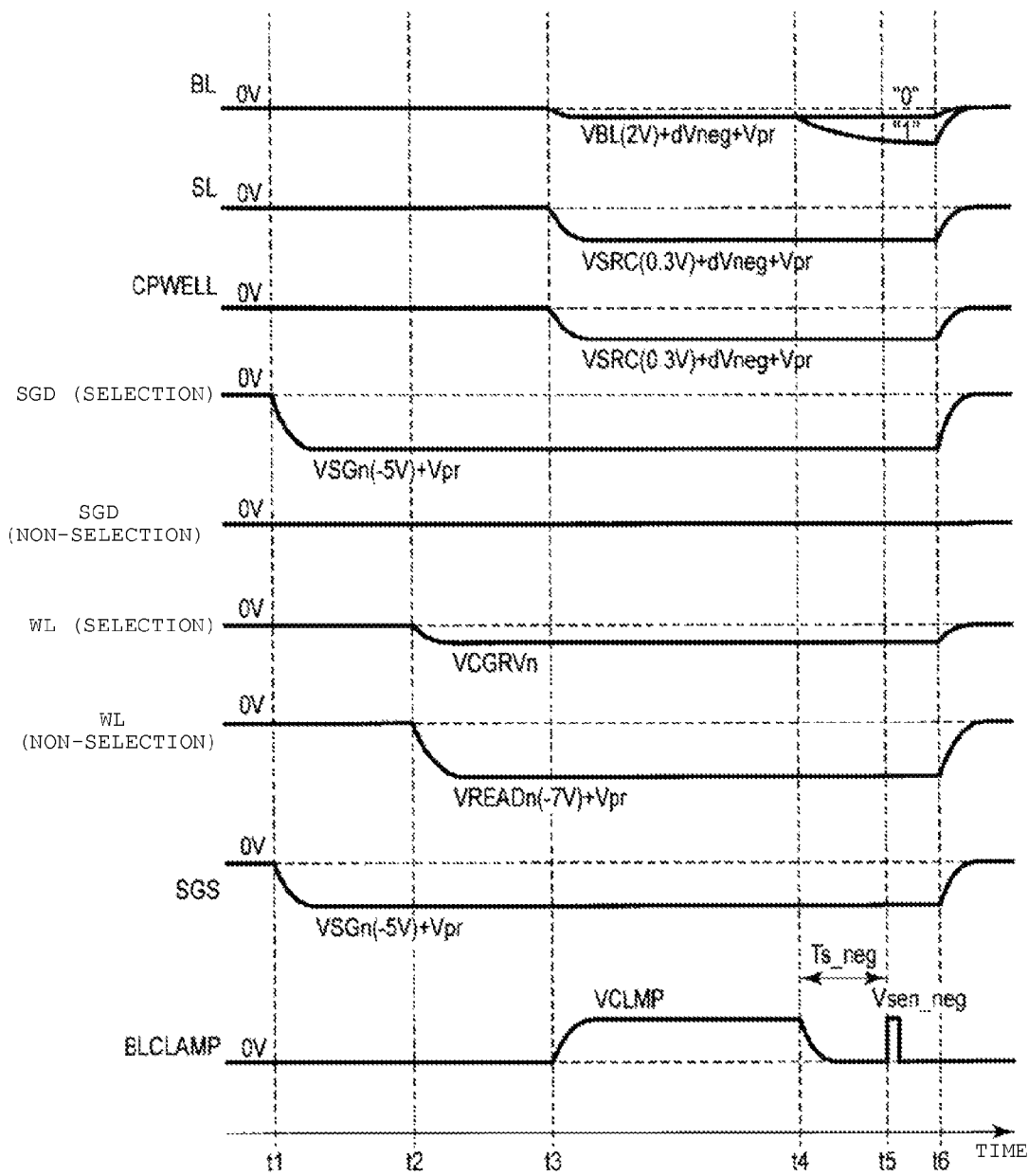
FIG. 77 is a timing chart illustrating a potential of each wiring during P-channel reading according to the third modification example.

Next, a third modification example will be described. In the above-described embodiments, the pre-verification and the verification of the programming of the "E" level may be executed by applying a positive voltage or a negative voltage to each wiring. FIG. 76 is a timing chart illustrating a potential of each wiring when performing the negative pre-verification and the verification of the "E"pos programming with the N-channel reading in this example. In addition, FIG. 77 is a timing chart illustrating a potential of each wiring when performing the positive pre-verification and the verification of the "E"neg programming with the P-channel reading in this example.

As illustrated in FIG. 76, in this example, in the timing chart illustrated in FIG. 26, a voltage Vnr is added as a correction value to voltages that are applied to the bit line BL, the source line SL, the well wiring CPWELL, the selection gate lines SGD and SGS, and the non-selected word line WL. Vnr is a correction value set to increase the potential of the wiring during the N-channel reading, and a relationship of Vnr>0 is satisfied. When executing the negative pre-verification and the verification of the "E"pos programming with the N-channel reading, since Vneg that is the verification level has a negative value, VCGRVp may be a negative value in correspondence with a potential of the source line SL (conductive film 30). In this case, Vnr is set to satisfy a relationship of Vnr>(|Vneg1|−VSRC). According to this, a positive voltage greater than |Vneg| is applied to the conductive film 30, and thus VCGRVp may be set to a positive value. Accordingly, voltages applied to the wirings become a positive voltage equal to or higher than 0 V. As a result, when executing a series of operations such as the negative pre-verification, the "E"pos programming, and the verification of the "E"pos programming, voltages that are applied the wirings may be set to a positive voltage that is equal to or higher than 0 V.

In addition, when executing the positive pre-verification and the verification of the "E"neg programming with the P-channel reading, the bit line BL, the source line SL, and VCGRVn become a positive voltage. In contrast, in this example, as illustrated in FIG. 77, when a voltage that is not 0 V is applied to wirings other than the selected word line WL, a voltage Vpr is added as a correction value of an application voltage. Vpr is a correction value that is set to reduce the potential of the wirings during the P-channel reading, and a relationship of Vpr<0 is satisfied. In addition, when the potential of the bit line BL is higher than Vpos, setting is performed to satisfy a relationship of Vpr<−(VBL+dVneg), and when the potential of the bit line BL is lower than Vpos, the setting is performed to satisfy a relationship of Vpr<−Vpos. According to this, the bit line BL, the source line SL, and VCGRVp may be set to a negative value. Accordingly, voltages that are applied to the wirings become a negative voltage equal to or lower than 0 V. As a result, when executing a series of operations such as the positive pre-verification, the "E"neg programming, and the verification of the "E"neg programming, voltages that are applied the wirings may be set to a negative voltage that is equal to or lower than 0 V.

As described above, during the pre-verification and the writing of the "E" level, the charge pump 122 in this example may generate only either a positive voltage or a negative voltage, and thus it is not necessary to perform conversion from the positive voltage to the negative voltage, or conversion from the negative voltage to the positive voltage. Accordingly, in the charge pump 122, it is possible to shorten a set-up time necessary for voltage generation, and thus it is possible to shorten a processing time of a programming.

10.4 Other Modification Examples

In the above-described embodiments, a carrier that is injected and a channel of the memory cell transistor MT are different between the positive-mode programming and the negative-mode programming. Specifically, in the positive-mode programming, the memory cell transistor MT operates as an N-channel transistor, and a charge is injected into the charge storage layer 28. In the negative-mode programming, the memory cell transistor MT operates as a P-channel transistor, and a hole is injected into the charge storage layer 28. In addition, an absolute value of the threshold value when the memory cell transistor MT operates as the P-channel transistor is larger than an absolute value of the threshold value when the memory cell transistor MT operates as the N-channel transistor.

According to this, it is preferable that the verification level be set to satisfy relationships of |AVHp|<|AVHn|, |BVHp|<|BVHn|, and |CVHp|<|CVHn|.

In addition, it is preferable that the magnitude (absolute value) of VPGMp and VPGMn be set to satisfy a relationship of |VPGMp|<|VPGMn|.

In addition, it is preferable that the magnitude (absolute value) of DVPGMp and DVPGMn be set to satisfy a relationship of |DVPGMp|<|DVPGMn|. In addition, it is more preferable that the values of DVPGMp and DVPGMn be set in order for the number of times of programming loops of the "LMp" programming and the number of times of programming loops of the "LMn" programming to be substantially the same as each other.

In addition, a difference may occur in the magnitude (absolute value) between VGSp and VSGn.

In addition, in the first verification according to the third embodiment, it is preferable that relationships of |AVLp|<|AVLn|, |BVLp|<|BVLn|, |CVLp|<|CVLn| be satisfied.

In addition, in the third and fourth embodiments, it is preferable that the magnitude (absolute value) of the voltage applied to the bit line BL during the programming using the second condition be set to satisfy a relationship of |QPWp|<|QPWn|.

In addition, in the second example of the modification examples, it is preferable that the magnitude (absolute value) of the value of VPGMp_SV and VPGMn_SV be set to satisfy a relationship of |VPGMp_SV|<|VPGMn_SV|.

In addition, in the reading operation, the magnitude (absolute value) may be different between VREADp and VREADn.

In addition, in the reading operation, the magnitude of Vsen_pos and Vsen_neg, which are applied to the sense amplifier 113 using the voltage sensing type, may be different in each case. In addition, the magnitude of Vstb_pos and Vstb_neg, which are applied to the sense amplifier 113 using the current sensing type, may be different in each case.

In addition, with regard to a sense time necessary for the reading, it is preferable that a sense time in the P-channel reading be longer than a sense time in the N-channel reading. Accordingly, it is preferable that the sense times Ts_pos and Ts_neg be set to satisfy a relationship of Ts_pos<Ts_neg.

In addition, in the sixth embodiment, a variation amount of the threshold value is different between a case where the memory cell transistor MT retains a charge, and a case where the memory cell transistor MT retains a hole. According to this, it is more preferable to change the magnitude of the shift amount in the positive type and the magnitude of the shift amount in the negative type from each other. For example, when comparing the magnitude of the shift amount Vs_Ap_L of the "Ap" level and the magnitude of the shift amount Vs_An_L of the "An" level, it is preferable to satisfy a relationship of |Vs_Ap_L|≤|Vs_An_L|. This is also true of the magnitude of the shift amount of the "Bp" level and the "Bn" level, or the shift amount of the "Cp" level and the "Cn" level.

In addition, in the first, second, and fifth to ninth embodiments, for example, the current sensing type sense amplifier which is illustrated in FIG. 38 may be used.

In addition, in the above-described embodiments, the writing of the "LMp" level and the "LMn" level may be omitted. For example, in the flowcharts in FIGS. 10 and 11, step S108 to step S111, and step S121 to step S123 may be stopped.

In addition, in the above-described embodiments, either the N-channel reading or the P-channel reading may read both the positive-type data and the negative-type data. Accordingly, the negative-type data may be read out with the N-channel reading, and the positive-type data may be read out with the P-channel reading. For example, in FIG. 24, description is made with respect to case where the positive-type data is read out with the N-channel reading and the negative-type data is read out with the P-channel reading, but both the positive-type data and the negative-type data may be read out, for example, with the N-channel reading. In this case, it is possible to read out data by setting VCGRVp to a verification level adjusted to the threshold level of the positive type and the negative type. This is also true of the P-channel reading.

In addition, in the above-described embodiments, when reading out multi-value data by using the voltage sensing type sense amplifier 113, the sense amplifier unit may perform charging of the bit line BL in correspondence with a timing of sensing (strobing) a voltage of the bit line BL corresponding to each piece of data, and may sense (strobe) the voltage of the bit line BL by changing the timing for every pieces of data for charging performed at once.

In addition, in the respective embodiments, the following configurations may be employed.

(1) In the reading operation in which the threshold value distribution is the positive type, the voltage that is applied to the word line that is selected in the reading operation of the Ap level is, for example, in a range of 0 V to 0.55 V. However, the voltage may be set to any range of 0.1 V to 0.24 V, 0.21 V to 0.31 V, 0.31 V to 0.4 V, 0.4 V to 0.5 V, 0.5 V to 0.55 V without limitation to the above-described range.

The voltage that is applied to the word line that is selected in the reading operation of the Bp level is, for example, in a range of 1.5 V to 2.3 V. However, the voltage may be set to any range of 1.65 V to 1.8 V, 1.8 V to 1.95 V, 1.95 V to 2.1 V, and 2.1 V to 2.3 V without limitation to the above-described range.

The voltage that is applied to the word line that is selected in the reading operation of the Cp level is, for example, in a range of 3.0 V to 4.0 V. However, the voltage may be set to any range of 3.0 V to 3.2 V, 3.2 V to 3.4 V, 3.4 V to 3.5V, 3.5 V to 3.6 V, and 3.6 V to 4.0 V without limitation to the above-described range.

Reading operation time (tR) may be set to, for example, a range of 25 µs to 38 µs, a range of 38 µs to 70 µs, or 70 µs to 80 µs.

(2) As described above, the writing operation includes the programming operation and the verification operation. In the writing operation with the positive-mode programming, the voltage that is first applied to the word line that is selected during the programming operation is, for example, in a range of 13.7 V to 14.3 V. However, the voltage may be set, for example, to either a range of 13.7 V to 14.0 V or a range of 14.0 V to 14.6 V without limitation to the above-described range.

The voltage that is first applied to a selected word line during writing to an odd word line, and the voltage that is first applied to a selected word line during writing to an even word line may be changed from each other.

When performing the programming operation with an incremental step pulse programming (ISPP) type, as a step-up voltage, for example, approximately 0.5 V may be exemplified.

The voltage that is applied to the non-section word line may be set to, for example, a range of 6.0 V to 7.3 V. The voltage may be set to, for example, a range of 7.3 V to 8.4 V, or 6.0 V or lower without limitation to the above-described range.

A pass voltage that is applied may be changed in accordance with whether the non-selected word line is the odd word line or the even word line.

Writing operation time (tProg) may be set to, for example, a range of 1,700 µs to 1,800 µs, a range of 1,800 µs to 1,900 µs, or a range of 1,900 µs to 2,000 µs.

(3) During the erase operation of injecting a hole into the charge storage layer, the voltage that is first applied to the well, which is formed on an upper portion of the semiconductor substrate and over which the memory cell is disposed, is set to, for example, a range of 12 V to 13.6 V. The voltage may be set to, for example, a range of 13.6 V to 14.8 V, a range of 14.8 V to 19.0 V, a range of 19.0 V to 19.8 V, or a range of 19.8 V to 21 V without limitation to the above-described range.

Erase operation time (tErase) may be set to, for example, a range of 3,000 µs to 4,000 µs, a range of 4,000 µs to 5,000 µs, or a range of 4,000 µs to 9,000 µs.

(4) The memory cell structure includes the charge storage layer that is disposed on the semiconductor substrate (silicon substrate) through a tunnel insulating film having a film thickness of 4 nm to 10 nm. The charge storage layer may has a stacked structure of an insulating film such as SiN and SiON having a film thickness of 2 nm to 3 nm and a polysilicon having a film thickness of 3 nm to 8 nm. In addition, a metal such as Ru may be added to polysilicon. An insulating film is provided on the charge storage layer. For example, the insulating film includes a silicon oxide film having a film thickness of 4 nm to 10 nm which is interposed between a lower-layer High-k film having a film thickness of 3 nm to 10 nm and an upper-layer High-k film having a film thickness of 3 nm to 10 nm. Examples of the High-k film include HfO and the like. In addition, the film thickness of the silicon oxide film may be set to be larger than the film thickness of the High-k film. A control electrode having a film thickness of 30 nm to 70 nm is formed on the insulating film through a material having a film thickness of 3 nm to 10 nm. Here, examples of the work function adjusting material include a metal oxide film such as TaO, and a metal nitride film such as TaN. W and the like may be used for the control electrode.

In addition, an air gap may be formed between memory cells.

In addition, a negative voltage, which has the same absolute value magnitude as that of the voltage value described (1) to (3), may be applied in the reading operation in a case where the threshold value distribution is the negative type, the writing operation with the negative-mode programming, and the erase operation of injecting a charge into the charge storage layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
   a semiconductor memory device configured to perform a writing operation with either a first writing method or a second writing method; and
   a controller configured to select one of the first writing method and the second writing method upon receipt of a write instruction and output a write command indicating the selected writing method to the semiconductor memory device, the selection of the writing method being made in accordance with a storage location in the semiconductor memory device targeted by the write instruction.

2. The system according to claim 1, wherein
   the semiconductor memory device includes a plurality of memory cell transistors, and a plurality of word lines connected to the plurality of memory cell transistors,
   in the first writing method, a positive voltage is applied to a selected word line corresponding to the first address, and
   in the second writing method, a negative voltage is applied to the selected word line corresponding to the first address.

3. The system according to claim 2, wherein the controller is configured to record the selected writing method indicated in the write command in association with the storage location of the semiconductor memory device targeted by the write command.

4. The system according to claim 1, wherein
   the semiconductor memory device is configured to perform a reading operation with either a first reading method or a second reading method, and
   the controller is configured to select one of the first reading method and the second reading method upon receipt of a read instruction and output a read command indicating one of the first reading method and the second reading method to the semiconductor memory device, the selection of the reading method being made in accordance with a storage location in the semiconductor memory device targeted by the read instruction.

5. The system according to claim 4, wherein
   the semiconductor memory device includes a plurality of memory cell transistors, and a plurality of word lines connected to the plurality of memory cell transistors,
   in the first reading method, a positive voltage is applied to a non-selected word line, and
   in the second reading method, a negative voltage is applied to the non-selected word line.

6. The system according to claim 5, wherein the controller is configured to access a recorded correlation between the storage location of the semiconductor memory device targeted by the read instruction and the writing method used to write the data into the storage location when selecting the reading method.

7. A controller for a semiconductor memory device configured to perform a writing operation with either a first writing method or a second writing method and a reading operation with either a first reading method or a second reading method, comprising:
a host interface unit; and
a processing unit configured to select one of the first writing method and the second writing method upon receipt of a write instruction received through host interface unit and output a write command indicating the selected writing method to the semiconductor memory device, the selection of the writing method being made in accordance with a storage location in the semiconductor memory device targeted by the write instruction.

8. The controller according to claim 7, further comprising:
a semiconductor memory in which the processing unit records the selected writing method indicated in the write command in association with the storage location of the semiconductor memory device targeted by the write command.

9. The controller according to claim 8, wherein
a processing unit configured to select one of the first reading method and the second reading method upon receipt of a read instruction received through host interface unit and output a read command indicating the selected reading method to the semiconductor memory device, the selection of the reading method being made in accordance with a storage location in the semiconductor memory device targeted by the read instruction.

10. The controller according to claim 9, wherein the controller is configured to access the semiconductor memory device to determine the writing method recorded in association with the storage location of the semiconductor memory device targeted by the read instruction.

11. A memory system comprising:
a semiconductor memory device including a plurality of memory cell transistors, the semiconductor memory device being configured to perform a writing operation with either a first writing method or a second writing method, the semiconductor memory device being configured to apply a first positive voltage to a gate of a selected memory cell in the first writing method, the semiconductor memory device being configured to apply a first negative voltage to the gate of the selected memory cell in the second writing method; and
a controller configured to select one of the first writing method and the second writing method upon receipt of a write instruction and output a write command indicating the selected writing method to the semiconductor memory device.

12. The system according to claim 11, wherein
the controller is configured to select one of the first writing method and the second writing method based on an address for the selected memory cell.

13. The system according to claim 11, wherein
the semiconductor memory device includes a plurality of blocks, one of the blocks includes a first memory string and a second memory string, the first memory string includes first memory cells, the second memory string includes second memory cells, and the first memory cells are disposed above the second memory cells.

14. The system according to claim 11, wherein
the semiconductor memory device is configured to perform a reading operation with either a first reading method or a second reading method, and
the controller is configured to select one of the first reading method and the second reading method upon receipt of a read instruction and output a read command indicating one of the first reading method and the second reading method to the semiconductor memory device.

15. The system according to claim 14, wherein
in the first reading method, a second positive voltage is applied to the gate of the selected memory cell, and
in the second reading method, a second negative voltage is applied to the gate of the selected memory cell.

16. The system according to claim 15, wherein
the controller performs an ECC operation when the controller receives data read from the semiconductor memory device, and
the controller outputs a retry reading command to the semiconductor memory device if the number of errors is more than a first number.

17. The system according to claim 16, wherein
the semiconductor memory device perform a retry reading operation when the semiconductor memory device receives the retry reading command.

18. The system according to claim 17, wherein
The semiconductor memory device is configured to apply a third positive voltage to the gate of the selected memory cell in the retry reading operation, and the third positive voltage being higher than the second positive voltage.

19. The system according to claim 17, wherein
The semiconductor memory device is configured to apply a third negative voltage to the gate of the selected memory cell in the retry reading operation, and the third negative voltage being lower than the second negative voltage.

* * * * *